(12) United States Patent
Eldridge et al.

(10) Patent No.: US 7,724,004 B2
(45) Date of Patent: May 25, 2010

(54) PROBING APPARATUS WITH GUARDED SIGNAL TRACES

(75) Inventors: Benjamin N. Eldridge, Danville, CA (US); Carl V. Reynolds, Pleasanton, CA (US); Takao Saeki, Yokohama (JP); Yoichi Urakawa, Higashimurayama (JP)

(73) Assignee: FormFactor, Inc., Livermore, CA (US)

( * ) Notice: Subject to any disclaimer, the term of this patent is extended or adjusted under 35 U.S.C. 154(b) by 395 days.

(21) Appl. No.: 11/566,194

(22) Filed: Dec. 1, 2006

(65) Prior Publication Data

US 2007/0139061 A1    Jun. 21, 2007

Related U.S. Application Data

(63) Continuation-in-part of application No. 11/306,270, filed on Dec. 21, 2005, now Pat. No. 7,498,825.

(51) Int. Cl.
  *G01R 31/02* (2006.01)
(52) U.S. Cl. .................................................. 324/754
(58) Field of Classification Search ................ 324/754, 324/761–762, 765, 158.1, 755; 257/48; 438/14–18
See application file for complete search history.

(56) References Cited

U.S. PATENT DOCUMENTS

| | | | |
|---|---|---|---|
| 6,603,322 B1 * | 8/2003 | Boll et al. .................. | 324/754 |
| 6,791,177 B1 | 9/2004 | Miller et al. | |
| 6,911,835 B2 | 6/2005 | Chraft et al. | |
| 7,068,057 B2 | 6/2006 | Tervo et al. | |
| 7,196,531 B2 * | 3/2007 | Grube et al. ................. | 324/754 |
| 2007/0007977 A1 | 1/2007 | Eldridge et al. | |

OTHER PUBLICATIONS

U.S. Appl. No. 12/396,661, filed Mar. 3, 2009, Eldridge.
Search Report for application PCT/US 07/86199 (Sep. 17, 2008) (10 pages).
U.S. Appl. No. 11/308,094, filed Mar. 6, 2006, Eldridge et al.
Preliminary Report On Patentability/Written Opinion of Int'l Searching Authority, PCT/US 07/86199 (Jun. 11, 2009) (7 pages).

* cited by examiner

*Primary Examiner*—Ha Tran T Nguyen
*Assistant Examiner*—Tung X Nguyen
(74) *Attorney, Agent, or Firm*—N. Kenneth Burraston

(57) ABSTRACT

A probing apparatus can comprise a substrate, conductive signal traces, probes, and electromagnetic shielding. The substrate can have a first surface and a second surface opposite the first surface, and the electrically conductive first signal traces can be disposed on the first surface of the first substrate. The probes can be attached to the first signal traces, and the electromagnetic shielding structures can be disposed about the signal traces.

23 Claims, 42 Drawing Sheets

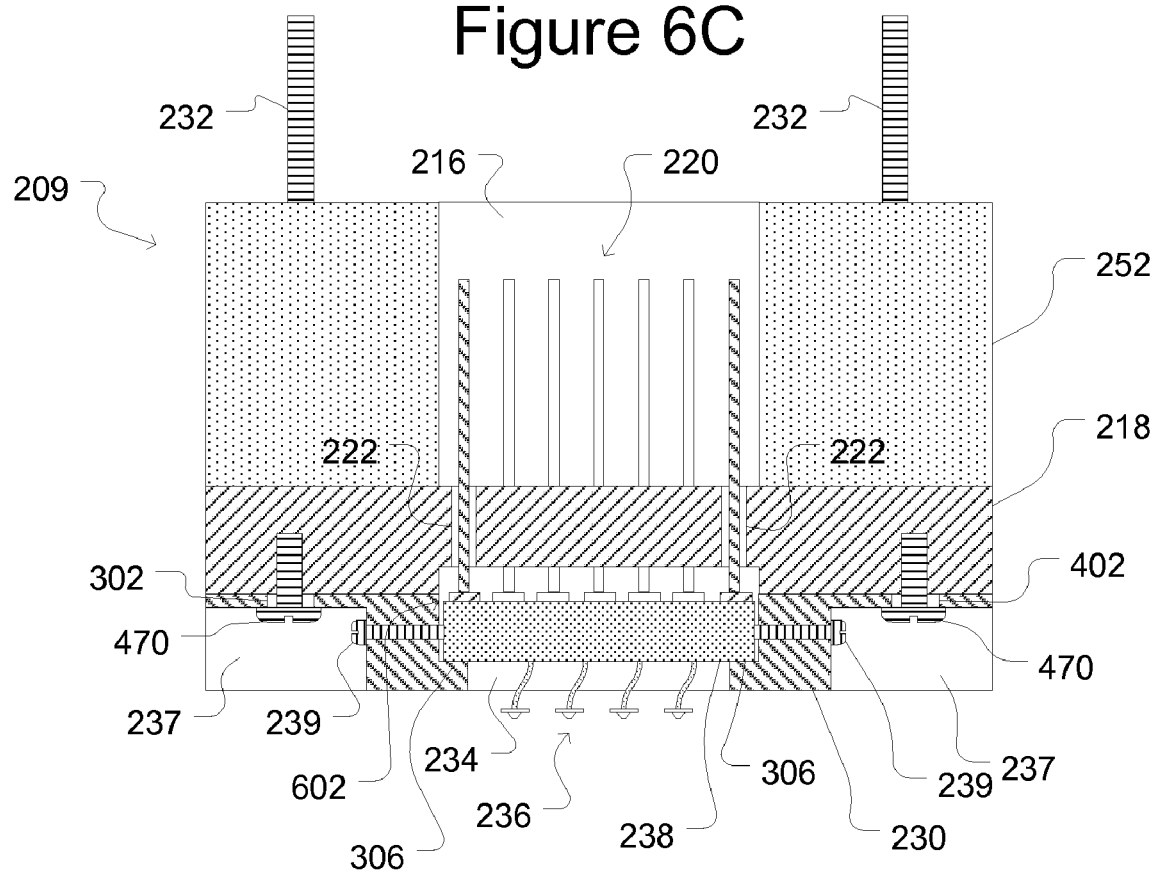

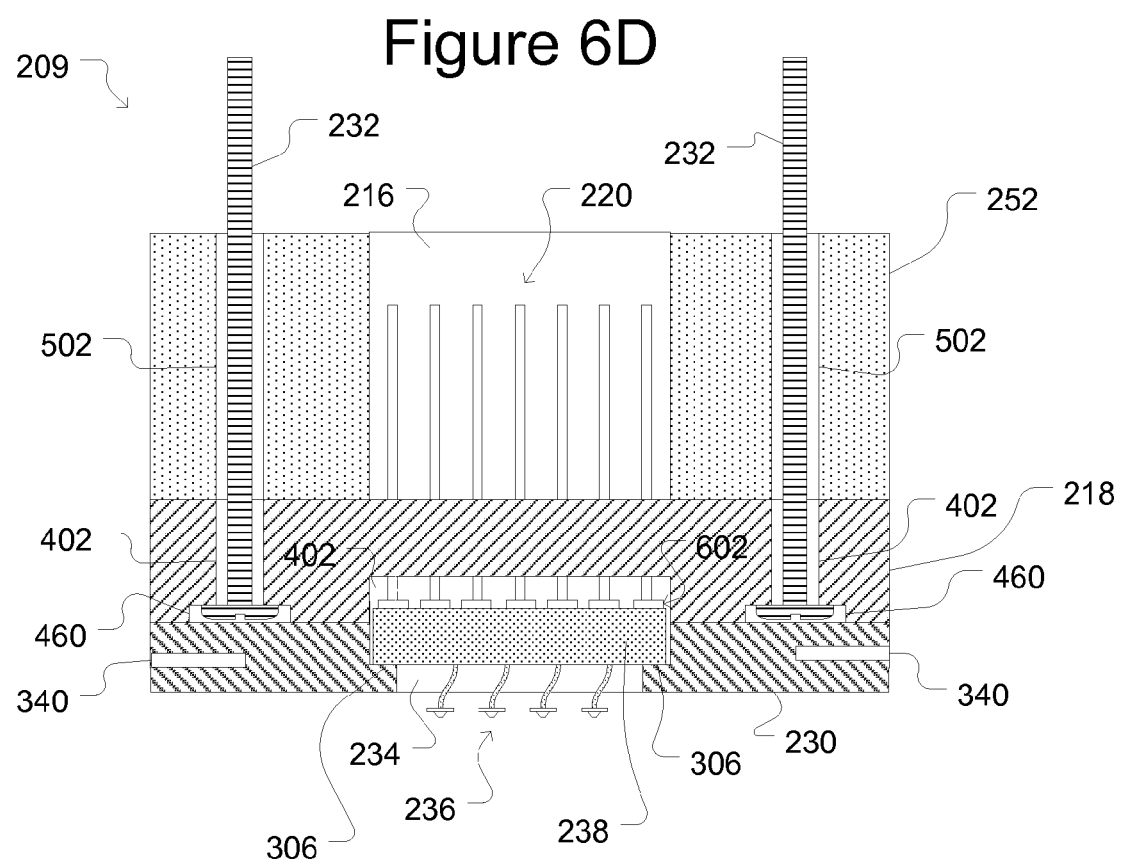

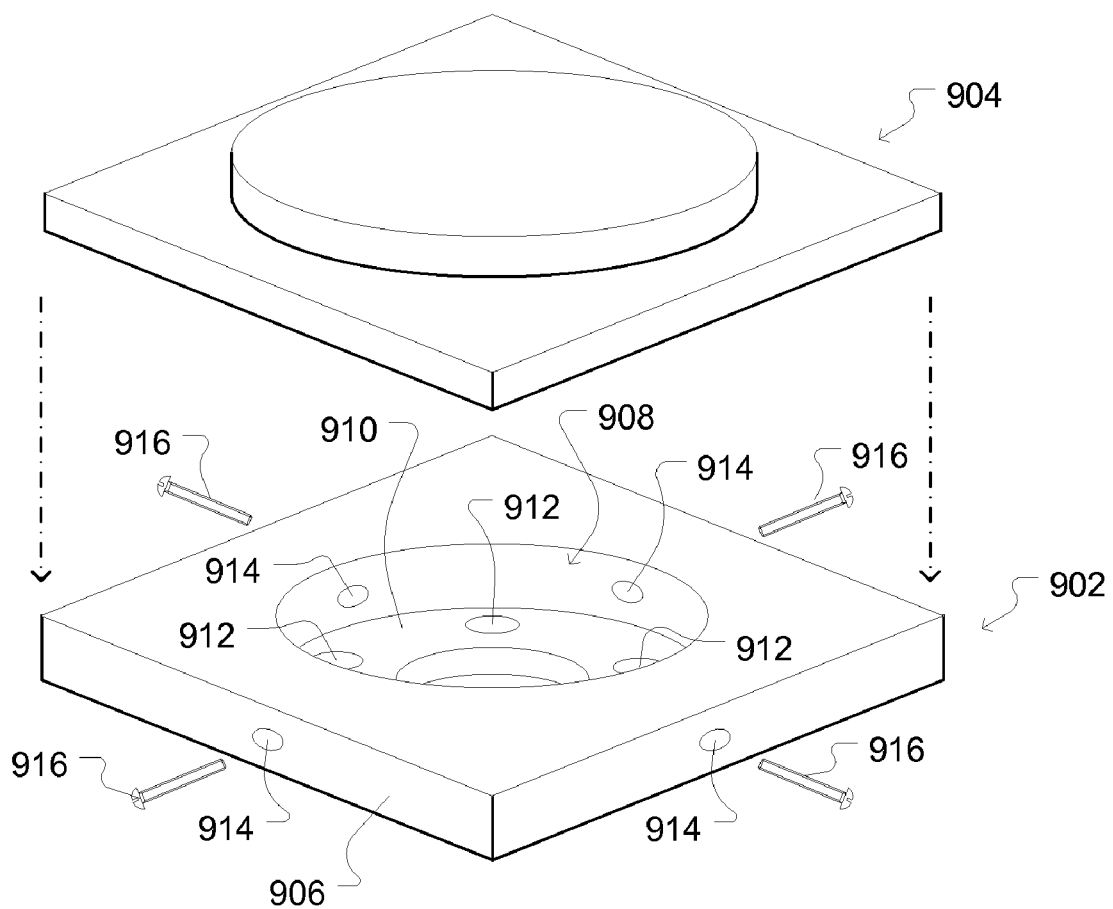

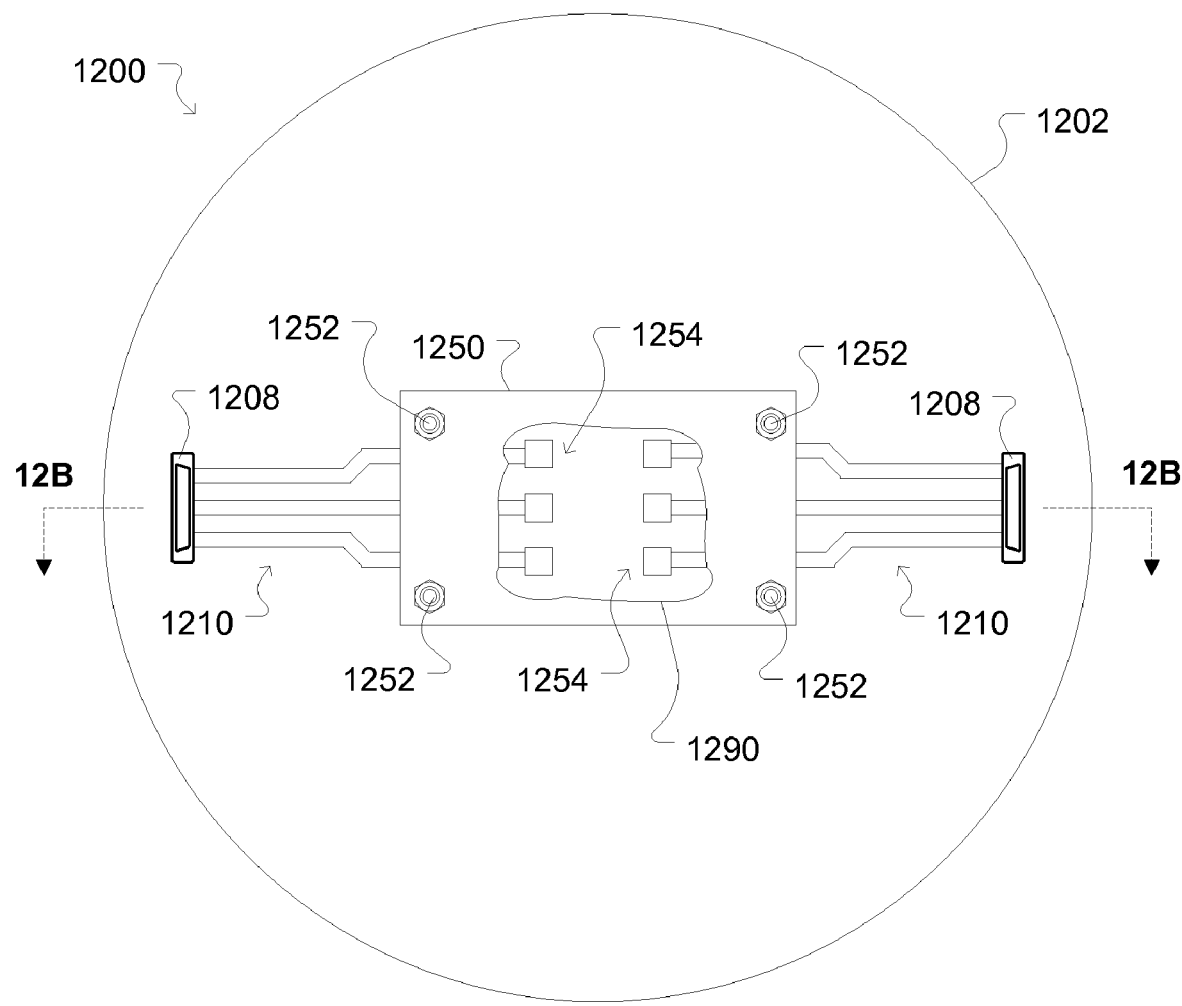

PROBING APPARATUS WITH GUARDED SIGNAL TRACES

CROSS REFERENCE TO RELATED APPLICATIONS

This application is a continuation-in-part of U.S. patent application Ser. No. 11/306,270, filed Dec. 21, 2005 now U.S. Pat. No. 7,498,825.

BACKGROUND

FIG. 1A illustrates an exemplary prior art probing system used to test a device under test ("DUT") 112, which may be, for example, one or more dies (not shown) on a newly manufactured semiconductor wafer or other electronic devices (e.g., previously manufactured dies). The probing system of FIG. 1A can include a test head 104 and a prober 102 (which is shown with a cut-away 126 to provide a partial view of the inside of the prober 102). To test DUT 112, the DUT is placed on a moveable stage 106 as shown in FIG. 1A, and the stage 106 is moved such that input and/or output terminals of the DUT 112 are brought into contact with probes 124 of a probe card assembly 108, which as shown, is attached to a test head plate 121. For example, the probe card assembly 108 may be bolted or clamped to the test head plate 121 with the probe substrate 122 and probes 124 extending into the prober 102 through opening 132 (see FIG. 1B).

Typically, a cable 110 or other communication means connects a tester (not shown) with the test head 104. The tester (not shown) generates test data to be written to the DUT 112, and the tester receives and evaluates response data generated by the DUT 112 in response to the test data. The cable 110 can provide a plurality of communications channels (not shown) to and from the tester (not shown) for such test and response data. Typically, there can be a communications channel (not shown) for each input and/or output terminal of the DUT 112, and there may be further communications channels for providing power and ground to the DUT 112.

The test head 104 and test head connectors 114 provide electrical connections that connect the tester channels (not shown) to the probe card assembly 108. The probe card assembly 108 shown in FIG. 1A can include a wiring board 120 and a probe substrate 122. The wiring board 120 provides electrical connections (not shown) from connectors 114 to a probe substrate 122, and the probe substrate provides electrical connections to the probes 124. The probe card assembly 108 thus provides an interface that connects the tester communications channels (not shown) to the input and/or output terminals (not shown) of a DUT 112.

While terminals (not shown) of DUT 112 are pressed against probes 124 (thus forming electrical connections between the terminals and the probes), the tester (not shown) runs tests on the DUT 112. For example, the tester (not shown) may run functional tests on the DUT 112 in which the DUT can be operated in various modes. Monitoring results of such operation, the tester (not shown) determines whether the DUT 112 functions properly. Such tests may also be used to determine a maximum reliable operating speed of the DUT 112. Parametric tests are another example of tests that may be run on the DUT 112. Parametric tests may include such things as measuring leakage current in the DUT 112, determining whether the DUT 112 has a short-circuit fault or open-circuit fault, etc.

BRIEF DESCRIPTION OF THE DRAWINGS

FIGS. 6C and 6D show side, cross-sectional views of the probe head assembly of FIG. 5.

FIG. 7 shows an exploded, perspective view of an attachment tool with a cover but without an insert holder according to some embodiments of the invention.

FIG. 16A illustrates a top view of another exemplary probe card assembly according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, "x," "y," "z," etc.), if provided, are relative and provided solely by way of example and for ease of illustration and discussion and not by way of limitation.

FIGS. 2 and 3A-3C illustrate an exemplary probe card assembly 200 that may be used in a prober or other system for testing electronic devices according to some embodiments of the invention. For example, probe card assembly 200 may be used in place of probe card 108 in a test system that can include a prober like prober 102 of FIGS. 1A and 1B. For ease of discussion, probe card assembly 200 will be discussed herein as used in prober 102. Probe card assembly 200 may, however, be used in any prober for probing semiconductor wafers or singulated dies or any other system for probing a device to test, monitor, or otherwise operate the device.

Figure 2:
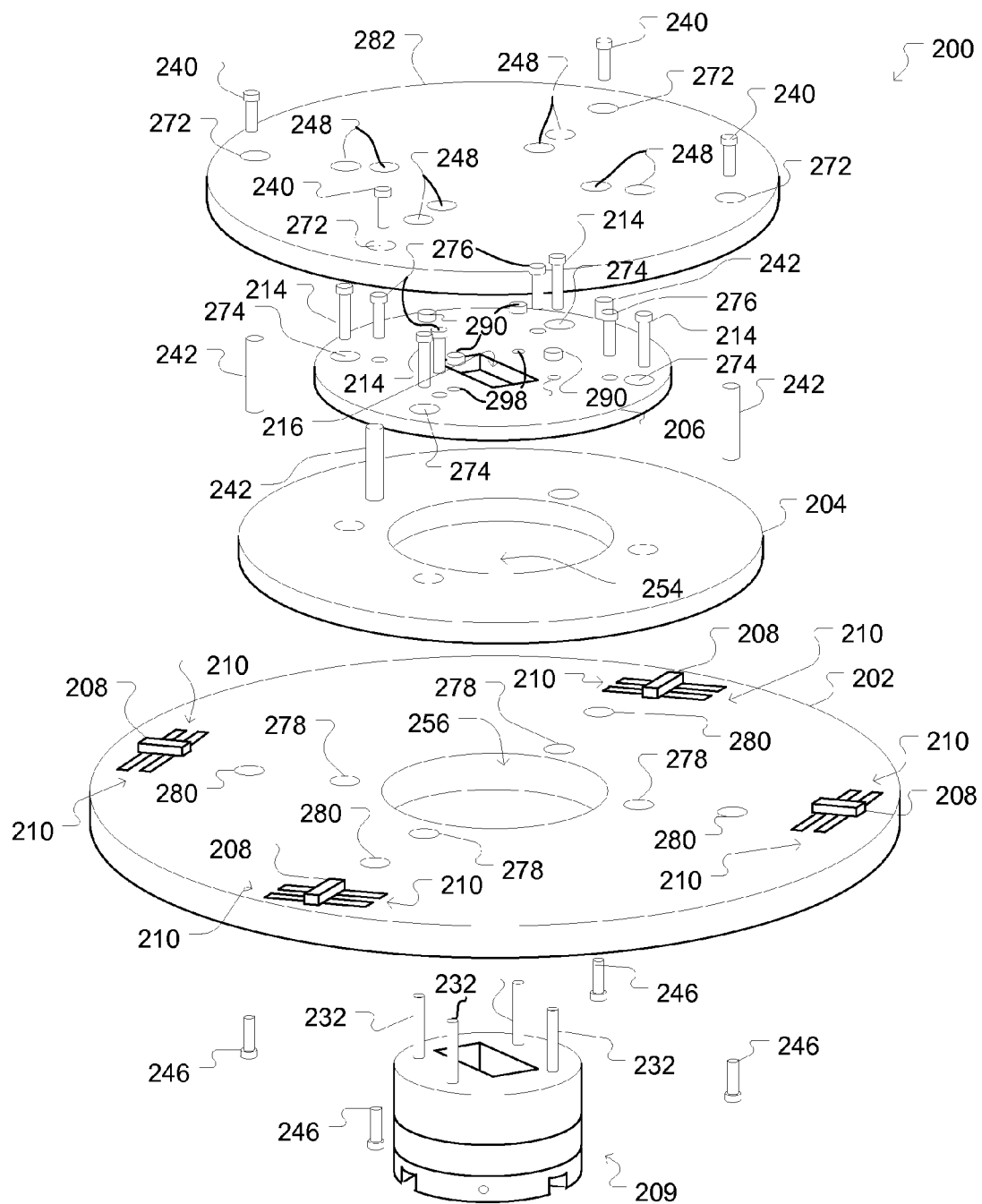
FIG. 2 shows an exploded, perspective view of an exemplary probe card assembly according to some embodiments of the invention.
Figure 3A:
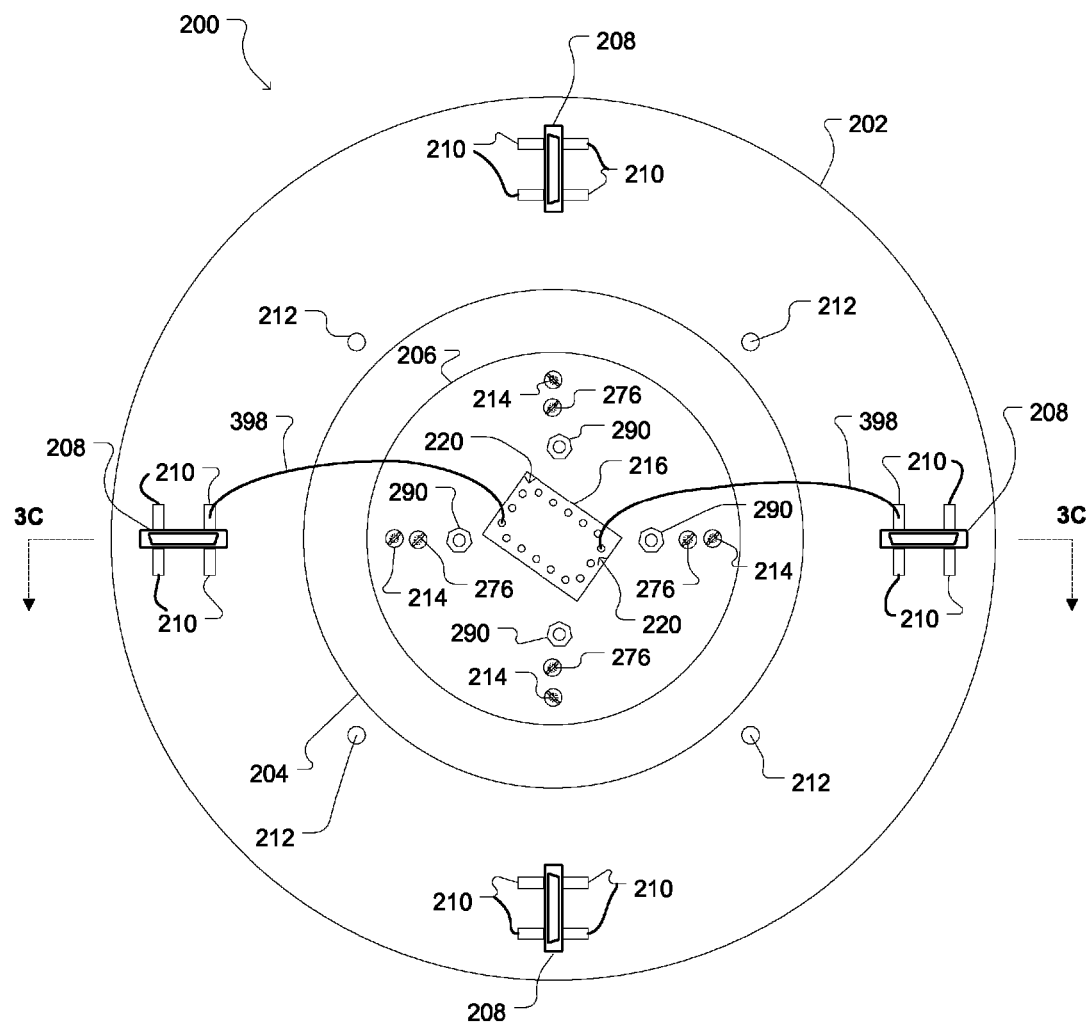
FIG. 3A shows a top view of the probe card assembly of FIG. 2 without the cover.
Figure 3B:
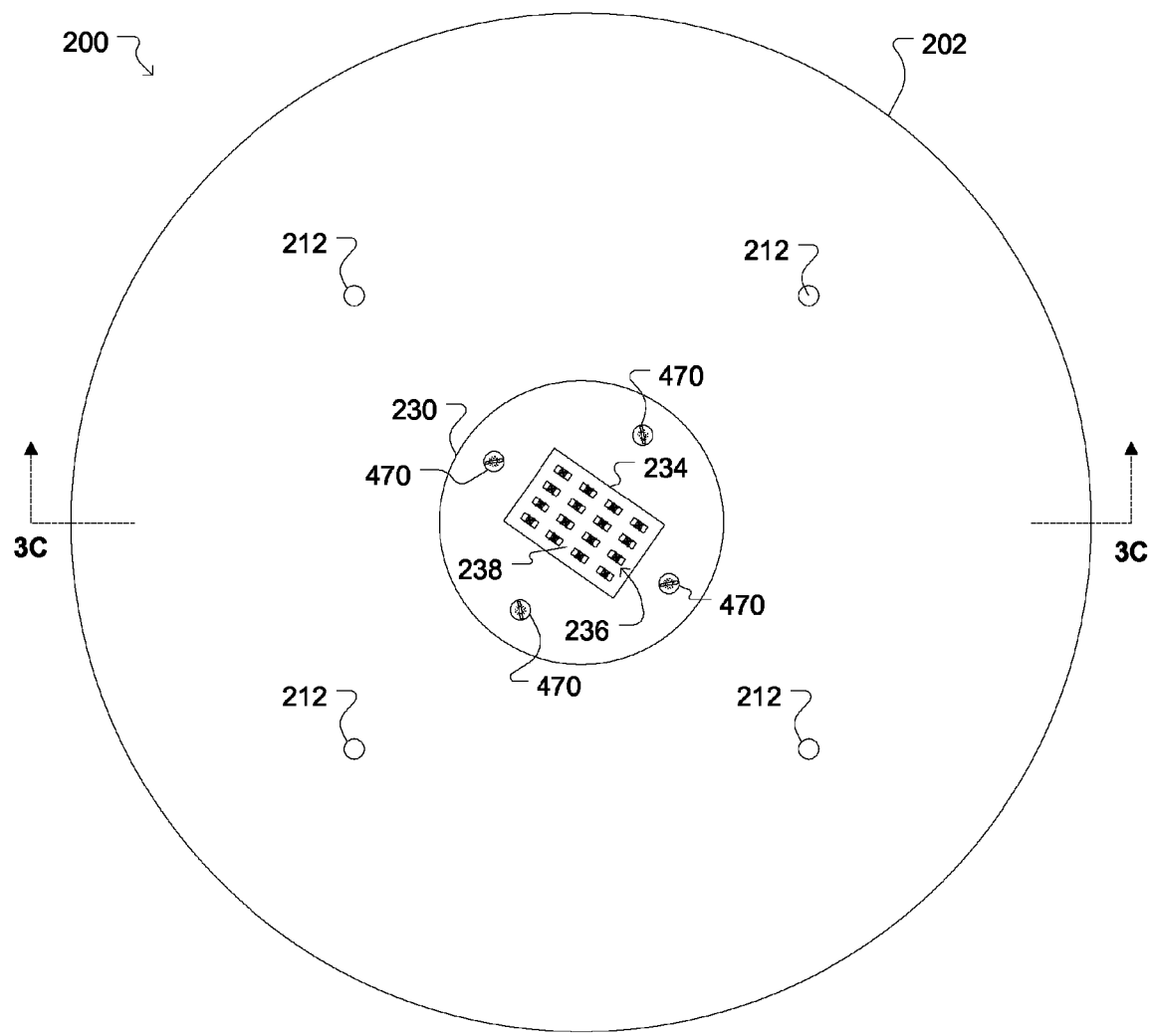
FIG. 3B shows a bottom view of the probe card assembly of FIG. 2.
Figure 3C:
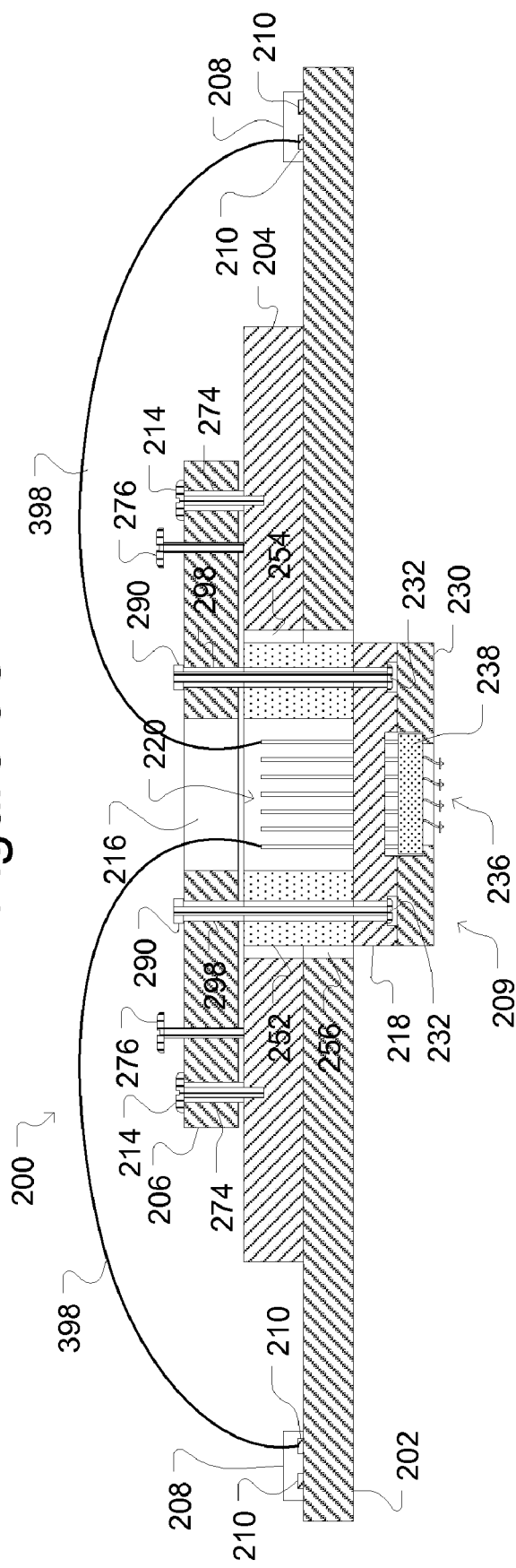
FIG. 3C shows a side, cross-sectional view of the probe card assembly of FIG. 2 without the cover.

FIG. 2 shows an exploded, perspective view of the probe card assembly 200, and FIG. 3A shows a top view, FIG. 3B shows a bottom view, and FIG. 3C shows a side cross-sectional view of probe card assembly 200.

As shown, the probe card assembly 200 can include a wiring substrate 202, a stiffener plate 204, and an adjustment plate 206 to which a probe head assembly 209 can be attached. The probe card assembly 200 may also include a cover 282, which is shown in FIG. 2 but, for purposes of clarity and ease of illustration, is not shown in FIGS. 3A-3C. As shown in FIG. 2, the cover 282 can be fastened to the wiring substrate 202 with screws 240 that pass through holes 272 in cover 282 and thread into spacers 242 and with screws 246 that pass through holes 280 in the wiring substrate 202 and also thread into spacers 242.

Figure 1A:
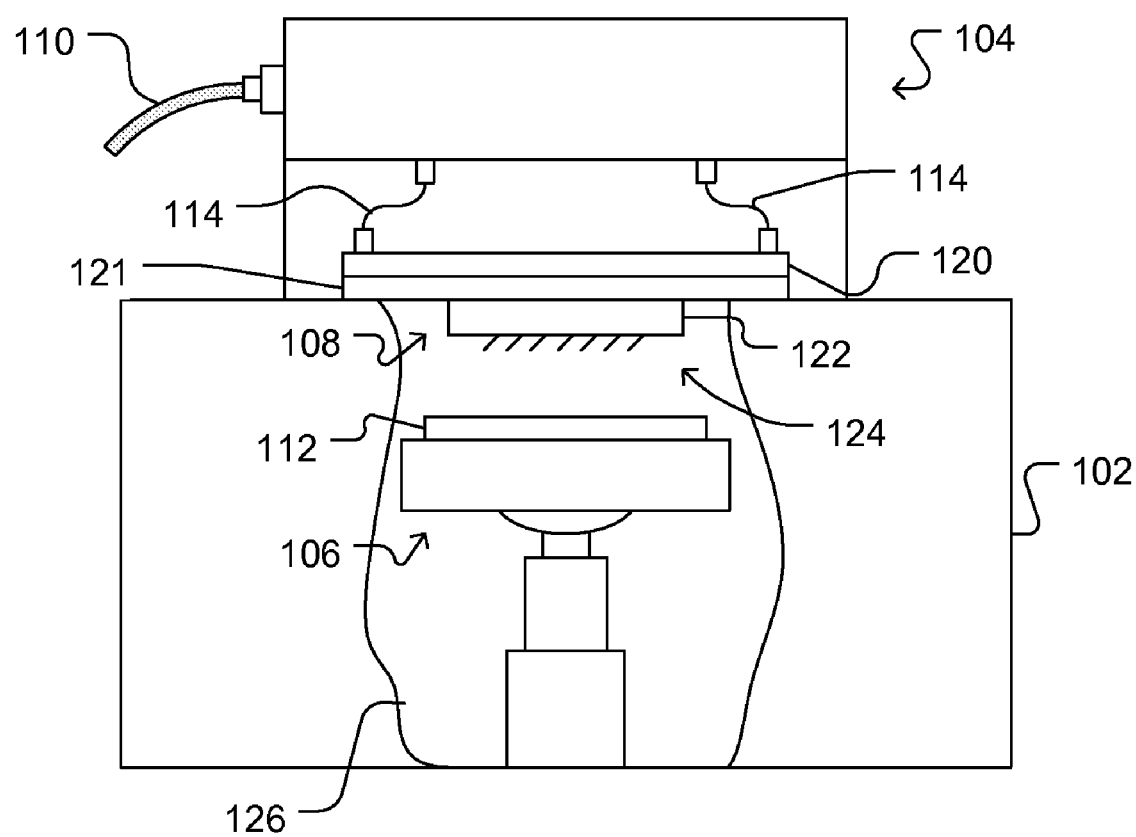
FIGS. 1A and 1B illustrate an exemplary prior art probing system for testing dies of a semiconductor wafer.

As will be seen, one function of the probe card assembly 200 can be to provide an electrical interface between communications channels to and from the tester and the input and/or output terminals (not shown) of a DUT such as 112 in FIG. 1A. (As used herein, the term "DUT" can be one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, and/or any other type of electronic device or devices.) As discussed above, the tester (not shown) can be configured to generate test data to be written to the DUT 112 and to receive and evaluate response data generated by the DUT 112 in response to the test data. Wiring substrate 202 can include channel connectors 208 for making electrical connections with the communications channels to and from the tester (not shown). For example, channel connectors 208 may be configured to make electrical connections with the test head 104 of FIGS. 1A and 1B, which in turn can be connected to a tester (not shown) through cable 110. As discussed above, the cable 110 and test head 104 provide communications channels (not shown) to and from the tester (not shown) for test data, response data, power, ground, and/or other electrical signals.

The channel connectors 208 shown in FIGS. 2, 3A and 3C may be zero-insertion-force ("ZIF") connectors that include multiple pin-type connectors (not shown) such that each channel connector 208 connects electrically to multiple tester channels. In the example shown in FIGS. 2 and 3A-3C, each channel connector 208 can be connected to four tester channels (not shown), and each of those four electrical connections can be in turn connected to one of four electrically conductive traces 210. (In other examples, more or fewer than four tester channels can be connected to more or fewer than four traces 210.) As shown in FIGS. 3A and 3C, electrically conductive wires 398 provide electrical connections from the traces 210 to conductive pins 220, which as will be seen, can be electrically connected to probes 236. (Only two wires 398 are shown in FIGS. 3A and 3C for simplicity and ease of illustration. Depending on the application, a sufficient number of wires 398 would typically be used to electrically connect most or all of the traces 210 to most or all of the pins 220.) Opening 216 in the adjustment plate 206 provides access to pins 220.

The use of ZIF connectors 208 is optional, and indeed, any type structure for making electrical connections may be used. For example, channel connectors 208 may be conductive pads or terminals configured to engage electrically conductive pogo pins from the test head 104.

The composition of the wiring substrate 202 is not important and any substrate material may be used. For example, the wiring substrate 202 may be a printed circuit board. In another example, the wiring substrate 202 may comprise a ceramic material, which may provide greater strength and resistance to bending or warping than one or more printed circuit board materials. The wiring substrate 202 may be configured to attach to prober 102. For example, the wiring substrate 202 may be configured to be bolted or clamped to the test head plate 121 of prober 102 (see FIGS. 1A and 1B). As just one example, the wiring substrate 202 may include holes (not shown) along its periphery that correspond to holes 134 of the test head plate 121. Those holes may receive bolts (not shown) that bolt the wiring substrate 202 to the test head plate 121.

Turning now to the stiffener 204, the stiffener can be configured to provide mechanical strength to the probe card assembly 200. For example, such mechanical strength may be utilized to resist bending, warping, or other movement (e.g., horizontal or radial expansion or contraction) of the wiring substrate 202 and/or other parts of the probe card assembly 200 that may be caused by mechanical loads, thermal gradients, etc. Such bending, warping, or other movement may move the probes 236 from their intended positions, which may cause one or more of the probes to press with too much force against the DUT 112, which may damage the probes 236 and/or the DUT 112. Such unwanted movement of the probes 236 may alternatively cause the probes 236 to press against the DUT with too little force to establish good electrical connections or to not contact the DUT 112 at all. The stiffener 204 may be composed of any material or materials that are sturdy and/or provide the needed mechanical strength for a particular application of the probe card assembly 200. For example, the stiffener 204 may be a metal plate.

Thermal gradients across the probe card assembly 200, which may warp or bend the wiring substrate 202 or other parts of the probe card assembly 200, may arise while a DUT 112 is tested at lowered or elevated temperatures. Typically, stage 106 cools or heats the DUT 112 during testing. Such cooling or heating of the DUT 112 can cause thermal gradients across the probe card assembly 200 in which the temperature on the probe-side of the probe card assembly 200 is cooler or hotter than the temperature on the channel-connector (208) side of the probe card assembly 200. The stiffener plate 204 as well as the use of a ceramic wiring substrate 202 are examples of techniques that may be used to counteract the effects of such thermally induced bending or warping.

In the exemplary probe card assembly 200 shown in FIGS. 2 and 3A-3C, the exemplary stiffener 204 can be attached to the wiring substrate 202 and provides mechanical strength directly to the wiring substrate 202. Alternatively, the stiffener 204—rather than the wiring substrate 202—may be configured to be attached to the test head plate 121 of prober 102, in which case the stiffener 204 may be attached directly to the test head plate 121 using any of the means discussed above for attaching the wiring substrate 202 to the test head plate 121. An example of a stiffener 204 configured to be attached to a test head plate 121 of a prober 102 is disclosed and discussed in U.S. Provisional Patent Application 60/594,562, which was filed on Apr. 21, 2005.

Turning now to the adjustment plate 206, in the probe card assembly 200 shown in FIGS. 2 and 3A-3C, the wiring substrate 202 and/or stiffener plate 204 as well as the probe head assembly 209 can be attached to the adjustment plate 206, which may be made of any sturdy material. For example, the adjustment plate 206 may be metal, ceramic, etc. If the adjustment plate 206 is made of metal or other materials that resist bending or warping, attaching the probe head assembly 209—and thus the probes 236—directly to the adjustment plate helps keep the probes 236 in position even if mechanical loads or thermal gradients cause bending or warping of the wiring substrate 202 or other parts of the probe card assembly 200, as discussed above. As will be discussed below, the adjustment plate 206 also can allow a planarity or orientation of the probes 236 to be adjusted.

Turning now to the probe head assembly 209, a primary purpose of which can be to hold a probe insert 238 (which is not visible in FIGS. 2 and 3A but is visible in FIGS. 3B and 3C) that has electrically conductive probes 236 for contacting and making electrical connections with input and/or output terminals (not shown) of a DUT 112 (see FIG. 1A), which as discussed above, may be one or more dies of an unsingulated semiconductor wafer, one or more singulated dies (packaged or unpackaged), an electronics module, or any other electronics device or other device to be tested.

As shown in particular in FIGS. 2 and 3C, the probe head assembly 209 can be disposed within an opening 256 in the wiring substrate 202 and a similar opening 254 in the stiffener 204 and attached to the adjustment plate 206 by bolts 232 and nuts 290. As shown, bolts 232 extend from the top of the probe head assembly 209, pass through holes 298 in the adjustment plate 206, and thread into nuts 290. In the exemplary embodiment shown in FIGS. 2 and 3A-3C, the probe head assembly 209 can be attached directly to the adjustment plate 206 rather than the stiffener 204 or wiring substrate 202. As discussed above, attaching the probe head assembly 209 directly to the adjustment plate 206 may provide greater mechanical strength and stability to the probe head assembly 209 than could be achieved if the probe head assembly 209 were attached directly to the wiring substrate 202.

As also shown in particular in FIGS. 2, 3A, and 3C, jacking screws 276 can thread into adjustment plate 206 and abut against stiffener 204. Thus, rotating a jacking screw 276 in one direction can cause jacking screw 276 to advance toward stiffener 204 and push stiffener 204 away from adjustment plate 206. Rotating jacking screw 276 in the opposite direction can retract jacking screw 276 away from stiffener 204, allowing stiffener 206 to move toward adjustment plate 206.

Locking screws 214 pass through holes 274 in adjustment plate 206 and thread into stiffener 204. While locking screws 214 are sufficiently loosened, jacking screws 214 may be advanced toward stiffener 204 or retracted away from stiffener 204 as discussed above. Tightening locking screws 214—that is, threading locking screws 214 into stiffener 204—however, pulls stiffener 204 as close to adjustment plate 206 as jacking screws 276 allow and holds stiffener 204 in that position with respect to adjustment plate 206.

Jacking screws 276 and locking screws 214 thus provide the ability to adjust the planarity or orientation of the adjustment plate 206 with respect to the wiring substrate 204. Holes 248 in cover 282 (See FIG. 2) provide access to the jacking screws 276 and locking screws 214. Although four pairs of jacking screws 276 and locking screws 214 are shown in the probe card assembly 200 (see FIGS. 2 and 3A), fewer or more jacking screws 276 and locking screws 214 may be used.

Figure 1B:
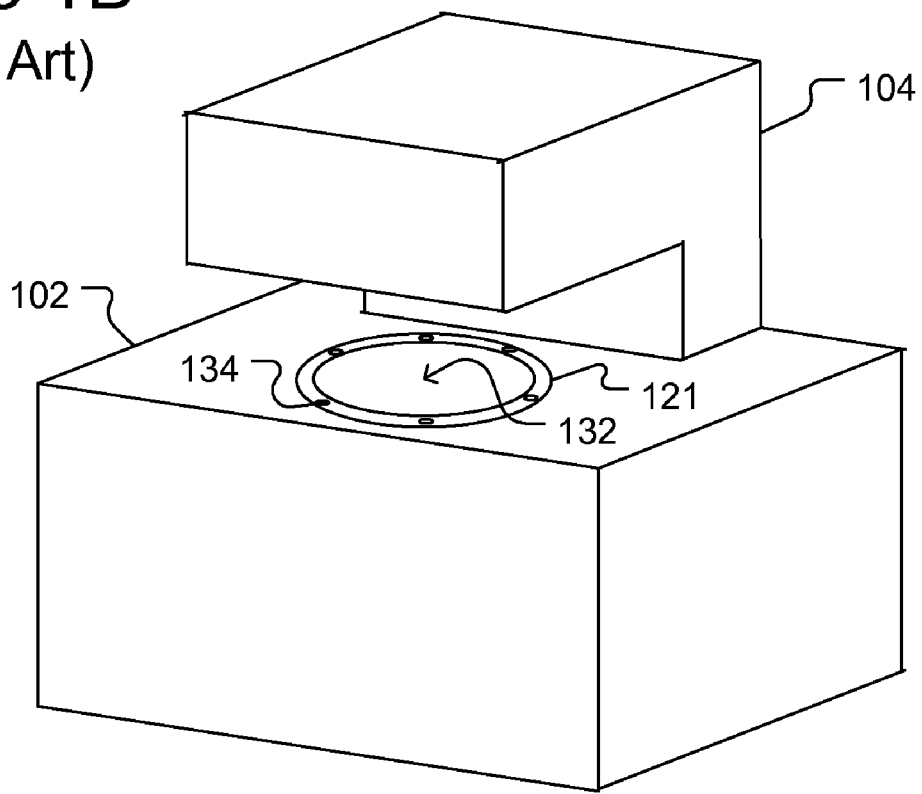
Figure 4:
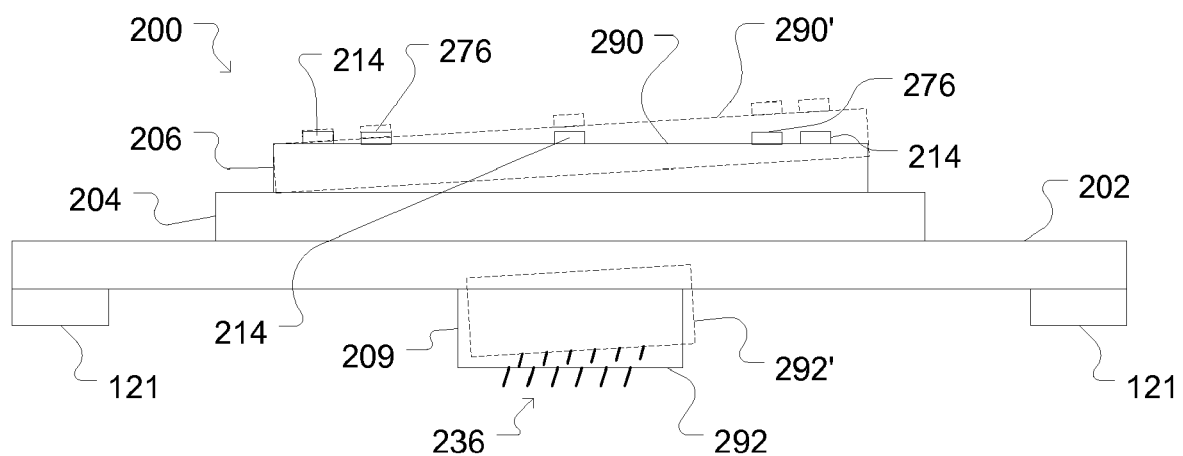
FIG. 4 illustrates exemplary adjustment of a planarity or orientation of the probes of the probe card assembly of FIG. 2.

As shown in FIG. 4 (which shows a simplified block diagram of probe card assembly 200 attached to prober head plate 121 of the prober 102 of FIGS. 1A and 1B), because the probe insert (which is not separately shown in FIG. 4 but, as discussed above, can be part of the probe head assembly 209) with probes 236 is attached to the adjustment plate 206, adjusting the planarity or orientation of the adjustment plate 206 (e.g., from orientation 290 to 290' in FIG. 4) also adjusts the planarity or orientation of the probes 236 (e.g., from orientation 292 to 292' in FIG. 4) with respect to the test head plate 121 of prober 102. Accordingly, the planarity or orientation of the probes 236 may be adjusted to correspond to the planarity or orientation of the DUT (e.g., DUT 112 disposed on stage 106 in FIG. 1A).

Figure 5:
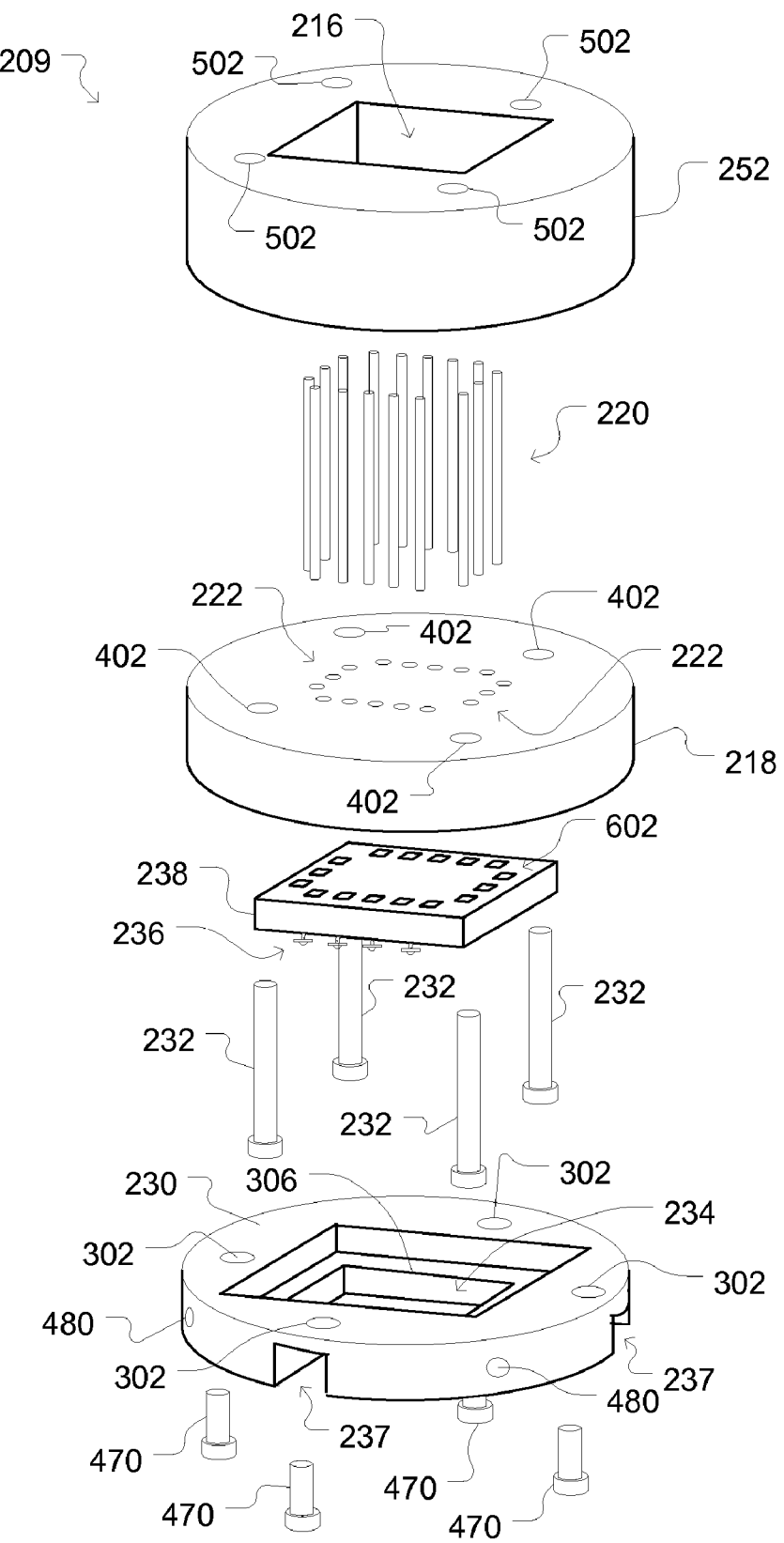
FIG. 5 shows an exploded, perspective view of the probe head assembly of FIG. 2.
Figure 6A:
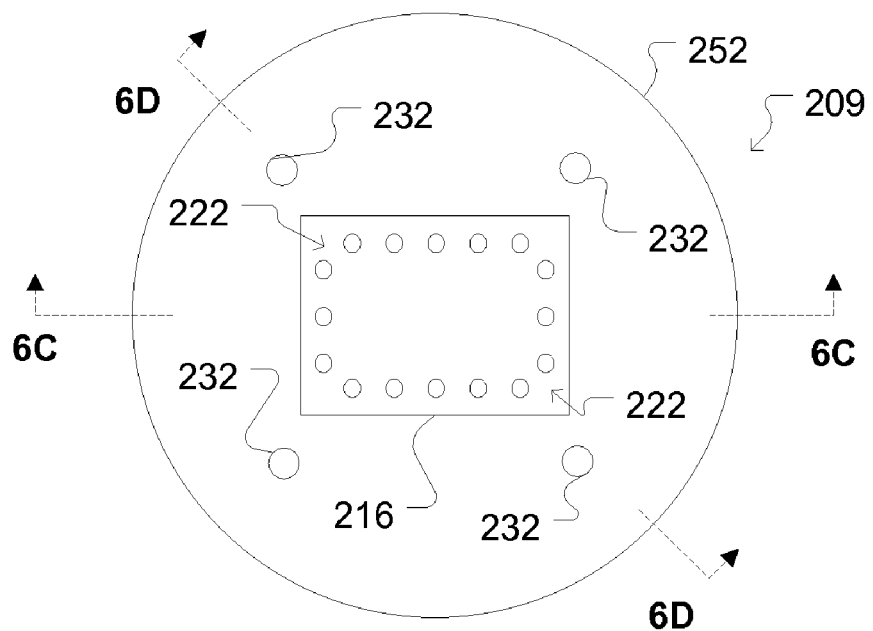
FIG. 6A shows a top view of the probe head assembly of FIG. 5.
Figure 6B:
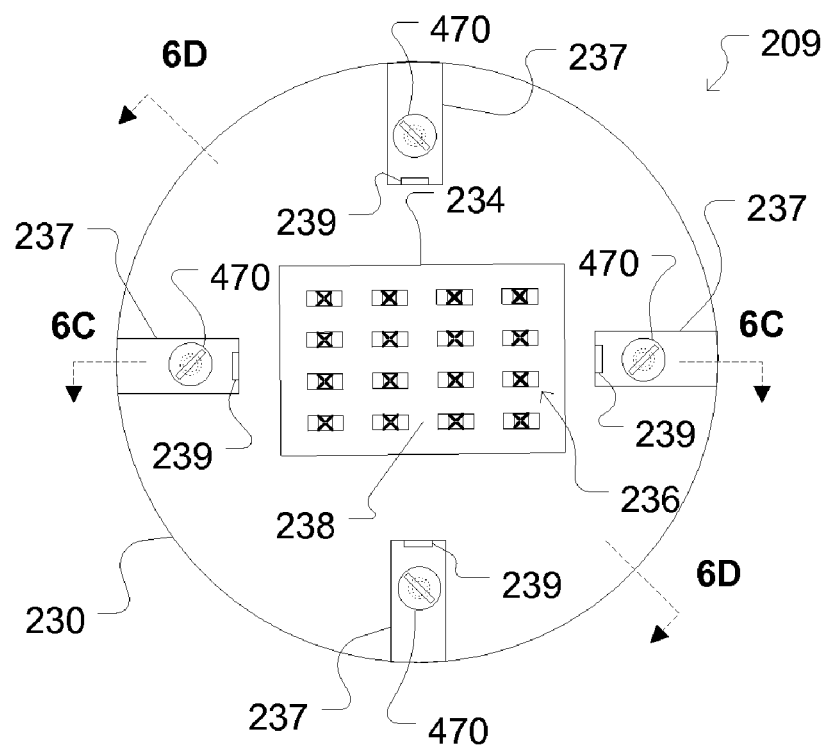
FIG. 6B shows a bottom view of the probe head assembly of FIG. 5.

FIGS. 5 and 6A-6D show details of an exemplary implementation of the probe head assembly 209 according to some embodiments of the invention. (The depiction shown in FIGS. 5 and 6A-6D may not necessarily be to scale.) FIG. 5 shows an exploded, perspective view, FIG. 6A shows a top view, FIG. 6B shows a bottom view, and FIGS. 6C and 6D show side, cross-sectional views of probe head assembly 209. As shown in those Figures, the probe head assembly 209 can include an insert holder 230 that holds a probe insert 238 with probes 236 for contacting the input and/or output terminals (including power and ground terminals) of the DUT 112, a pin holder 218, and a spacer 252.

The insert holder 230 can include a graduated opening 234 with ledges 306. The probe insert 238 can fit into a top of opening 234 and rest on ledges 306, and the probes 236 attached to the insert 238 can extend through a bottom of opening 234, as shown most clearly in FIGS. 6C and 6D. Insert holder 230 can also include recesses 237, which as shown in FIGS. 6B and 6C, provide access to set screws 239. As shown in FIG. 6C, set screws 239 thread through the insert holder 230 into the opening 234 and against the probe insert 238. Rotating set screws 239 in one direction tightens screws 239 against probe insert 238, which holds probe insert 238 in place within insert holder 230. Rotating screws 239 in the other direction loosens screws 239, allowing probe insert 238 to be removed from insert holder 230. Additional openings (not shown) may be included around the periphery of opening 234 to facilitate removal of a probe insert 238 from opening 234. Insert holder 230 may be formed of any suitable material, including without limitation metal, ceramic, etc.

Probe insert 238 can include probes 236 attached to one side. Insert 238 can also include electrically conductive pads 602 disposed on the opposite side from the probes 236. Electrical connections (not shown) connect ones of the pads 602 with ones of the probes 236. The insert 238 may comprise any suitable material, including without limitation ceramic, printed circuit board material, etc.

Probes 236 may be resilient, conductive structures. Non-limiting examples of suitable probes 236 include composite structures formed of a core wire bonded to a conductive terminal (not shown) on probe insert 238 that can be over coated with a resilient material as described in U.S. Pat. No. 5,476,211, U.S. Pat. No. 5,917,707, and U.S. Pat. No. 6,336,269. Probes 236 may alternatively be lithographically formed structures, such as the spring elements disclosed in U.S. Pat. No. 5,994,152, U.S. Pat. No. 6,033,935, U.S. Pat. No. 6,255,126, U.S. Patent Application Publication No. 2001/0044225, and U.S. Patent Application Publication No. 2001/0012739. Other nonlimiting examples of probes 236 include conductive pogo pins, bumps, studs, stamped springs, needles, buckling beams, etc.

Pin holder 218 provides through holes 222 for a plurality of electrically conductive pins 220. The pins 220 pass through holes 222 and make electrical connections with pads 602 on probe insert 238. Pins 220 may be spring loaded to provide spring forces against the pads 602 and thereby maintain electrical connections with the pads 602. For example, pins 220 may be pogo pins configured with a spring bias away from the pin holder 218 and toward the probe insert 238. Pin holder 218 may comprise any suitable material, including without limitation metal, ceramic, printed circuit board material, etc. If pin holder 218 comprises an electrically conductive material, holes 222 can include an electrically insulating material.

Spacer 252 can include an opening 216 into which pins 220 extend. Spacer 252 may comprise any suitable material, including without limitation metal, ceramic, printed circuit board material, etc.

As shown in FIG. 6D, bolts 232 extend through holes 402 and 502 in the pin holder 218 and spacer 252, respectively, and out of the top of the probe head assembly 209. As shown in FIG. 3C, the portions of bolts 232 that extend out of the top of the probe head assembly 209 pass through holes 298 in the adjustment plate and thread into corresponding nuts 290, thus attaching the pin holder 218 and spacer 252 to the adjustment plate 206. Referring again to FIG. 6C, bolts 470 pass through holes 302 in the insert holder 230 and thread into the pin holder 218, thus attaching the insert holder 230 to the pin holder 218 and thus also to the spacer 252 and adjustment plate 206. As also shown, counter-sink holes 460 in pin holder 218 accommodate the heads of bolts 232, allowing insert holder 230 to be attached flush against the pin holder 218.

The insert 238 of probe card assembly 200 can be removed from probe card assembly 200 by simply removing bolts 470, the removal of which detaches the insert holder 230 from the pin holder 218 and thus from the probe card assembly 200. Once the insert holder 230 is removed, the probe insert 238 may be removed from the insert holder 230 and replaced with a new insert 238'. Thereafter, the insert holder 230 can be reattached to the probe card assembly 200 by passing bolts 470 through holes 302 in the insert holder 230 and threading bolts 470 into the pin holder 218. Alternatively, a new insert holder 230' with a new insert 238' may be attached to pin holder 218 using bolts 470.

Other attachment mechanisms may be used in place of bolts 470. For example, screws, clamps, mechanical locking devices, etc. may be used in place of bolts 470 to secure the insert holder 230 to the pin holder 218. Moreover, insert holder 230 and probe insert 238 need not be separate and distinct structural entities. For example, insert holder 230 may be solid and thus lack opening 234. Terminals 602 may be disposed on one side of insert holder 230 and probes 236 disposed on the other side with electrical connections between terminals 602 and probes 236 through insert holder 230. In such a case, probe sets can be changed by changing insert holders 230 rather than changing probe inserts.

Figure 8A:
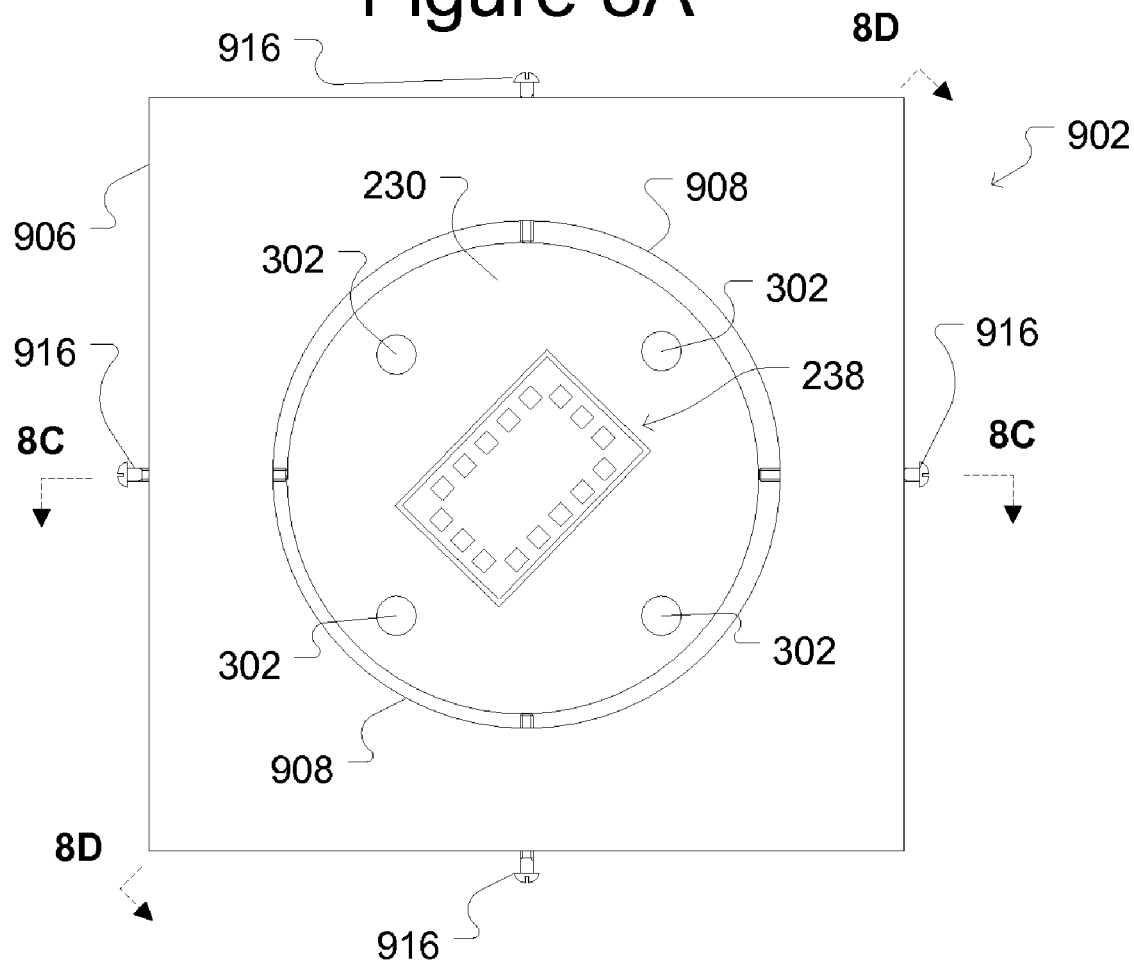
FIG. 8A shows a top view of the attachment tool of FIG. 7 with an insert holder but without the cover.
Figure 8B:
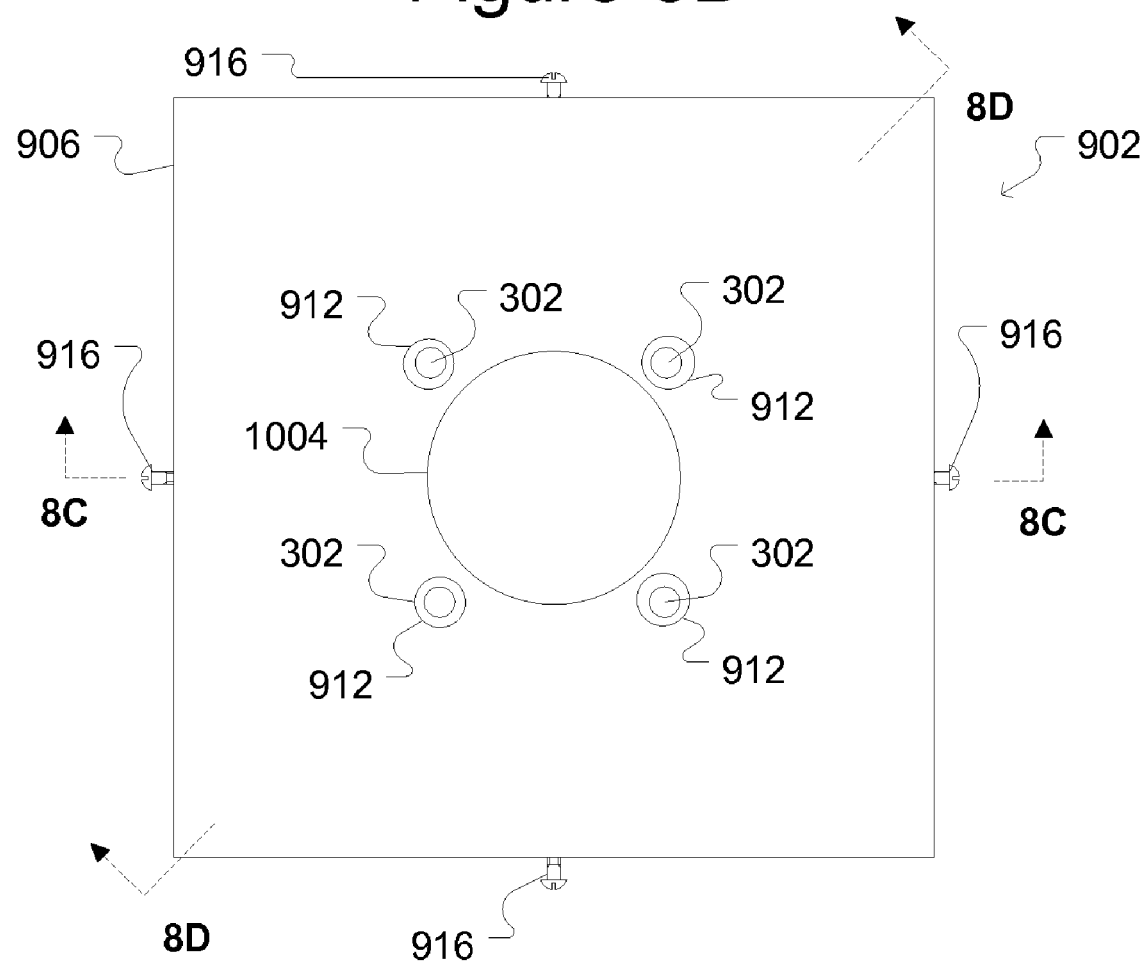
FIG. 8B shows a bottom view of the attachment tool of FIGS. 8A and 8B.
Figure 8C:
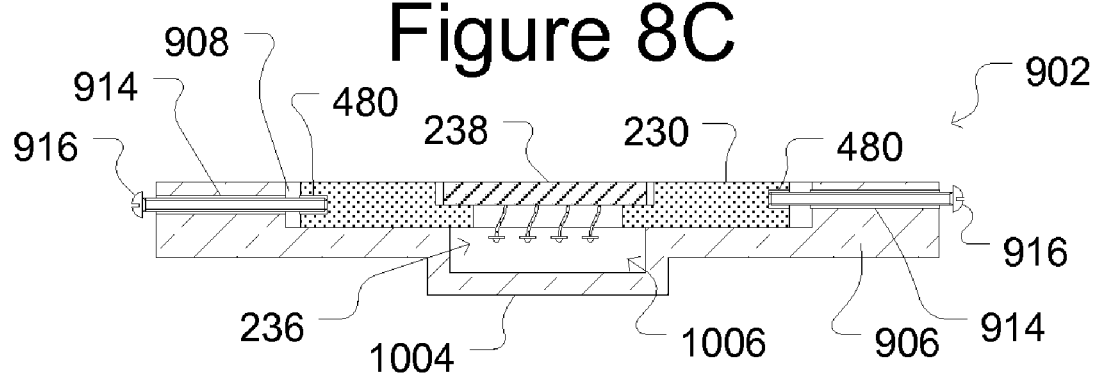
FIGS. 8C and 8D show side, cross-sectional views of the attachment tool of FIG. 8A.
Figure 8D:
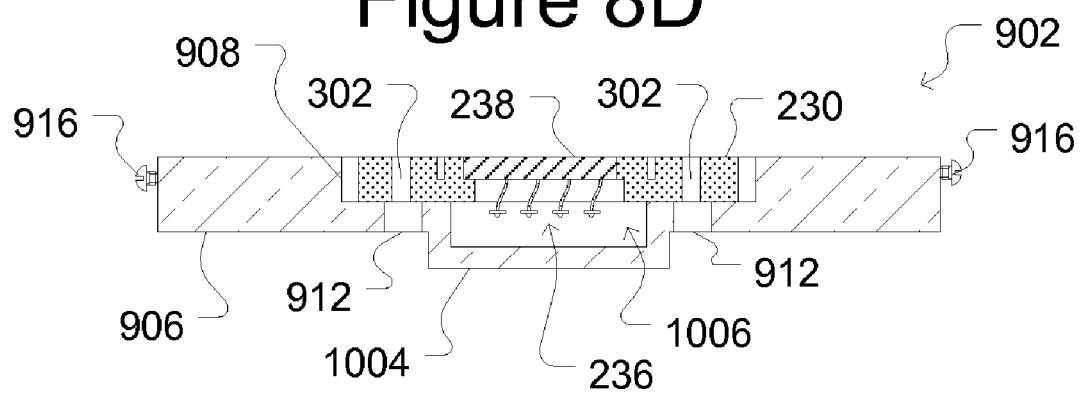

FIGS. 7 and 8A-8D illustrate an exemplary attachment tool 902 that facilitates attaching and detaching insert holder 230 to and from the probe card assembly 200 according to some embodiments of the invention. FIG. 7 shows an exploded, perspective view of the attachment tool 902 with an optional cover 904, and FIG. 8A shows a top view, FIG. 8B shows a bottom view, and FIGS. 8C and 8D show side, cross-sectional views of the attachment tool 902 (without the cover 904).

As shown, the attachment tool 902 can comprise a substrate 906 that has a well 908. As shown in FIGS. 8A-8D, the well 908 can be sized to receive an insert holder, like insert holder 230. As best seen in FIGS. 7 and 8C, set screws 916 thread into threaded holes 914 in the substrate 906 and into threaded holes 480 in the insert holder 230. Advancing set screws 916 through hole 914 and into hole 480 holds the insert holder 230 securely in well 908. Loosening set screws 916 such that the screws 916 retract from holes 480, releases the insert holder 230, allowing the insert holder 230 to be removed from well 908. The well 908 can include extension 1004 that provides space 1006 for the probes 236 attached to the insert 238. Holes 912 in the substrate 906 align with holes 302 in the insert holder 230 and provide openings for a screw driver (not shown) or other tool for accessing screws 470, which as discussed above, attach the insert holder 230 to the pin holder 218. Removable cover 904 may be screwed (not shown), bolted (not shown), clamped (not shown), or otherwise removably attached to the substrate 906.

Figure 9A:
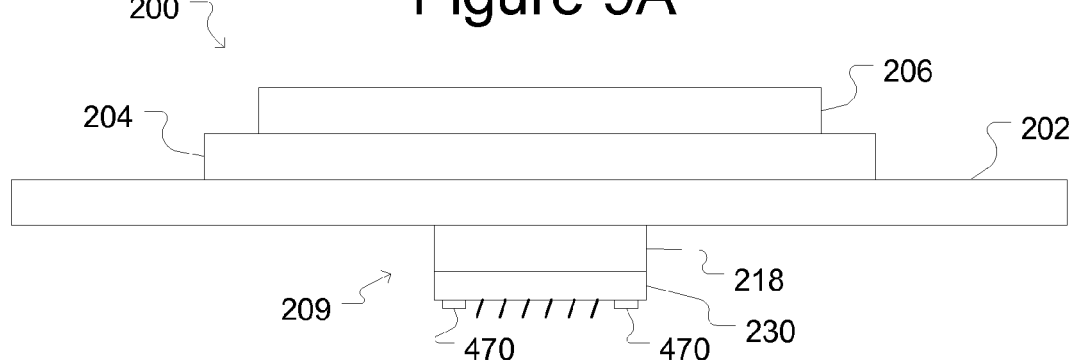
FIGS. 9A, 9B, and 9C illustrate exemplary changing of an insert according to some embodiments of the invention.
Figure 9B:
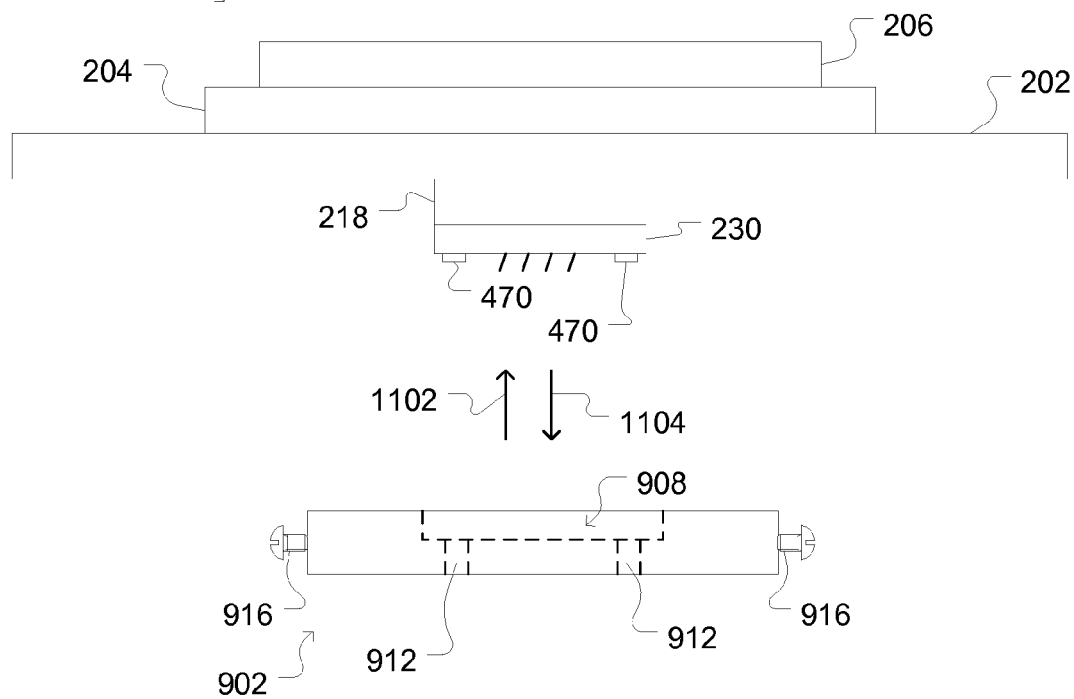
Figure 9C:
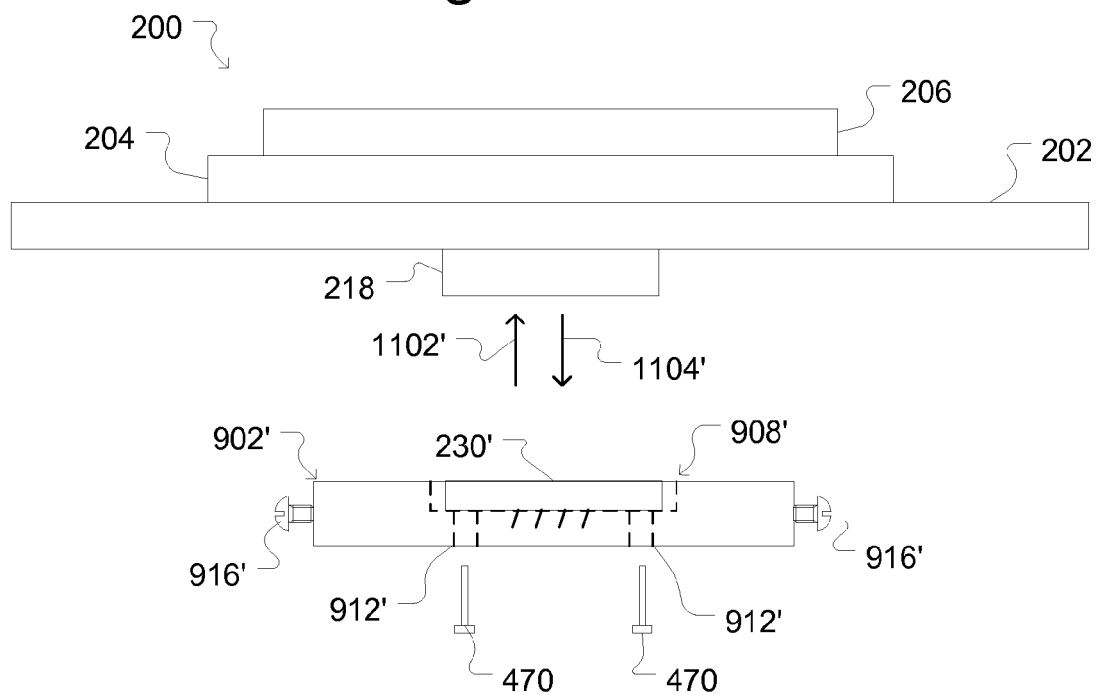

FIGS. 9A, 9B, and 9C illustrate an exemplary process for changing insert 238 on probe card assembly 200, which is shown in simplified block format. As shown in FIG. 9A, adjustment plate 206, stiffener 204, wiring substrate 202, and probe head assembly 209, although depicted in block format, can be as discussed above and can be assembled as discussed above. As also discussed above, screws 470 attach the insert holder 230 to the pin holder 218 (which can be attached to the spacer 252 (not shown in FIG. 9A) and the adjustment plate 206 by bolts 232 and nuts 290 (not shown in FIG. 9A) as discussed above. Although not shown in FIG. 9A, an insert 238 can be disposed in insert holder 230 as generally discussed above.

As shown in FIG. 9B, insert holder 230 may be removed from pin holder 218 by moving 1102 attachment tool 902 (which is also shown in simplified block format in FIG. 9B but can include the features described above with respect to FIGS. 7 and 8A-8D) such that the insert holder 230 can be disposed in the well 908 of the attachment tool 902. Set screws 916 can then be tightened as discussed above to secure the insert holder 230 in the well 908. A tool such as a screw driver (not shown) can then be inserted through holes 912 in attachment tool 902 to engage screws 470, which can then be loosened and removed, which detaches the insert holder 230 from pin holder 218. The attachment tool 902, now with insert holder 230 in its well 908, can be moved 1104 away from the probe card assembly 200. Cover 904 may then be placed on the attachment tool 902 to protect the probe insert 238, and the probe insert 238 may thus be safely stored or transported to a repair facility.

As shown in FIG. 9C, a replacement insert holder 230' that holds a replacement insert 238' (not shown) may be attached to the probe card assembly 200 in similar fashion. That is, another attachment tool 902' in whose well 908' is secured the replacement insert holder 230', can be moved 1102' into engagement with the pin holder 218 and holes 302 (not shown in FIG. 9C) in the insert holder 230' can be aligned with corresponding threaded holes (not shown) in the pin holder 218. A tool such as a screw driver (not shown) can then be inserted through holes 912' in attachment tool 902' to drive screws 470 through holes 302 in the new insert holder 230' and thread screws 470 into the pin holder 218 (as shown in FIG. 6C), attaching the new insert holder 230' to the pin holder 218. Once screws 470 are tightened, set screws 916 can be loosened, releasing the insert holder 230', and the attachment tool 902' can be moved 1104' away from the insert holder 230', which can now be attached to the pin holder 218.

As discussed above inert holder 230 and probe insert 238 may be modified to comprise a single entity rather than being separate structural entities.

Figure 10:
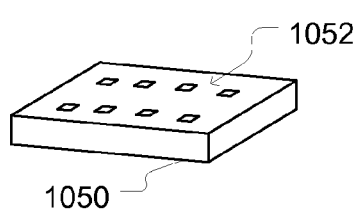
FIG. 10 illustrates an exemplary DUT in the form of a semiconductor die.

FIGS. 10, 11, 12A, 12B, 13, 14A, 14B, and 15 illustrate exemplary application of the foregoing process of changing the probe insert 238 of probe card assembly 200 according to some embodiments of the invention. FIG. 10 illustrates a semiconductor die 1050, which can be an exemplary DUT to be tested using probe card assembly 200. (Other examples of a DUT include, without limitation, a packaged die, a test structure or other feature on a semiconductor wafer, etc.) As shown, die 1050 can include eight input and/or output terminals 1052 for receiving input signals, power, and ground into the die 1050, and for outputting signals from the die 1050. As also shown, the terminals 1052 can be arranged on the die 1050 in two rows with four terminals 1052 in each row.

Figure 11:
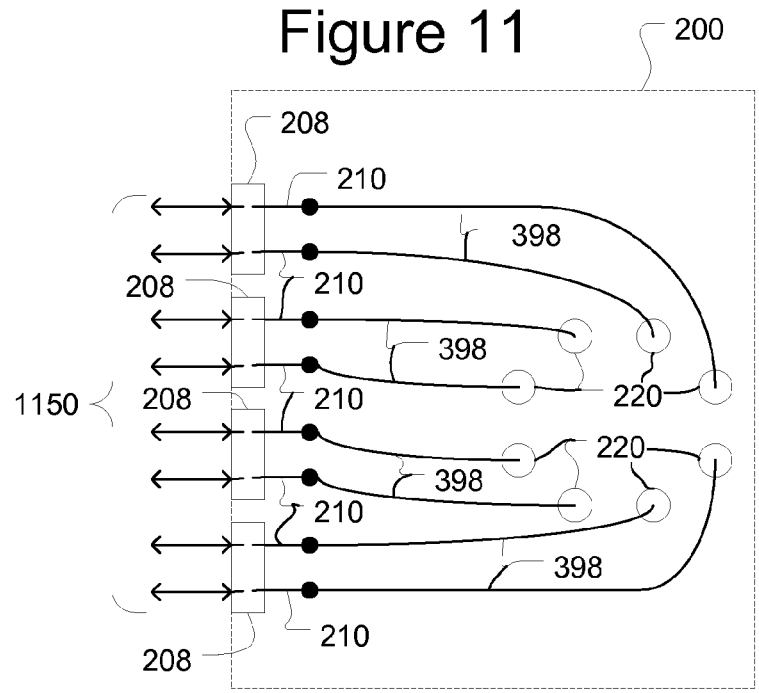
FIG. 11 illustrates in schematic format an exemplary configuration of the probe card assembly of FIG. 2 for testing the DUT of FIG. 10 according to some embodiments of the invention.
Figure 12A:
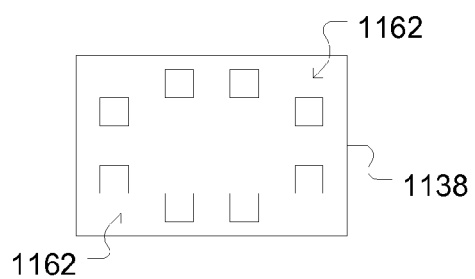
FIG. 12A illustrates a top view of a probe insert configured for testing the DUT of FIG. 10 according to some embodiments of the invention.
Figure 12B:
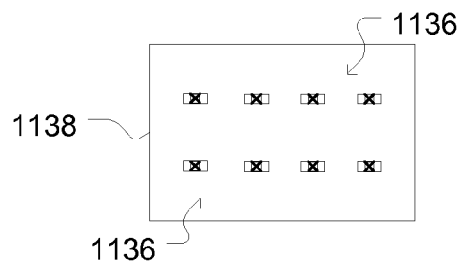
FIG. 12B illustrates a bottom view of the probe insert of FIG. 12A.

FIG. 11 illustrates in simplified schematic format, a configuration of probe card assembly 200 for testing die 1050, and FIGS. 12A and 12B illustrate a probe insert 1138 for testing die 1050.

In FIG. 11, four channel connectors 208 of probe card assembly 200 can be connected to eight tester channels 1150, which as discussed above, can be for providing test data, power, and ground from the tester (not shown) to die 1050 and providing response data generated by the die 1050 in response to the test data to the tester (not shown). As also discussed above, connections to the tester channels 1050 can be provided through the connectors 208 to traces 210, and wires 398 electrically connect traces 210 to conductive pins 220.

Probe insert 1138, like probe insert 238, can be designed to be placed in insert holder 230 and, while insert holder 230 is bolted 470 to pin holder 218, pads 1162 are pressed against and make electrical connections with pins 220 as discussed above with respect to FIG. 2. (FIG. 12A shows a top view of insert 1138, and pads 1162 may be generally similar to pads 602 of FIG. 5.) The pads 1162 can be electrically connected to probes 1136, which as shown in FIG. 12B (which shows a bottom view of insert 1138) can be arranged in a layout that corresponds to the terminals 1052 of die 1050. That is, probes 1136 can be positioned and configured to correspond to and contact terminals 1052 of die 1050. Thus, configured, probe card assembly 200 can be configured to provide an electrical interface between tester channels 1150 and the terminals 1052 of die 1050. That is, connectors 208, traces 210, wires 398, pins 220, pads 1162, and probes 1136 provide electrical paths between tester channels 1150 and die 1050 pads 1052. Of course, wires 398 associate corresponding traces 210 and pins 220 so that a tester channel 1150 to which a particular signal is assigned can be connected to the terminal 1052 of die 1050 that corresponds to that signal. For example, the channel 1150 that delivers power must be connected to a probe 236 that is positioned to contact the power terminal 1052 of die 1050. As another example, the channel 1150 that delivers a particular control signal (e.g., a write enable signal) must be connected to a probe 236 that contacts the terminal 1052 of die 1050 that is designed to receive that control signal (e.g., the write enable terminal 1052 of die 1050).

Figure 13:
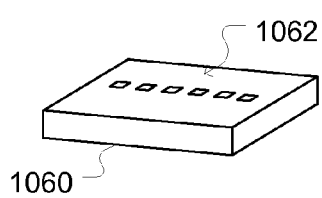
FIG. 13 illustrates another exemplary DUT in the form of a semiconductor die.
Figure 14A:
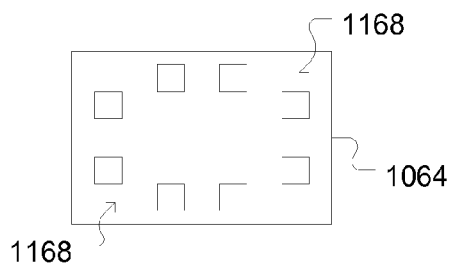
FIG. 14A illustrates a top view of a probe insert configured for testing the DUT of FIG. 13 according to some embodiments of the invention.
Figure 14B:
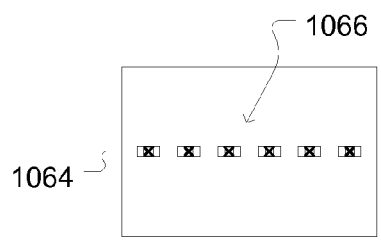
FIG. 14B illustrates a bottom view of the probe insert of FIG. 14A.

FIG. 13 illustrates another die 1060 that is to be tested and thus represents a second DUT with a second pattern of terminals to be contacted. As shown in FIG. 13, die 1060 can include six input and/or output terminals 1062 arranged in a single row. FIG. 14B shows a bottom view of a probe insert 1064 having six probes 1066 arranged in a single row to correspond to and contact pads 1062 of die 1060. The top side of insert 1064, which is shown in FIG. 14A, can be configured the same as insert 1138. That is, insert 1064 can include eight pads 1168 arranged so that, while insert 1064 is in insert holder 230 and insert holder 230 can be attached by bolts 470 to pin holder 218, pads 1168 are pressed against and make electrical connections with pins 220. Because insert 1064 can include only six probes 1066, only six of the eight pads 1168 are connected to probes 1066 and the other two pads 1168 are not used.

Figure 15:
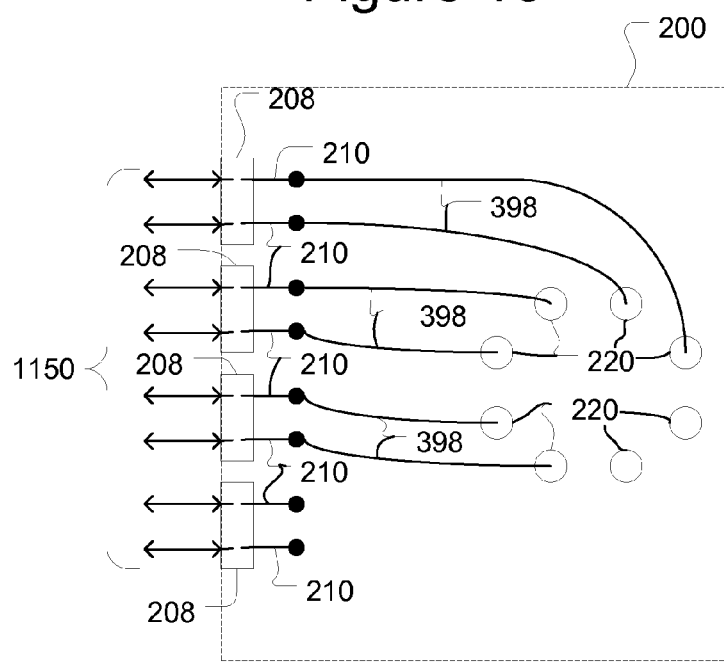
FIG. 15 illustrates in schematic format an exemplary reconfiguration of the probe card assembly of FIG. 2 for testing the DUT of FIG. 13 according to some embodiments of the invention.

The probe card assembly 200, configured as discussed above with respect to FIGS. 11, 12A, and 12B to contact die 1050 may be easily reconfigured to contact die 1060 by simply replacing insert 1138 with insert 1064 as discussed above with respect to 9A-9C. To the extended necessary, wiring 398 may also be reconfigured. For example, as shown in FIG. 15, because die 1060 has only six terminals 1062, only six of the eight tester channels 1150 are needed to test die 1060. Wires 398 may thus be reconfigured to connect only six tester channels 1150 to only six pins 220 that correspond to the six pads 1162 on insert 1064 that are connected to the six probes 1066 of insert 1064. As discussed above, the wires 398 connect tester channels 1050 with probes 236 to match channel 1050 signals with terminal 1062 signals.

It should be apparent that most of the probe card assembly 200 can be used to test both die 1050 and die 1060 despite that fact that the configuration, layout, position, and signal assignments of the terminals 1052 of die 1050 are different than for the terminals 1062 of die 1060. Indeed, the wiring substrate 202, stiffener 204, adjustment plate 206, cover 282, and all of the probe head assembly except the probe insert 238 may be used to test both dies 1050, 1060. Only the probe insert 238 and the wires 398 need be changed. Of course, the ability to reuse most of the probe card assembly 200 in testing dies of different configurations may provide cost and time savings as compared to redesigning and manufacturing a completely new probe card assembly for each new die configuration to be tested.

The examples shown in FIGS. 10-14B are exemplary only. Many variations are possible. For example, the number and layout of terminals on a die and the number and layout of tester channels is exemplary only and provided for purposes of example and ease of discussion. Moreover, the depictions in FIGS. 10-14B may not be to scale.

The ease with which a probe insert 238 may be changed in probe card assembly 200 also facilitates repair of the probe card assembly 200. Failure of one or more probes 236 can be a problem that gives rise to the need to repair a probe card assembly. If a probe 236 of probe card assembly 200 fails (e.g., breaks), the probe insert 238 may be removed and replaced with a new probe insert 238. The removed probe insert 238 with the broken probe 236 may then be taken to a repair facility where the probe is fixed or replaced. In the mean time, however, the probe card assembly 200—now with the new probe insert 238—may continue to be used to test DUTs. There is no need to transport the entire probe card assembly 200 to the repair facility and thus take the probe card assembly 200 out of use during the time required to repair the probe 236.

FIGS. 16A, 16B, 17A, 17B, and 18-20 illustrate other exemplary probe card assemblies having probe inserts that can be removed and replaced according to some embodiments of the invention.

Figure 16B:
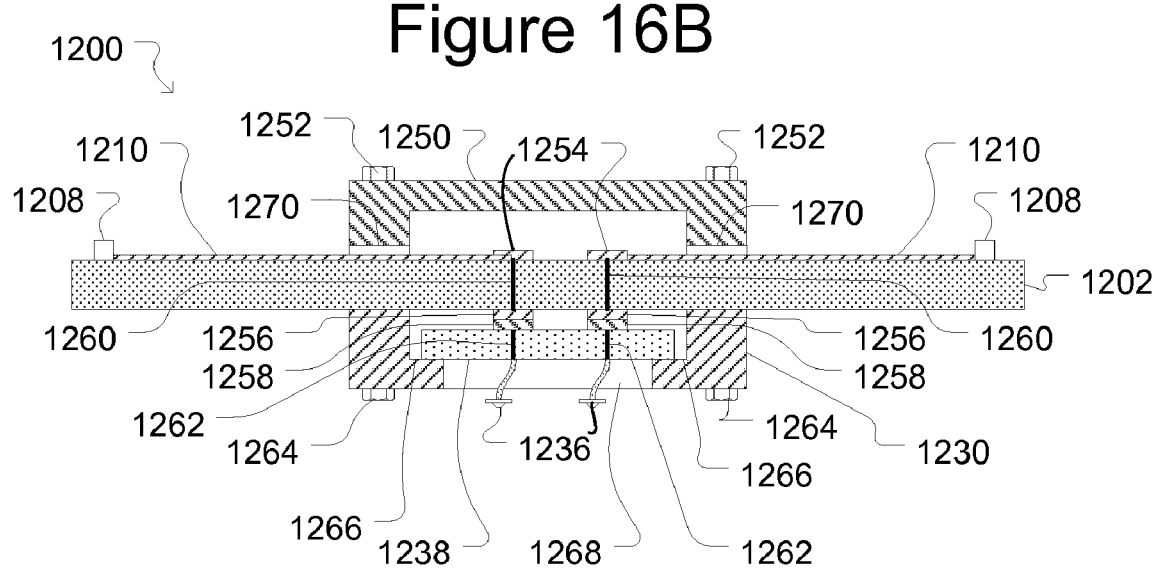
FIG. 16B illustrates a side, cross-sectional view of the probe card assembly of FIG. 16A.

FIGS. 16A and 16B illustrate another exemplary probe card assembly 1200 according to some embodiments of the invention. FIG. 16A illustrates a top view with a cutout 1290 in cover 1250. Cutout 1290 reveals pads 1254. FIG. 16B illustrates a side-cross-sectional view of probe card assembly 1200.

As shown, probe card assembly 1200 can include a wiring substrate 1202 with channel connectors 1208 and an insert 1238 with probes 1236, all of which may be generally similar to like named elements of probe card assembly 200. In the probe card assembly 1200, electrically conductive traces 1210, which pass through passages 1270 in cover 1250 as shown in FIG. 16B, provide electrical connections for data signals, control signals, and other input and/or output (e.g., power and ground) from the channel connectors 1208 to electrically conductive pads 1254 disposed on an upper surface of the wiring substrate 1202. Electrically conductive vias 1260 electrically connect pads 1254 with pads 1256 disposed on a lower surface of the wiring substrate 1202.

Insert 1238 can be disposed on ledges 1266 of an insert holder 1230. Bolt 1264 passes through holes (not shown) in insert holder 1230, wiring substrate 1202, and cover 1250 to engage nuts 1252. While the insert holder 1230 is bolted to the wiring substrate 1202 by bolts 1264 and nuts 1252 as shown in FIG. 16B, electrically conductive pads 1258 on the insert 1238 are held against, and thus engage, pads 1256 and thereby form electrical connections with the pads 1256 on the lower surface of the wiring substrate 1202. The pads 1258 on the insert 1238 can be electrically connected to the probes 1236 by electrically conductive vias 1262 as shown in FIG. 16B.

Insert 1238 can be replaced by loosening bolts 1264 and detaching the insert holder 1230 from the wiring substrate 1202. Once the insert holder 1230 is detached from the wiring substrate 1202, the insert 1238 may be removed from the insert holder 1230 and replaced with a new insert 1238'. The insert holder 1230 may then be reattached to the wiring substrate 1202 with bolts 1264, connecting the new insert 1238' to the pads 1256 on the lower surface of the wiring substrate 1202 and thus also to channel connectors 1208.

Figure 17A:
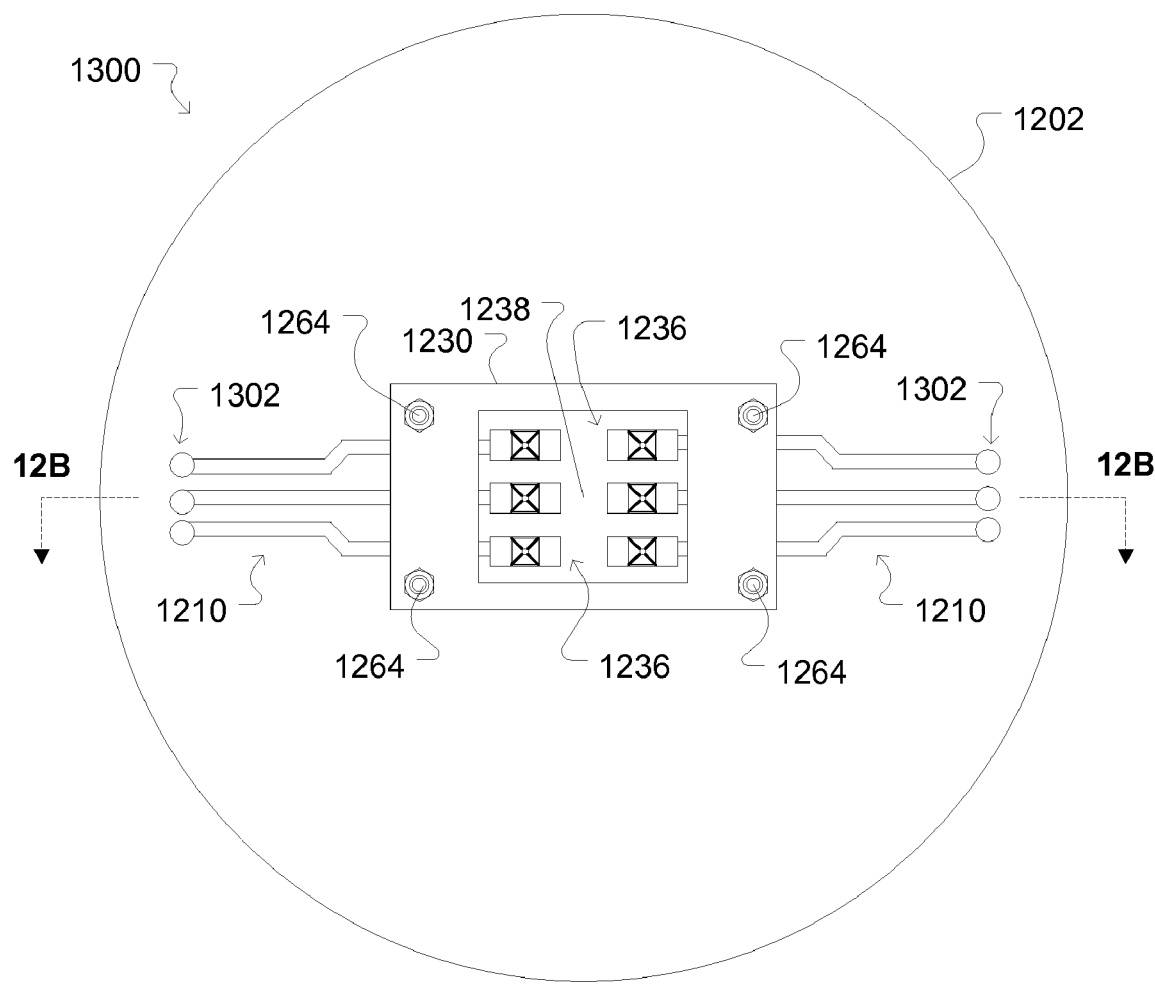
FIG. 17A illustrates a top view of yet another exemplary probe card assembly according to some embodiments of the invention.
Figure 17B:
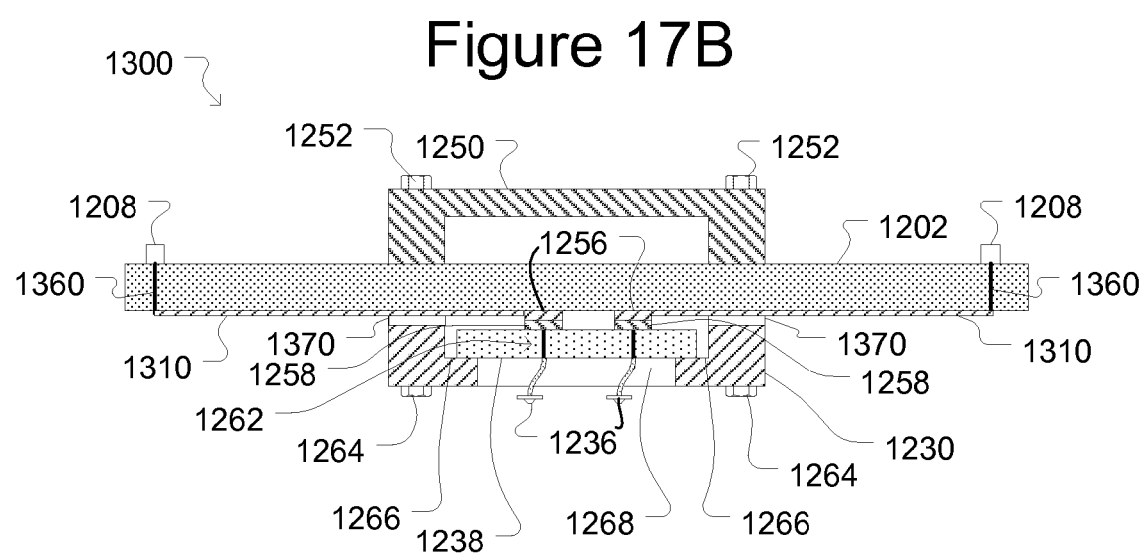
FIG. 17B illustrates a side, cross-sectional view of the probe card assembly of FIG. 17A.

FIGS. 17A and 17B show yet another exemplary probe card assembly 1300, which can be generally similar to probe card assembly 1200, and in fact, like numbered elements in probe card assembly 1200 and probe card assembly 1300 are the same. In probe card assembly 1300, however, electrically conductive vias 1360 electrically connect the channel connectors 1208 with electrically conductive traces 1310 disposed along the lower surface of the wiring substrate 1202. Traces 1310 pass through passages 1370 in the insert holder 1230 and connect to the conductive pads 1256 on the lower surface of the wiring board 1202.

Figure 18:
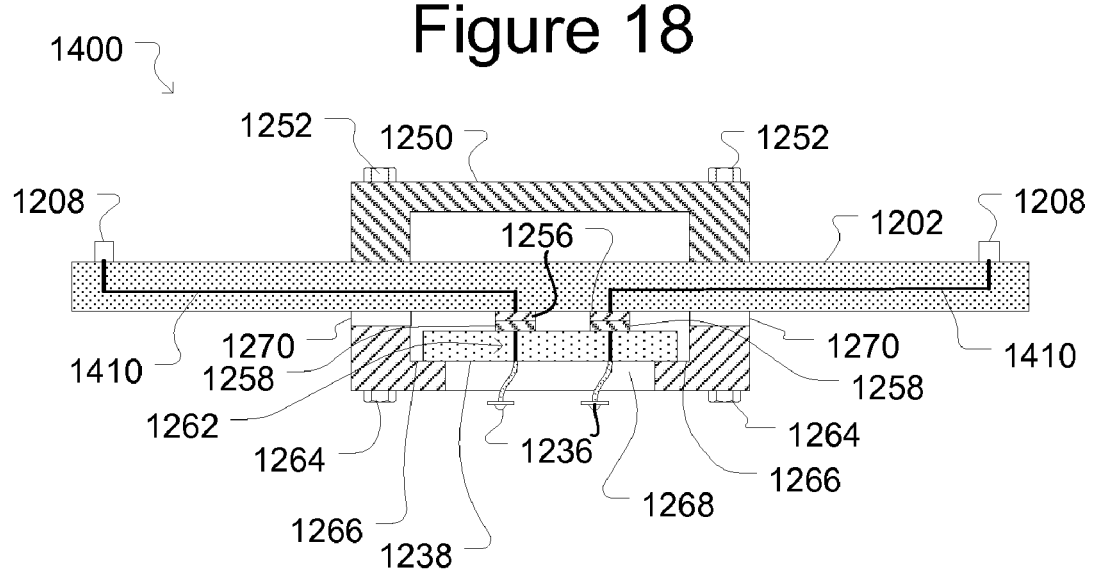
FIG. 18 illustrates a side, cross-sectional view of still another exemplary probe card assembly according to some embodiments of the invention.

FIG. 18 illustrates a side cross-sectional view of yet another exemplary probe card assembly 1400, which can be generally similar to probe card assemblies 1200 and 1300 (like numbered elements are the same) except that channel connectors 1208 are electrically connected to pads 1256 on the lower surface of the wiring substrate 1202 by conductive paths 1410 that comprise electrically conductive vias and traces embedded within wiring substrate 1202.

Figure 19:
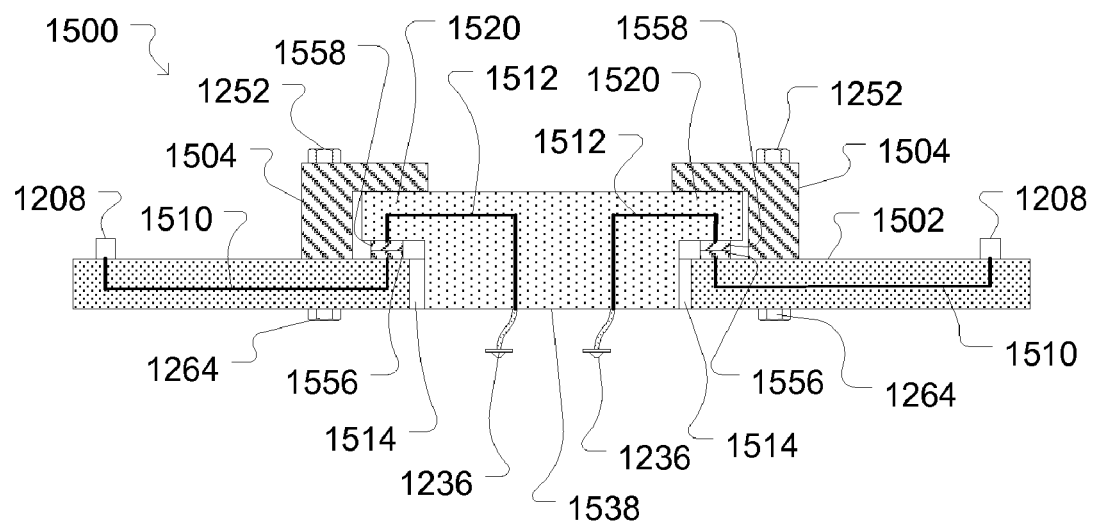
FIG. 19 illustrates a side, cross-sectional view of another exemplary probe card assembly according to some embodiments of the invention.

FIG. 19 illustrates an additional exemplary probe card assembly 1500, which can include channel connectors 1208 and probes 1236 that are the same as like number elements in probe card assemblies 1200, 1300, and 1400. Although otherwise similar to wiring substrate 1202, wiring substrate 1502 of probe card assembly 1500 can include an opening 1514 into which fits insert 1538. As shown in FIG. 19, insert 1538 fits into opening 1514 in the wiring substrate 1502 such that probes 1536 extend out of the opening 1514. Electrically conductive pads 1558 disposed on shoulders 1520 of the insert 1538 rest on, and thereby make electrical connections with, electrically conductive pads 1556 on the wiring substrate 1502. As also shown in FIG. 19, electrical paths 1510 comprising conductive vias and traces disposed within wiring substrate 1502 electrically connect channel connectors 1208 to pads 1556, and electrical paths 1512 comprising conductive vias and traces disposed within the insert 1538 electrically connect pads 1558 with probes 1236. Brackets 1504, which can be bolted to the wiring substrate 1502 by bolts 1264 and nuts 1252, hold the insert 1538 in place against the wiring substrate 1502.

Insert 1538 can be replaced by loosening bolts 1264 and removing insert 1238. A new insert 1538' may then be disposed within opening 1514 in the wiring substrate 1502, after which bolts 1264 can be tightened to hold the new insert 1538' in place.

Figure 20:
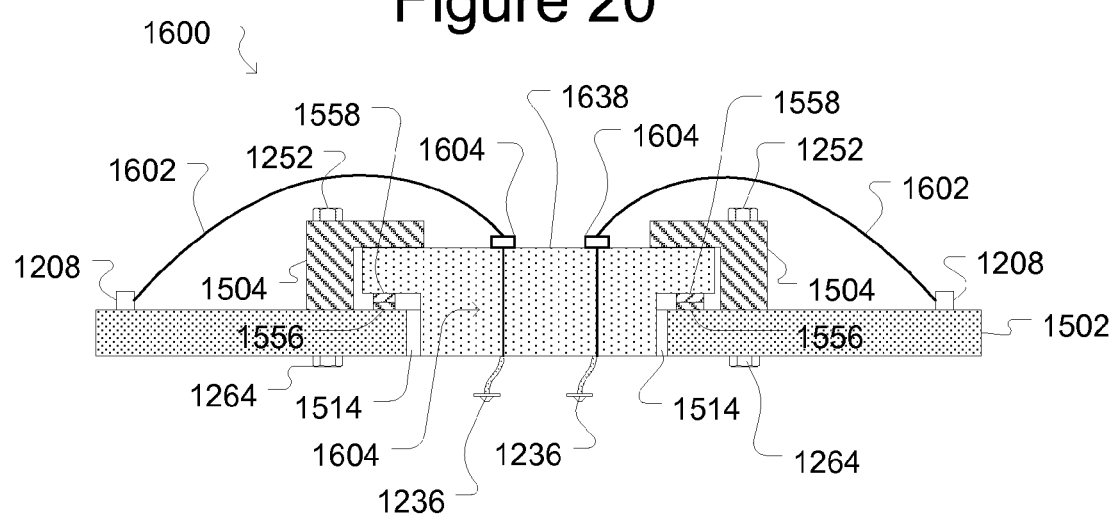
FIG. 20 illustrates a side, cross-sectional view of still another exemplary probe card assembly according to some embodiments of the invention.

FIG. 20 illustrates still another exemplary probe card assembly 1600, which can be generally similar to probe card assembly 1500 (like numbered elements are the same). In probe card assembly 1600, however, electrically conductive vias 1604 electrically connect probes 1236 with electrically conductive pads 1604 on insert 1638, and electrically conductive wires 1602 electrically connect pads 1604 with channel connectors 1208.

In FIGS. 16B, 17B, and 18, the electrical connection between pads 1256 and 1258 may be formed by including resilient electrical connectors (e.g., pogo pins, conductive elastomers, conductive fuzz buttons, conductive springs, wires each bonded at one end to a pad and having a compliant deformity that the other end, compliant bellows contacts, etc.) (not shown) between pads 1256 and 1258. Similarly, in FIGS. 19 and 20, the electrical connection between pad pairs 1558 and 1556 may be made using resilient electrical connectors (e.g., pogo pins, conductive elastomers, conductive fuzz buttons, conductive springs, etc.) (not shown).

Figure 21:
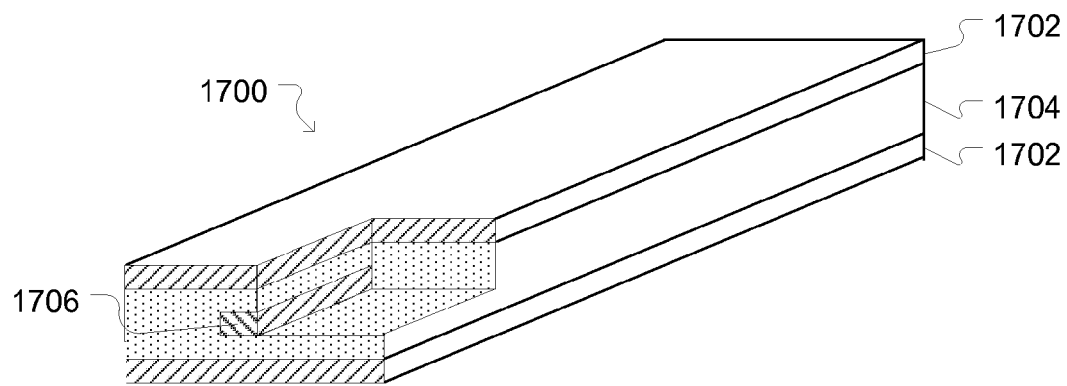
FIGS. 21-24 illustrate exemplary shielded signal traces according to some embodiments of the invention.
Figure 22:
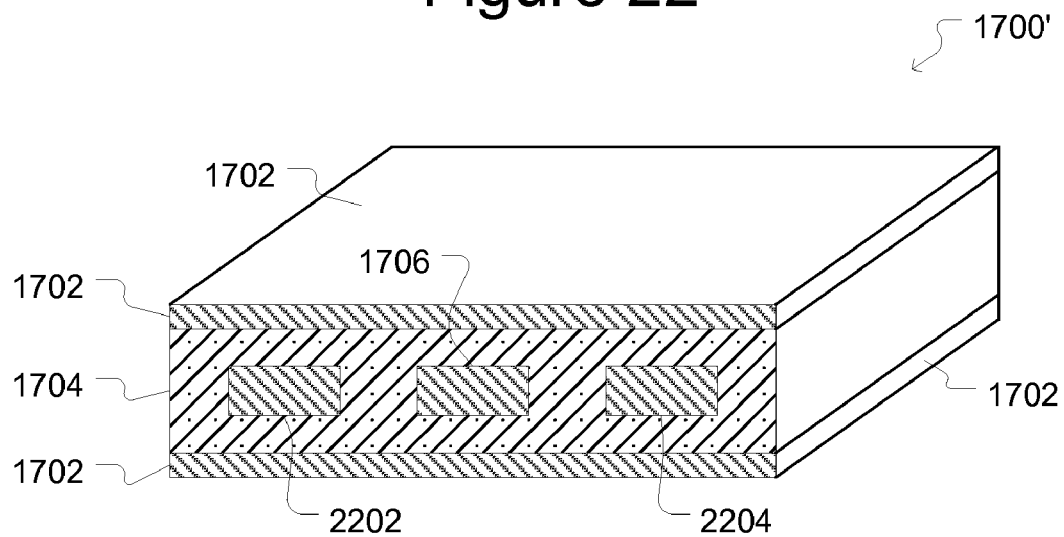

FIG. 21 illustrates a shielded trace 1700 that may be used in place of any of the electrically conductive traces and/or vias shown in any of exemplary probe card assemblies 200, 1200, 1300, 1400, 1500, or 1600 disclosed herein. As shown in FIG. 21, trace 1700 can include an electrically conductive signal trace 1706 for carrying a data or control signal. Electrically conductive planes 1702, which may be connected to ground, a guard potential, or a voltage source (not shown), electrically shield the signal trace 1706. Insulating material 1704 electrically insulates the signal trace 1706 from the planes 1702. As an alternative, multiple signal traces 1706 may be disposed between plates 1702. As yet another alternative, grounded or guard potential traces 2202, 2204 may be disposed within insulating material 1704 on either side of signal trace 1706 to further shield signal trace 1706 as shown in FIG. 22 (which illustrates shielded trace 1700').

Figure 23:
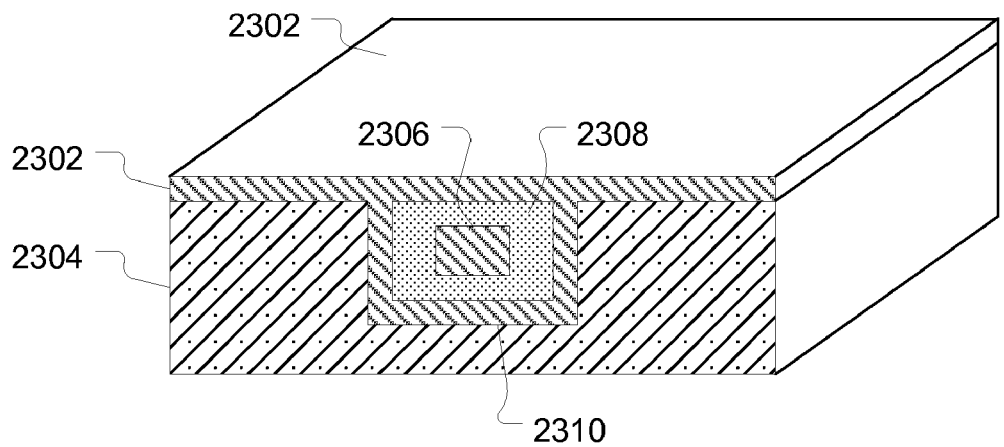
Figure 24:
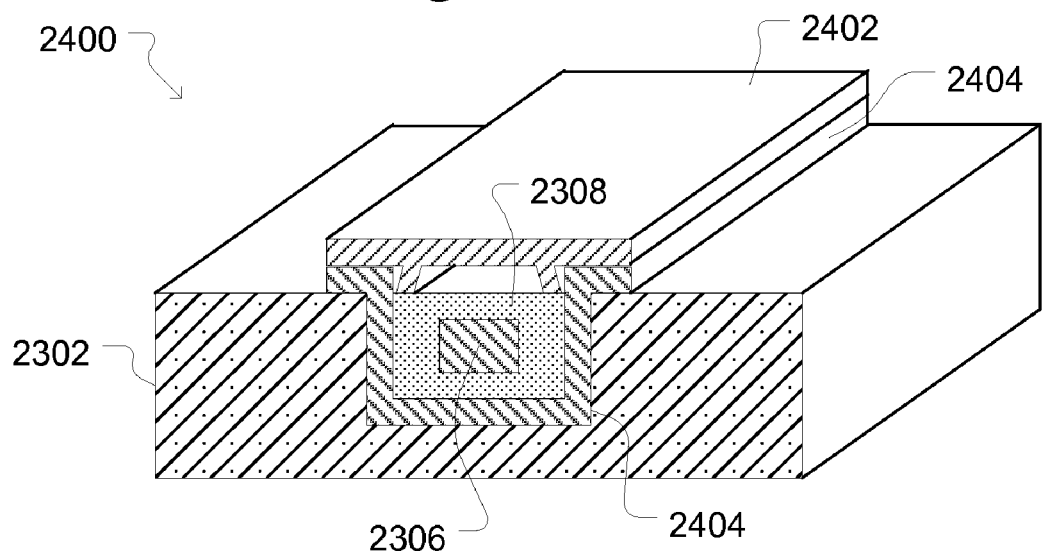

FIGS. 23 and 24 illustrate other exemplary shielded traces 2300, 2400 that may be used in place of any of the electrically conductive traces and/or vias shown in any of exemplary probe card assemblies 200, 1200, 1300, 1400, 1500, or 1600 disclosed herein. In FIG. 23, a signal trace 2306 (which may be like signal trace 1706) can be embedded within insulating material 2308, which in turn, can be surrounded by conductive plate 2302 and conductive box structure 2310, shielding signal trace 2306. Conductive box 2310, insulating material 2308, and signal trace 2306 may be embedded in a substrate 2304, which may comprise a printed circuit board. FIG. 24 shows a variation of trace 2300 of FIG. 23. In FIG. 24, signal trace 2306, which can be surrounded by insulating material 2308, can be shielded by a conductive box structure 2404 and a conductive covering structure 2402.

Figure 25:
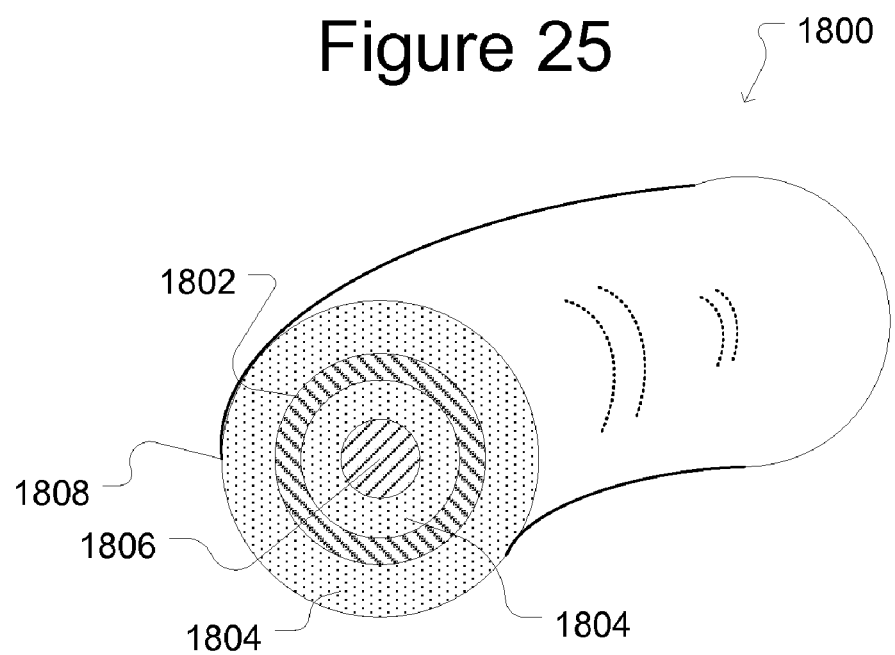
FIG. 25 illustrate an exemplary shielded wire according to some embodiments of the invention.

FIG. 25 illustrates a shielded wire 1800 that may be used in place of any of the electrically conductive wires shown in any of exemplary probe card assemblies 200, 1200, 1300, 1400, 1500, or 1600 disclosed herein. As shown in FIG. 22, shielded wire 1800 can include an electrically conductive signal line 1806 for carrying a data or control signal. An electrical conductor 1802, which may be connected to ground or a guard potential, surrounds the signal line 1806 and thus electrically shields the signal line 1806. Insulating material 1804 electrically insulates the signal line 1806 from conductor 1802. A protective jacket 1808 protects the wire 1800. Shielded wire 1800 may be, for example, a coaxial cable.

By utilizing shielded traces 1700, 1700', 2300, 2400 and/or shielded wires 1800 in the embodiments of a probe card assembly 200, 1200, 1300, 1400, and 1500, the operating frequency of those probe card assemblies can be increased. Thus, when such probe card assemblies are used to run functional tests on DUTs, the use of shielded traces 1700, 1700', 2300, 2400 and/or wires 1800 increases the maximum frequency at which the tests can be run. The use of shielded traces 1700, 1700', 2300, 2400 and/or shielded and/or guard potential wires 1800 also increases sensitivity to certain parametric tests, such as the detection of leakage current in the DUT. Thus, for example, when such probe card assemblies are used to run parametric tests on DUTs, the use of shield traces 1700, 1700', 2300, 2400 and/or wires 1800 can allow for the detection of very small leakage currents.

FIGS. 26-31B illustrate portions of an exemplary probe card assembly 2600 that can include shielded (or guarded) traces in the form of guarded signal structures according to some embodiments of the invention. (Herein, the terms "shielded" and "guarded" are used generally synonymously to refer to at least partial protection from electro and/or magnetic interference such as cross-talk, leakage current, etc.) Generally speaking, the probe card assembly 2600 can be similar to the probe card assembly 200 shown in FIGS. 2-3C. For example, the probe card assembly 2600 can be like the probe card assembly 200 except that wiring substrate 2602 (which can be a non-limiting example of a second substrate) shown in FIG. 26 (which shows a top view of the probe card assembly 2600 similar to the top view shown in FIG. 3A of probe card assembly 200) can replace the wiring board 202 of probe card assembly 200, and the probe head 2800 shown in FIGS. 28A-28C can replace the probe insert 238 of probe card assembly 200.

Figure 26:
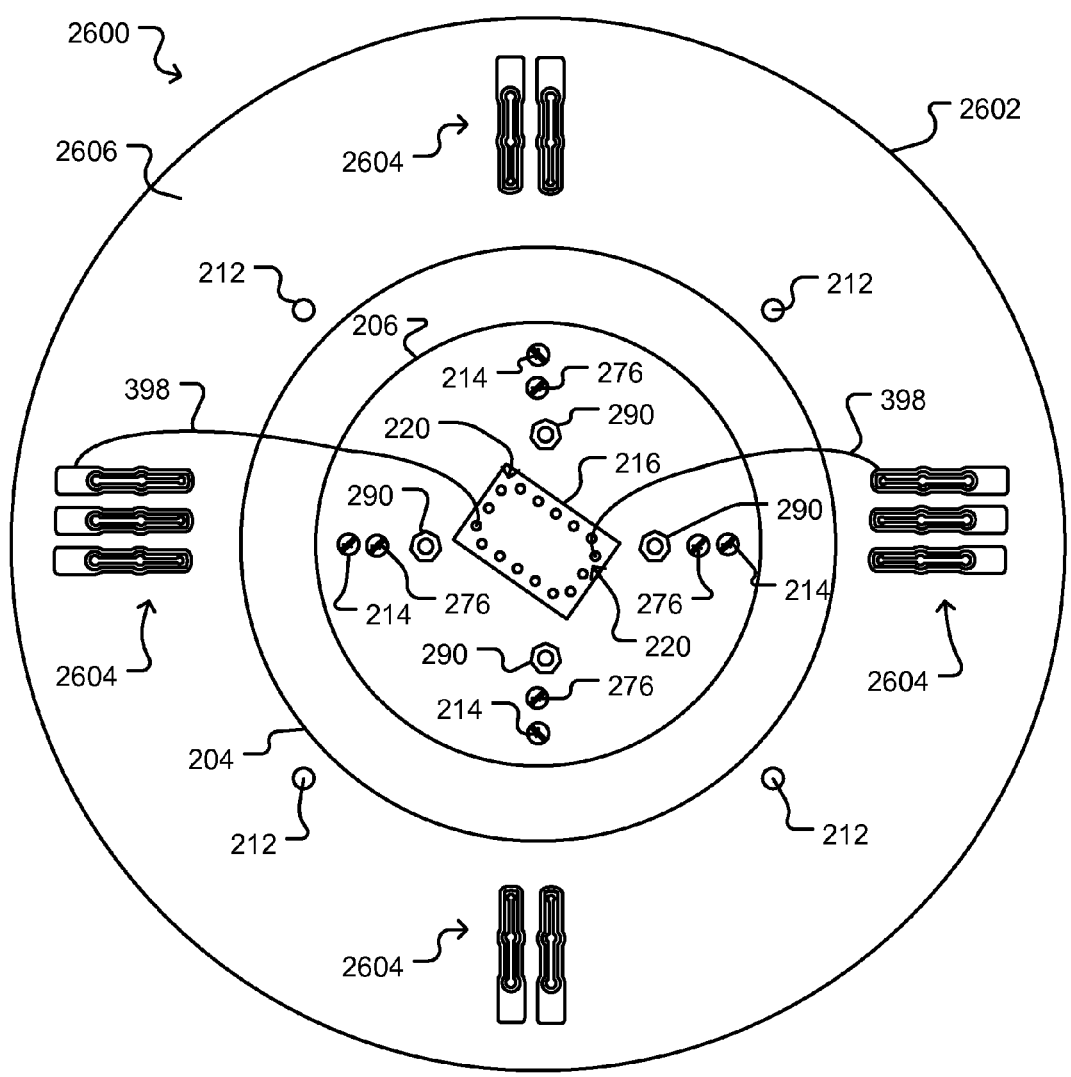
FIG. 26 illustrates a top view of an exemplary probe card assembly according to some embodiments of the invention.
Figure 28A:
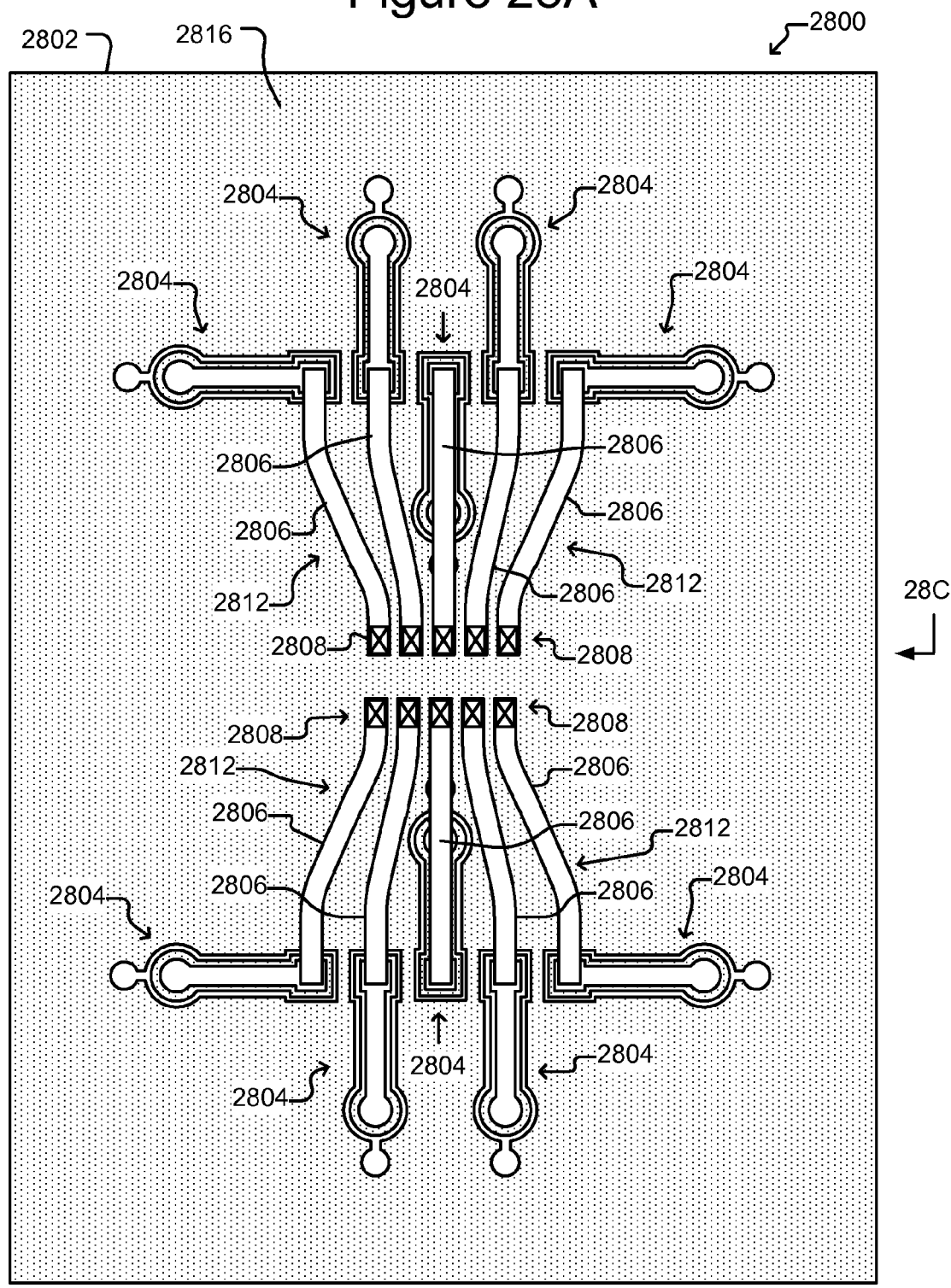
FIG. 28A illustrates a bottom view of an exemplary probe head that can be a part of the probe card assembly of FIG. 26 according to some embodiments of the invention.

As shown in FIG. 26, the wiring substrate 2602 can comprise guarded signal structures 2604 (referred to hereinafter as wiring substrate guarded signal structures 2604, which can be a non-limiting example of an electromagnetic shielded signal structure, an electromagnetic shielding structure, or a second electromagnetic shielding structure), and as shown in FIG. 28A (which shows a bottom view of the probe head 2800), the probe head 2800 can also include guarded signal structures 2804 (referred to hereinafter as probe substrate guarded signal structures 2804, which can be a non-limiting example of an electromagnetic shielded signal structure, an electromagnetic shielding structure, or a first electromagnetic shielding structure). Although wiring substrate guarded signal structures 2604 are illustrated in FIG. 26 as used in place of channel connectors 208 and traces 210 of the probe card assembly 200, wiring substrate guarded signal structures 2604 can instead be used in conjunction with the channel connectors 208 and/or the traces 210 of probe card assembly 200 (see FIGS. 2-3C). Moreover, more or fewer wiring substrate guarded signal structures 2604 than shown in FIG. 26 can be used. Likewise, more or fewer probe substrate guarded signal structures 2804 than shown in FIG. 28A can be used.

Figure 27A:
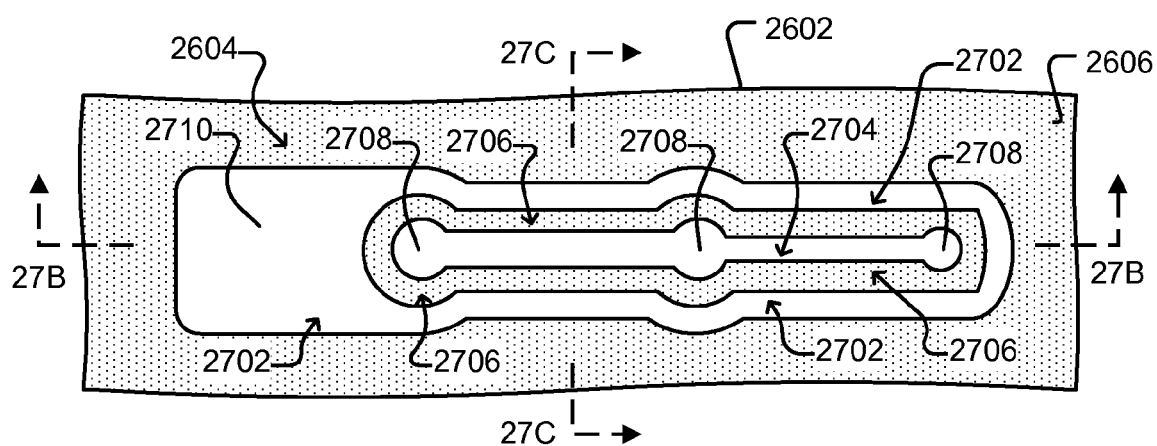
FIG. 27A is a top view of a portion of the wiring substrate of FIG. 26 illustrates one wiring substrate guarded signal structure.
Figure 27B:
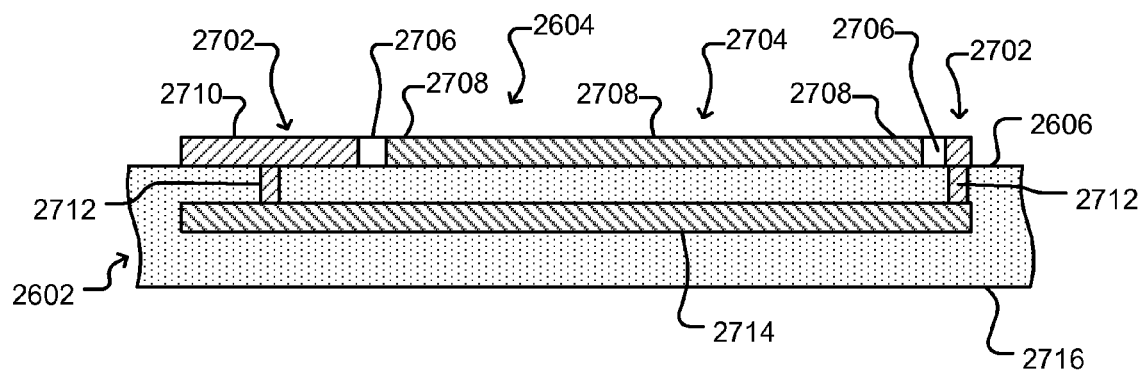
FIGS. 27B and 27C illustrate side, cross-sectional views taken from FIG. 27A.
Figure 27C:
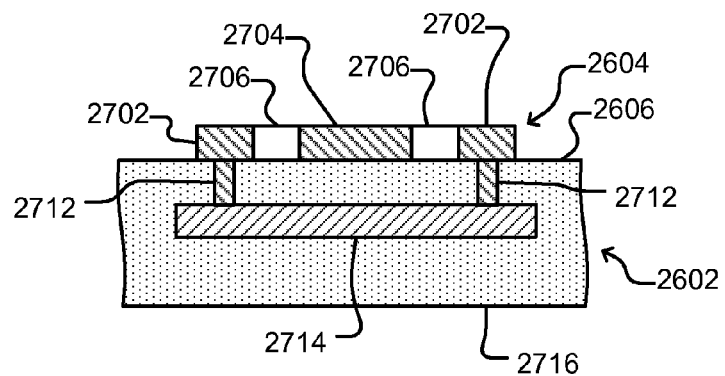

FIG. 27A shows a top view of a portion of the wiring substrate 2602 illustrating an exemplary configuration of one of the wiring substrate guarded signal structures 2604 according to some embodiments of the invention. FIGS. 27B and 27C show side, cross-sectional views of the wiring substrate guarded signal structure 2604 shown in 27A.

As shown in FIGS. 27A-27C, a wiring substrate guarded signal structure 2604 can include a signal trace 2704 (which can be a non-limiting example of a second signal trace), which can comprise an electrically conductive material (e.g., a metal, such as copper, silver, gold, etc.) deposited, formed, or otherwise disposed on a surface 2606 of the wiring substrate 2602. As shown, the signal trace 2704 can include one or more landings 2708. (Although three landings 2708 are shown, more or fewer, including zero, can be included in other configurations.) As also shown in FIGS. 27A-27C, the wiring substrate guarded signal structure 2604 can also include a guard trace 2702, which as shown, can surround (e.g., enclose) the signal trace 2704. For example, as shown in FIG. 27A, the guard trace 2702 can have a closed loop shape, and the signal trace 2704 can be located within the closed loop shape of the guard trace 2702. The guard trace 2702 can comprise the same or similar materials as the signal trace 2704, and the guard trace 2702 can be formed in the same way that the signal trace 2704 is formed.

As shown in FIG. 27A, the guard trace 2702 can include one or more landings 2710. Although one such landing 2710 is shown in FIG. 27A, more or fewer (including zero) can be included. As also shown, the signal trace 2704 and the guard trace 2702 can be formed, deposited, or attached to the surface 2606 of the wiring substrate such that a space 2706 separates and electrically isolates the signal trace 2704 from the guard trace 2702. In FIGS. 27A-27C for purposes of contrast, clarity, and ease of illustration, the wiring substrate 2602 is shaded. The space 2706, which can comprise ambient air, can electrically insulate the signal trace 2704 from the guard trace 2702. In some embodiments, the space 2706 can be filled with a dielectric material.

As shown in FIGS. 27B and 27C, the wiring substrate guarded signal structure 2604 can also include an electrically conductive plane 2714 embedded within the wiring substrate 2602, which can be located, as shown, adjacent the signal trace 2704. One or more electrically conductive vias 2712 (four are shown in FIGS. 27B and 27C, but more or fewer can be used) can electrically connect the guard trace 2702 to the plane 2714. The plane 2714 can comprise an electrically conductive material (e.g., a metal such as copper, gold, silver, etc.) embedded within the wiring substrate 2602. The wiring substrate 2602 can comprise a plurality of electrically non-conductive layers, and the plane 2714 can be disposed between such layers.

Referring again to FIG. 26, each of the wiring substrate guarded signal structures 2604 on the wiring substrate 2602 can be like the exemplary wiring substrate guarded signal structure 2604 shown in FIGS. 27A-27C. Moreover, the guard trace 2702, vias 2712, and plane 2714 of each wiring substrate guarded signal structure 2604 can electrically isolate (e.g., shield) the signal trace 2704 of the wiring substrate guarded signal structure 2604 from electrical interference (e.g., cross-talk or other forms of electromagnetic interference) arising from signals on the signal traces 2704 of other wiring substrate guarded signal structures 2604 or other electrical conductors in or around the probe card assembly 2600.

Similarly, the guard trace 2702, vias 2712, and plane 2714 of each wiring substrate guarded signal structure 2604 can also reduce or eliminate leakage current from flowing from the signal trace 2704 of the wiring substrate guarded signal structure 2604 to other electrical conductors in or around the probe card assembly 2600. Each wiring substrate guarded signal structure 2604 can thus be a non-limiting example of an electromagnetic shielding structure.

Figure 28B:
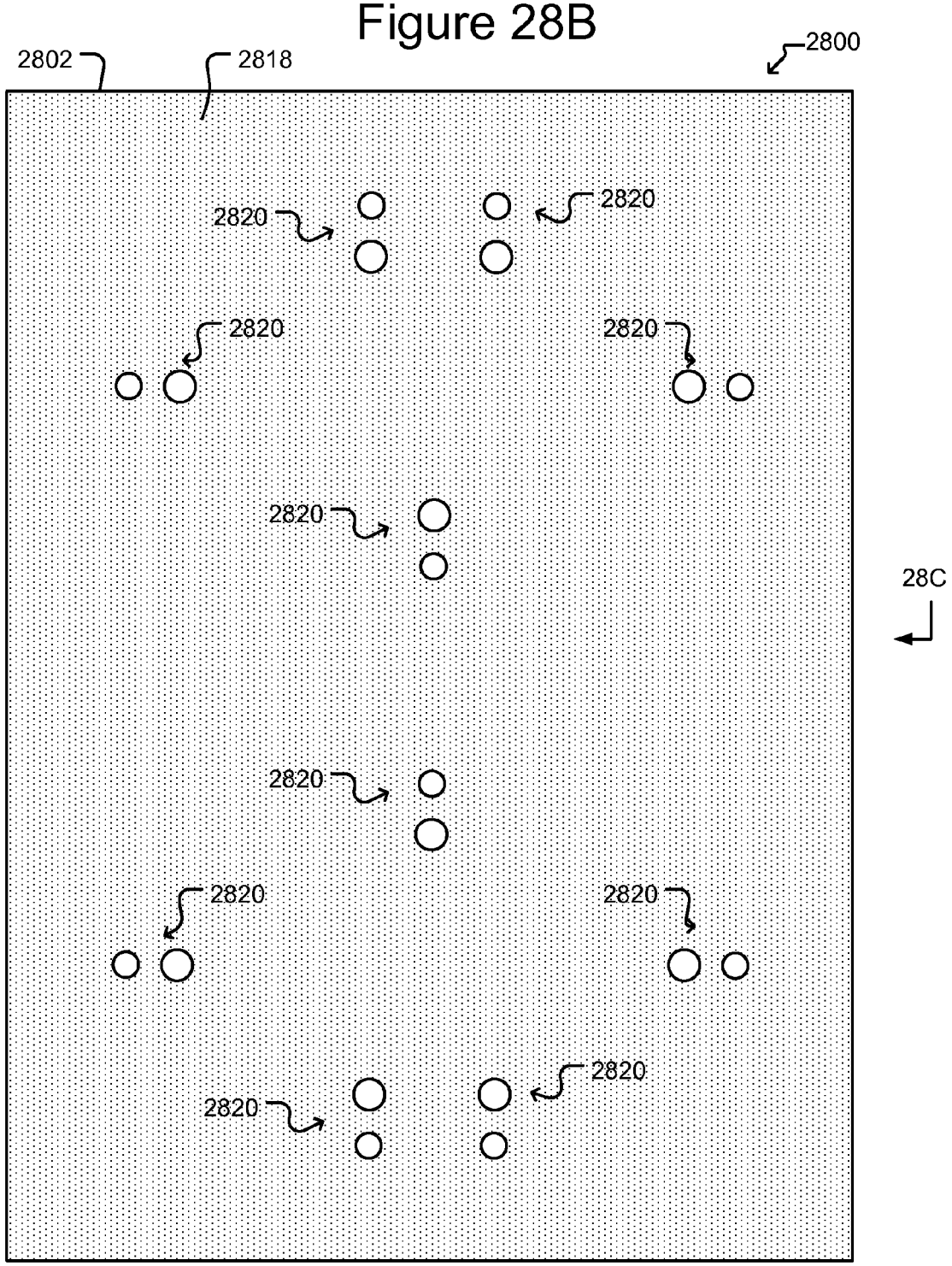
FIG. 28B illustrates a top view of the probe head of FIG. 28A.
Figure 28C:
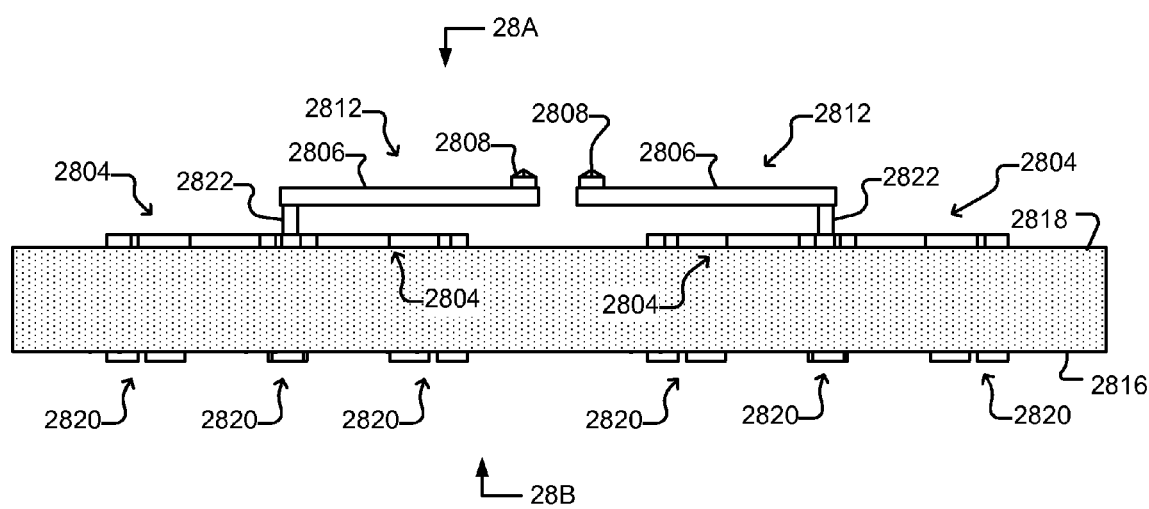
FIG. 28C illustrates a side view of the probe head of FIG. 28A.

FIGS. 28A-28C show bottom, top, and side views, respectively, of the probe head 2800, which as shown, can comprise a plurality of probe substrate guarded signal structures 2804 to which a plurality of electrically conductive probes 2812 (which can be non-limiting examples of microstructures) can be attached. The probes 2812 can be electromagnetically unguarded but, as shown, can be attached directly to a guarded signal trace 2906. As shown, the probe head 2800 can comprise a probe substrate 2802 (which can be a non-limiting example of a substrate or a first substrate) and the probe substrate guarded signal structures 2804 can be disposed on a surface 2816 (which can be a non-limiting example of a first surface) of the probe substrate 2802, although, as will be seen, at least part of the probe substrate guarded signal structures 2804 can be located within the probe substrate 2802. The probe substrate 2802 can comprise any substrate that is suitable for supporting probes 2812. As shown in FIG. 28B (which shows a top view of the probe head 2800), a plurality of terminal pairs 2820 (which can be a non-limiting example of a pair of terminals) can be located on another surface 2818 (which can be a non-limiting example of a second surface) of the probe substrate 2802. Although not shown in FIG. 28B, electrical connections can be provided through the probe substrate 2802 between the terminal pairs 2820 and the probe substrate guarded signal structures 2804.

Probes 2812 can be any of many different types of probes, including any of the probes discussed above with respect to probes 236 (see, e.g., FIGS. 3B and 3C). FIG. 28C (which shows a side view of the probe head 2800 of FIGS. 28A and 28B) illustrate one non-limiting exemplary type of probe according to some embodiments of the invention. As mentioned, however, probes 2812 can alternatively be any of the types of probes mentioned above with regard to probes 236.

As shown in FIG. 28C (and as can partially be seen in FIG. 28A), each probe 2812 can comprise a post 2822 (which can be a non-limiting example of an attachment portion), a beam 2806, and a contact tip 2808 (which can be a non-limiting example of a contact portion). As best seen in FIG. 28C, the post 2822 can be attached to and thus electrically connected to one of the probe substrate guarded signal structures 2804. The beam 2806 can be attached (e.g., at one end) to the post 2822, and the contact tip 2808 can be attached to the beam 2806 (e.g., at another end of the beam 2806).

Figure 29A:
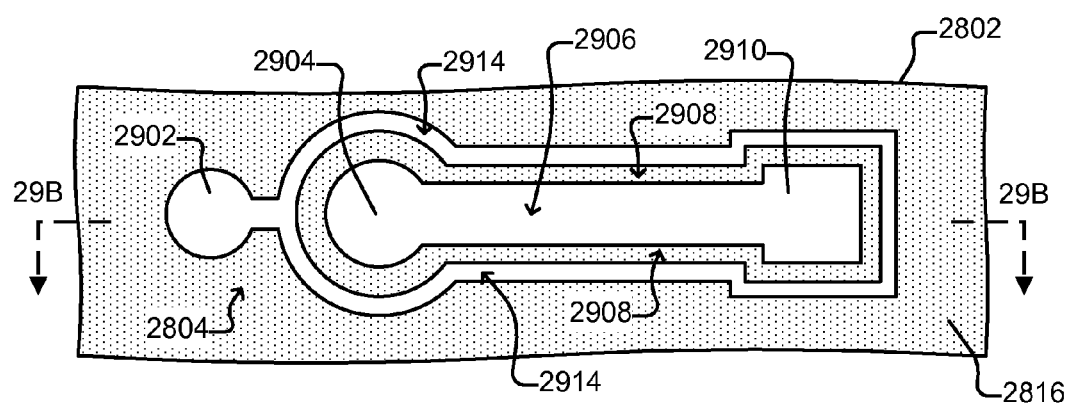
FIG. 29A illustrates a bottom view of a portion of the probe substrate of FIG. 28A showing one probe substrate guarded signal structure without a probe attached.

FIGS. 29A-30B illustrate partial views of the probe substrate 2802 illustrating an exemplary configuration of one of the probe substrate guarded signal structures 2804 and one terminal pair 2820 according to some embodiments of the invention. FIG. 29A shows a partial top view of the probe substrate 2802 without a probe 2812, and FIG. 30A shows the same partial top view of the probe substrate 2802 with a partial view of an attached probe 2812. FIG. 29A shows a side, cross-sectional view taken from FIG. 29A, and FIG. 30A shows a side, cross-sectional view taken from FIG. 30A.

Figure 29B:
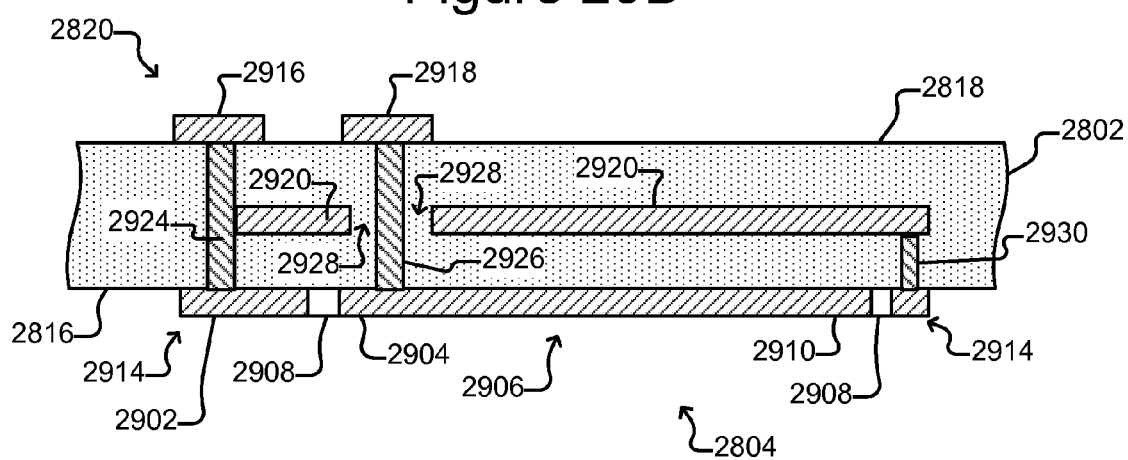
FIG. 29B illustrates a side, cross-sectional view taken from FIG. 29A.

As best seen in FIGS. 29A and 29B, a probe substrate guarded signal structure 2804 can include a signal trace 2906 (which can be a non-limiting example of a first signal trace), which can comprise an electrically conductive material (e.g., a metal, such as copper, silver, gold, etc.) deposited, formed, or otherwise disposed on a surface 2816 of the probe substrate

Figure 30A:
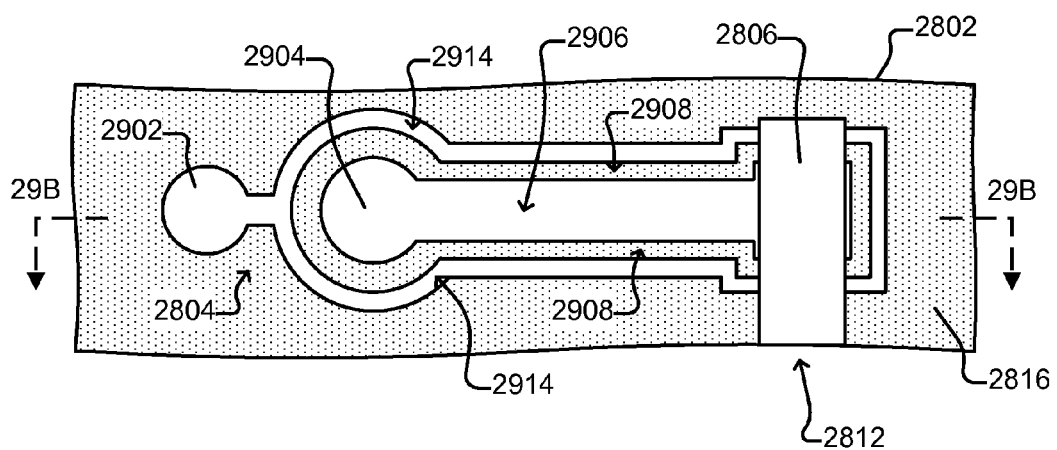
FIG. 30A illustrates a bottom view of a portion of the probe substrate of FIG. 28A showing one probe substrate guarded signal structure with a probe attached.
Figure 30B:
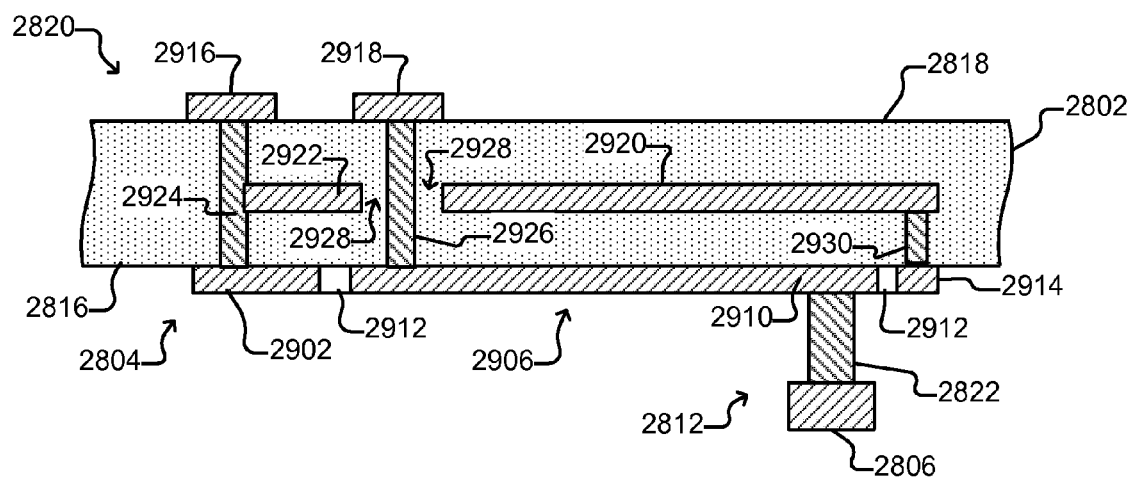
FIG. 30B illustrates a side, cross-sectional view taken from FIG. 30A.

2802. As shown, the signal trace 2906 can include one or more landings 2904, 2910. Although two landings 2904, 2910 are shown, more or fewer, including zero, can be included in other configurations. As shown in FIGS. 30A and 30B, a probe 2812 can be attached to the landing 2910. For example, the post 2822 of a probe 2812 can be attached to the landing 2910 and thus electrically connected to the signal trace 2906.

As shown in FIGS. 29A and 30A, the probe substrate guarded signal structure 2804 can also include a guard trace 2914, which as shown, can surround the signal trace 2906. For example, as best seen in FIG. 29A, the guard trace 2914 can have a closed loop shape, and the signal trace 2906 can be located within the closed loop shape of the guard trace 2914. As discussed below with respect to FIG. 28, however, the guard trace 2914 need not form a closed loop around the signal trace 2906. The guard trace 2914 can comprise the same or similar materials as the signal trace 2906, and the guard trace 2914 can be formed like the signal trace 2906.

As shown in FIGS. 29A-30B, the signal trace 2906 and the guard trace 2914 can be formed, deposited, or attached to a surface 2816 of the probe substrate 2802 such that a space 2908 can separate and electrically isolates the signal trace 2906 from the guard trace 2914. In FIGS. 29A-30B for purposes of contrast, clarity, and ease of illustration, the probe substrate 2802 is shaded. The space 2908, which can comprise ambient air, can electrically insulate the signal trace 2906 from the guard trace 2914. In some embodiments, the space 2908 can comprise a dielectric material.

As shown in FIGS. 29B and 30B, electrically conductive vias 2924, 2926 can electrically connect the signal trace 2906 and the guard trace 2914 to the terminals of a terminal pair 2820. In addition, one or more electrically conductive vias 2930 can electrically connect the plane 2920 to the guard trace 2914. One of the terminals 2916 (a guard terminal) in the terminal pair 2820 can be electrically connected by via 2924 (which can be a non-limiting example of a guard electrical connection) to the guard trace 2914, and the other of the terminals 2918 (a signal terminal) in the terminal pair 2820 can be electrically connected by via 2926 (which can be a non-limiting example of a signal electrical connection) to the signal trace 2906. The guard trace 2914 can include a via feature 2902 to facilitate an electrical connection between the via 2924 and the guard trace 2914. Landing 2904 of the signal trace 2906 can similarly facilitate an electrical connection between the via 2926 and the signal trace 2906. As also shown in FIG. 29B, the probe substrate guarded signal structure 2804 can include an electrically conductive plane 2920 (which can be like plane 2714) embedded within the probe substrate 2802 to which via 2924, and thus guard terminal 2916 and guard trace 2914, can be electrically connected. As shown, the plane 2920 can include a passage 2928 through which via 2926 can pass without electrically contacting the plane 2920. The guard terminals 2916 can thus be electrically connected to both the plane 2920 and the guard structure 2914, and the signal terminal 2918 can be electrically connected to the signal trace 2906 but electrically insulated from the guard terminal 2916, plane 2920, and guard trace 2914. The plane 2920 can be like plane 2714, and the substrate 2802 can, like wiring substrate 2602, comprise a plurality of electrically non-conductive layers.

Figure 31A:
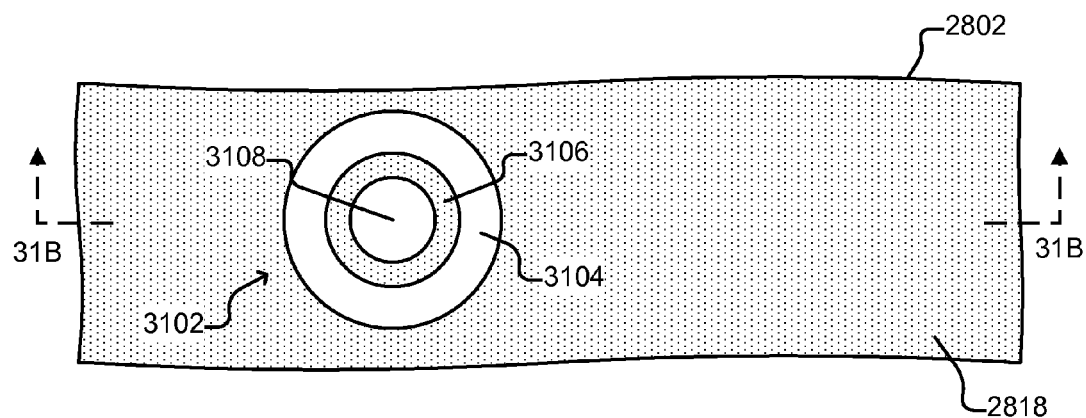
FIG. 31A shows an alternative configuration of terminals and embedded planes from the configuration shown in FIG. 30A.
Figure 31B:
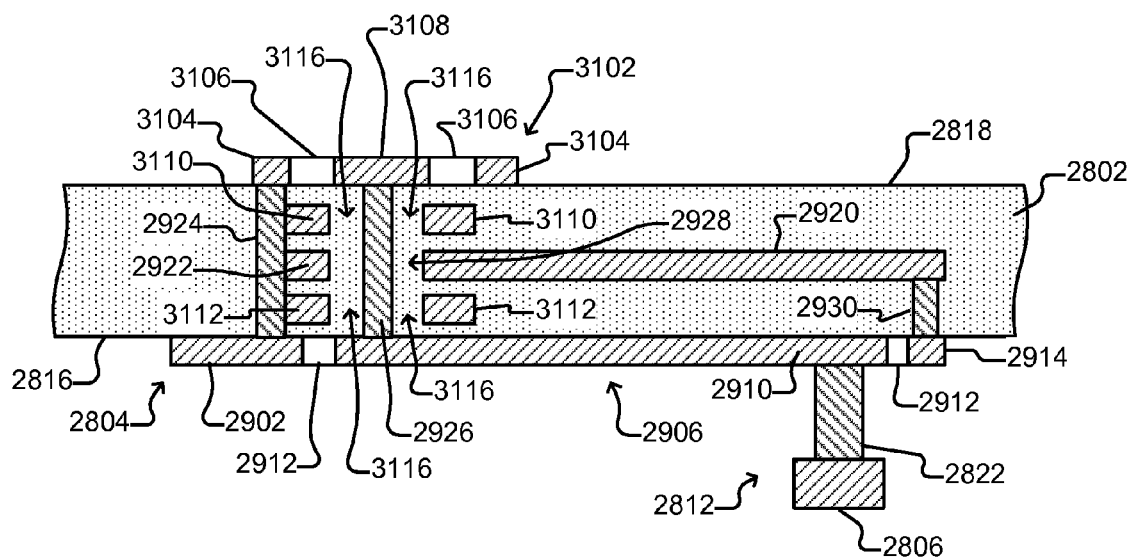
FIG. 31B shows a side, cross-sectional view taken from FIG. 31A.

FIGS. 31A and 31B illustrate an exemplary modification of the configuration shown in FIGS. 30A and 30B according to some embodiments of the invention. In the configuration shown in FIGS. 31A and 31B, the terminal pair 2820 shown in FIG. 30B can be replaced with a guard terminal 3104 that has a closed loop shape (e.g., the annular shape shown in FIG. 31A) and a signal terminal 3108 that is disposed inside the guard terminal 3104 as shown in FIG. 31A. In FIG. 31A, for purposes of contrast, clarity, and ease of illustration, the probe substrate 2802 is shaded. A space 3106 (which can comprise ambient air, a dielectric material, etc.) between the signal terminal 3108 and the guard terminal 3104 can electrically insulate the signal terminal 3108 from the guard terminal 3104. As shown in FIG. 31B, the configuration of FIGS. 31A and 31B can also include electrically conductive planes 3110 and 3112 (which can comprise material like and can be formed in the same or similar manner as plane 2920), which can be embedded within the substrate 2802 to form closed loops around the via 2926 that electrically connects the signal terminal 3108 to the signal trace 2906. For example, the planes 3110, 3112 can be in the form of annular rings similar to guard trace 3104 that surround the via 2926. The planes 3110, 3112 can, however, take shapes other than annular rings.

As shown, planes 3110, 3112 can be electrically connected to the via 2924 and thus to the guard terminal 3104 and the guard trace 2902. As also shown in FIG. 31B, passages 3116 in each of planes 3110, 3112 can be provided through the planes 3110, 3112 to allow the via 2926 to pass through planes 3110, 3112 without electrically contacting the planes 3110, 3112. Passages 3116 through planes 3110, 3112 can be similar to passage 2928 through plane 2920. Although two planes 3110, 3112 are shown in FIG. 31B, more or fewer of such planes can be included.

The guard terminal 3104 can protect the signal terminal 3108 from electromagnetic interference (e.g., cross-talk or other forms of electromagnetic interference) from, for example, other signal terminals (not shown in FIGS. 31A and 31B but like 3108) on the surface 2818 of the substrate 2802. Planes 3110, 2920, 3112 can likewise protect via 2926 from electromagnetic interference (e.g., cross-talk or other forms of electromagnetic interference) from, for example, other such vias (not shown) electrically connecting other signal terminals (not shown) on surface 2818 with other signal traces (not shown) like signal trace 2906. The foregoing can also reduce or eliminate leakage current from flowing from the signal terminal 3108 to other electrical conductors in or around the probe card assembly 2600.

Referring again to FIGS. 28A-28C, each of the probe substrate guarded signal structures 2804 on the probe substrate 2802 can be like the exemplary probe substrate guarded signal structure 2804 shown in FIGS. 29A-30B. In addition, each terminal pair 2820 on the probe substrate 2802 (see FIG. 28B) can be like the terminal pair 2820 shown in FIGS. 29B and 30B and can be connected to a probe substrate guarded signal structure 2804 on the probe substrate 2802 as shown in FIGS. 29B and 30B. Alternatively, each terminal pair 2820 on the probe substrate 2802 (see FIG. 28B) can be configured as shown in FIG. 31A and can comprise a guard terminal 3104 disposed about a signal terminal 3108, which can be connected to a probe substrate guarded signal structure 2804 on the probe substrate 2802 as shown in FIG. 31B.

The guard trace 2914, vias 2924, 2930, and plane 2920 of each probe substrate guarded signal structure 2804 can electrically isolate (e.g., shield) the signal trace 2906 of the probe substrate guarded signal structure 2804 from electrical interference (e.g., cross-talk or other forms of electromagnetic interference) arising from signals on the signal traces 2906 of other probe substrate guarded signal structures 2804 or other electrical conductors in or around the probe card assembly 2600. The guard trace 2914, vias 2924, 2930, and plane 2920 of each probe substrate guarded signal structure 2804 can also reduce or eliminate leakage current from flowing from the signal trace 2906 to other electrical conductors in or around the probe card assembly 2600. Each probe substrate guarded signal structure 2804 can thus be a non-limiting example of an electromagnetic shielding structure.

As mentioned above, the probe head 2800 can replace the probe insert 238 in the probe card assembly 200 shown in FIGS. 3A-3C. The electrically conductive pins 220 shown in FIGS. 3A-3C can connect electrically to the terminal pairs 2820 (see FIG. 28B), and each terminal in the terminals pairs 2820 can thus be like the pads 602 of the probe insert 238 (see FIG. 5). For example, each pin 220 can connect electrically to one of the guard terminal 2916 or the signal terminal 2918 (see FIG. 29B) in each terminal pair 2820 (see FIG. 28B). As discussed above, each terminal pair 2820 can alternatively be configured as shown in FIG. 31A, and each terminal pair 2820 shown in FIG. 28B can thus alternatively comprise a guard terminal 3104 disposed about a signal terminal 3108 as shown in FIG. 31A. Each pin 220 (see FIG. 5) can thus alternatively connect electrically to one of the guard terminals 3104 or one of the signal terminals 3108.

Figure 32:
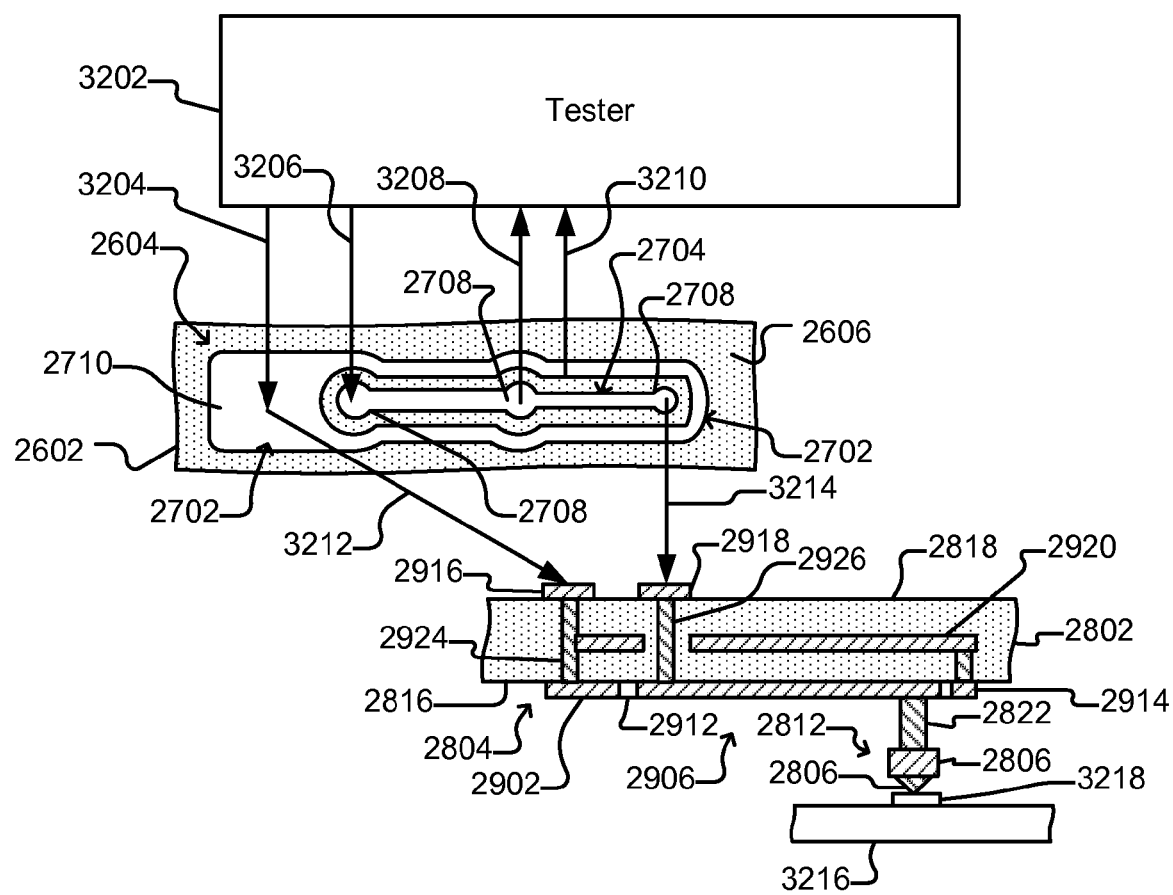
FIG. 32 illustrates a simplified schematic and block diagram of connections of to a tester and between a wiring substrate guarded signal structure and a probe substrate guarded signal structure according to some embodiments of the invention.

FIG. 32 illustrates an exemplary manner in which the wiring substrate guarded signal structures 2604 (which can be non-limiting examples of an electrical interface or channel connections) on the wiring substrate 2602 and the probe substrate guarded signal structures 2804 on the probe substrate 2802 can be electrically connected one to another and to a tester 3202 and a DUT 3216 to test one or more DUTs 3216. For ease of discussion and illustration, FIG. 32 includes a top partial view of the wiring substrate 2602 showing one wiring substrate guarded signal structure 2604 (generally similar to the view shown in FIG. 27A) and a side cross-sectional partial view of the probe substrate 2802 showing one probe substrate guarded signal structure 2804 (generally similar to the view shown in FIG. 30B). Additional ones, including some or all, of the wiring substrate guarded signal structures 2604 (see, e.g., FIG. 26) can be connected as shown in FIG. 32. Likewise, additional ones, including some or all, of the probe substrate guarded signal structures 2804 (see FIGS. 28A-28C) can also be connected as shown in FIG. 32.

As shown in FIG. 32, a wiring substrate guarded signal structure 2604 can be electrically connected to a tester 3202, which can be configured to control testing of one or more DUTs 3216 (a partial view of one DUT 3216 with one terminal 3218 is shown in FIG. 32 but many such DUTs can be tested, and each DUT 3216 can have a plurality of terminals 3218, which can be input terminals, output terminals, and/or input/output terminals). For example, the tester 3202, which can comprise one or more computers, can control functional testing of the DUT 3216 by generating test (and can thus be a source of test signals) to be input into DUT 3216. Tester 3202 can receive response signals output by the DUT 3216 in response to the test signals, and tester 3202 can evaluate the response signals to determine whether the DUT 3216 passes the testing and/or to rate the DUT 3216. The tester 3202 can also control other types of testing of DUT 3216. For example, the tester 3202 can control parametric testing of DUT 3216 in which, for example, various operating parameters of the DUT 3216 are determined. For example, the tester 3202 can determine leakage current drawn by an input terminal (e.g., like terminal 3218) of DUT 3216.

In the example shown in FIG. 32, four connections 3204, 3206, 3208, 3210 are shown between the tester 3202 and the wiring substrate guarded signal structure 2604. For example, connection 3204 (which can be a non-limiting example of a guard electrical connection) can electrically connect an output from the tester 3202 to the guard trace 2702 of the wiring substrate guarded signal structure 2604, and connection 3206 (which can be a non-limiting example of a signal electrical connection) can electrically connect another output from the tester 3202 to the signal trace 2704 of the wiring substrate guarded signal structure 2604. Connection 3206 can be configured to carry test signals output by the tester 3202, and connection 3204 can be configured to carry a guard signal also output by the tester. The guard signal driven onto connection 3204 can have the same voltage and/or current level as the test signal driven onto the connection 3206. As is known, providing a guard signal on a guard trace (e.g., guard trace 2702 or guard trace 2914) that has the same or similar voltage or current as a signal on a corresponding signal trace (e.g., signal trace 2704 or signal trace 2906) can prevent or reduce electrical interaction between the signal trace and the corresponding guard trace. For example, cross-talk and leakage current between the guard trace and the signal trace can be reduced or eliminated. As another example, capacitive coupling between the signal trace and the guard trace can be reduced or eliminated.

As shown in FIG. 32, connection 3212 can electrically connect the guard trace 2702 of the wiring substrate guarded signal structure 2604 with guard terminal 2916 on the probe substrate 2802, which as discussed above, can be electrically connected by via 2924 to the guard trace 2902 of the probe substrate guarded signal structure 2904. As shown in FIG. 32, connection 3214 can electrically connect the signal trace 2704 of the wiring substrate guarded signal structure 2604 with signal terminal 2918 on the probe substrate 2802, which as discussed above, can be electrically connected by via 2926 to the signal trace 2906 of the probe substrate guarded signal structure 2804.

As shown in FIG. 32 and discussed above, a probe 2812 can be attached and thus electrically connected to the signal trace 2906 of the probe substrate guarded signal structure 2804. As discussed above, the probe 2812 can be electromagnetically unguarded but can, as shown, be attached directly to, and thus electrically connected directly to, a guarded signal trace 2906. As also shown in FIG. 32, the probe 2812 can contact and thereby make an electrical connection with a terminal 3218 of a DUT 3216. Test signals driven by the tester 3202 onto connection 3206 can thus be provided through the signal trace 2704 of the wiring substrate guarded signal structure 2604, the connection 3214, the signal terminal 2918, the via 2926, the signal trace 2906 of the probe substrate guarded signal structure 2804, and the probe 2812 to a terminal 3218 of a DUT 3216. Moreover, the tester 3202 can drive guard signals onto the connection 3204 to the guard trace 2702 of the wiring substrate guarded signal structure 2604, which can be provided to the guard trace 2902 of the probe substrate guarded signal structure 2804 by connection 3212, terminal 2916, and via 2924. The guard signals driven onto connection 3204 can have the same voltage and/or current as the test signals driven onto the connection 3206. Alternatively, the guard signals driven onto connection 3204 can have a different voltage and/or current than the test signals driven onto the connection 3206. The voltage and/or current of the guard signals driven onto connection 3204 as compared to the test signals driven onto connection 3206 can be selected to optimize a desired characteristic of the test system shown in FIG. 32. For example, the voltage and/or current of the guard signals driven onto connection 3204 as compared to the test signals driven onto connection 3206 can be selected to reduce or eliminate leakage current from flowing from conductors carrying the test signals to other conductors located near the conductors carrying the test signals.

As also shown in FIG. 32, connection 3208 can electrically connect the signal trace 2704 of the wiring substrate guarded signal structure 2604 to an input of the tester 3202, and connection 3210 can electrically connect the guard trace 2702 of the wiring substrate guarded signal structure 2604 to another input of the tester 3202.

The connections 3204, 3206, 3208, 3210 can comprise communications channels. For example, the connections 3204, 3206, 3208, 3210 can each comprise a communications channel like the communications channels formed by cable 110, circuitry in the test head 104, and test head connectors 114 in FIG. 1A. As another example, connections 3204 and 3206 can comprise a shielded electrical connection in which connection 3206 is a signal path (e.g., a conductive wire) and connection 3204 is an electrically conductive shield surrounding the connection 3206. For example, a coaxial cable (e.g., like shielded wire 1800 of FIG. 25) can comprise the connections 3206, 3204, and the connection 3206 can be the inner signal conductor (e.g., like signal line 1806 of FIG. 25) and connection 3204 can be the outer shielding conductor (e.g., like electrical conductor 1802 of FIG. 25) that surrounds connection 3206 and protects connection 3206 from electromagnetic interference. Connections 3208, 3210 can similarly be implemented as a coaxial cable in which connection 3208 can be the inner signal conductor (e.g., like signal line 1806 of FIG. 25) and connection 3210 can be the outer shielding conductor (e.g., like electrical conductor 1802 of FIG. 25) that surrounds connection 3208 and protects connection 3208 from electromagnetic interference. Connections 3204, 3206, 3208, 3210 can take other forms, including wires, etc.

Each of connections 3204, 3206, 3208, 3210 can also comprise a composite of multiple types of electrical conductors and/or connection devices. For example, one or more of connections 3204, 3206, 3208, 3210 can include connectors, such as channel connectors 208, electrical plugs, spring loaded pogo pin connectors, etc. In some embodiments, ends of connection 3204 and connection 3210 can be soldered or otherwise attached to the guard trace 2702, and ends of connection 3206 and connection 3208 can likewise be soldered or otherwise attached to the signal trace 2704. Alternatively, wiring substrate guarded signal structure 2604 can comprise one or more electrical connectors (e.g., zero-insertion-force connection connectors) configured to connect to connections 3204, 3206, 3208, 3210.

Communications connections 3212, 3214 can comprise wires 398 and conductive pins 220 shown in FIGS. 3A-3C. In some configurations, connection 3212 can comprise a wire 398 connected to a pin 220, and connection 3212 can comprise a different wire 398 connected to a different pin 220. In other configurations, each of at least some of the wires 398 and some of the pins 220 can comprise a shielded electrical connection in which connection 3214 is a signal path (e.g., a conductive wire) through a wire 398 and a pin 220 and connection 3212 is an electrically conductive shield surrounding the connection 3214. For example, each of at least some of the wires 398 can comprise a coaxial cable (e.g., like shielded wire 1800 of FIG. 25), and each of at least some of pins 220 can comprise a similar shielded construction. Connection 3214 can comprise the inner signal line (e.g., like line 1806 of FIG. 25) in a wire 398 and the inner signal line (e.g., like line 1806) in a pin 220 to which the wire 398 is connected, and the connection 3212 can comprise a shielding conductor (e.g., like electrical conductor 1802 of FIG. 25) that surrounds the inner signal line in the wire 398, and the connection 3212 can further comprise a shielding conductor (e.g., like electrical conductor 1802 of FIG. 25) that surrounds the inner signal line in the pin 220. As yet another alternative, connections 3212, 3214 can comprise a single coaxial cable between the wiring substrate guarded signal structure 2604 and the probe substrate guarded signal structure 2804. In fact, connections 3212, 3214 can be like connections 3204, 3206, 3208, 3210 and take any of the forms discussed above with respect to connections 3204, 3206, 3208, 3210. In addition, connections 3212, 3214 can be connected to the wiring substrate guarded signal structure 2604 and to the probe substrate guarded signal structure 2804 in any of the ways discussed above for attaching connections 3204, 3206, 3208, 3210 to the wiring substrate guarded signal structure 2604.

Configured as shown in FIG. 32, signal elements comprising connection 3206, signal trace 2704, connection 3214, signal terminal 2914, via 2926, and signal trace 2906 can form a signal path between the tester 3202 and a probe 2812 in contact with a terminal 3218 of a DUT 3216. Guard elements comprising connection 3204, guard trace 2702, connection 3212, guard terminal 2916, via 2924, plane 2920, and guard trace 2902 can provide a guard structure that protects the signal path from electromagnetic interference. For example, the guard structure can protect the signal path from electromagnetic interaction with signals on other signal paths. Moreover, by driving a guard signal onto the guard structure that has the same or approximately the same voltage or current as the signal on the signal path, electromagnetic interaction (e.g., cross talk, leakage current, capacitive coupling, etc.) between the signal path and the guard structure can be reduce or eliminated.

Configured as shown in FIG. 32, the tester 3202 can, among other things, determine leakage current into terminal 3218 of DUT 3216. As is generally known in the field, the tester 3202 can force a voltage or a current through connection 3206 and can sense the other of voltage or current through connection 3208 and thereby approximate leakage current into terminal 3218. As mentioned above, many or all of the wiring substrate guarded signal structures 2604 on the wiring substrate 2602 (see FIG. 26) and many or all of the probe substrate guarded signal structures 2804 (see FIG. 28A) on the probe substrate 2802 can be connected one to another and to the tester 3202 and a terminal (e.g., like terminal 3218) of DUT 3216 or another DUT (like DUT 3216) to measure, for example, leakage current into such terminals. Each wiring substrate guarded signal structure 2604 can protect its signal trace 2704 (and thus signals on the signal trace 2704) from electromagnetic interference from other signal traces 2704 and/or other sources of electromagnetic radiation. Similarly, each probe substrate guarded signal structure 2804 can protect its signal trace 2906 (and thus signals on the signal trace 2906) from electromagnetic interference from other signal traces 2906 and/or other sources of electromagnetic radiation. Thus, cross-talk and leakage current and other forms of electromagnetic interference between ones of signal traces 2704 and ones of signal traces 2906 can be significantly reduced or eliminated to negligible levels, which can significantly increase the sensitivity of the system shown in FIG. 32 to leakage current into terminal 3218 of DUT 3216. As discussed above, the tester 3202 can drive guard signals onto connection 3204 that have the same or approximately the same voltage or current level as test signals driven onto connection 3206.

The greater the extent to which signal paths from the tester 3202 to the probe 2812 can be shielded to prevent or reduce cross talk and leakage current between signal lines, the smaller the leakage current into terminal 3218 of DUT 3216 that the system shown in FIG. 32 can detect. Configuring one or more of the connections 3204, 3206 as shielded conductors (e.g., as coaxial cables), the connections 3208, 3210 as shielded conductors (e.g., as coaxial cables), and the connections 3212, 3214 as shielded conductors (e.g., as coaxial cables) as discussed above can create a system that can detect leakage current into the terminal 3218 of DUT 3216 in the fempto amp range. Using the substrate 2802 configured as shown in FIGS. 31A and 31B in place of the configuration of substrate 2802 shown in FIG. 32 can further increase the sensitivity of the system shown in FIG. 32 to leakage current into terminal 3218.

The configuration shown in FIG. 32 is exemplary only, and many other configurations are possible. For example, a coaxial cable or other electrical connection device (whether shielded or unshielded) can provide electrical connections directly from the tester 3202 to the terminals 2916, 2918 on probe substrate 2802. As another example, such a coaxial cable or other electrical connection device (whether shielded or unshielded) can provide electrical connections directly from the tester 3202 to the signal trace 2906 and the guard trace 2914 of a probe substrate guarded signal structure 2804.

Figure 33:
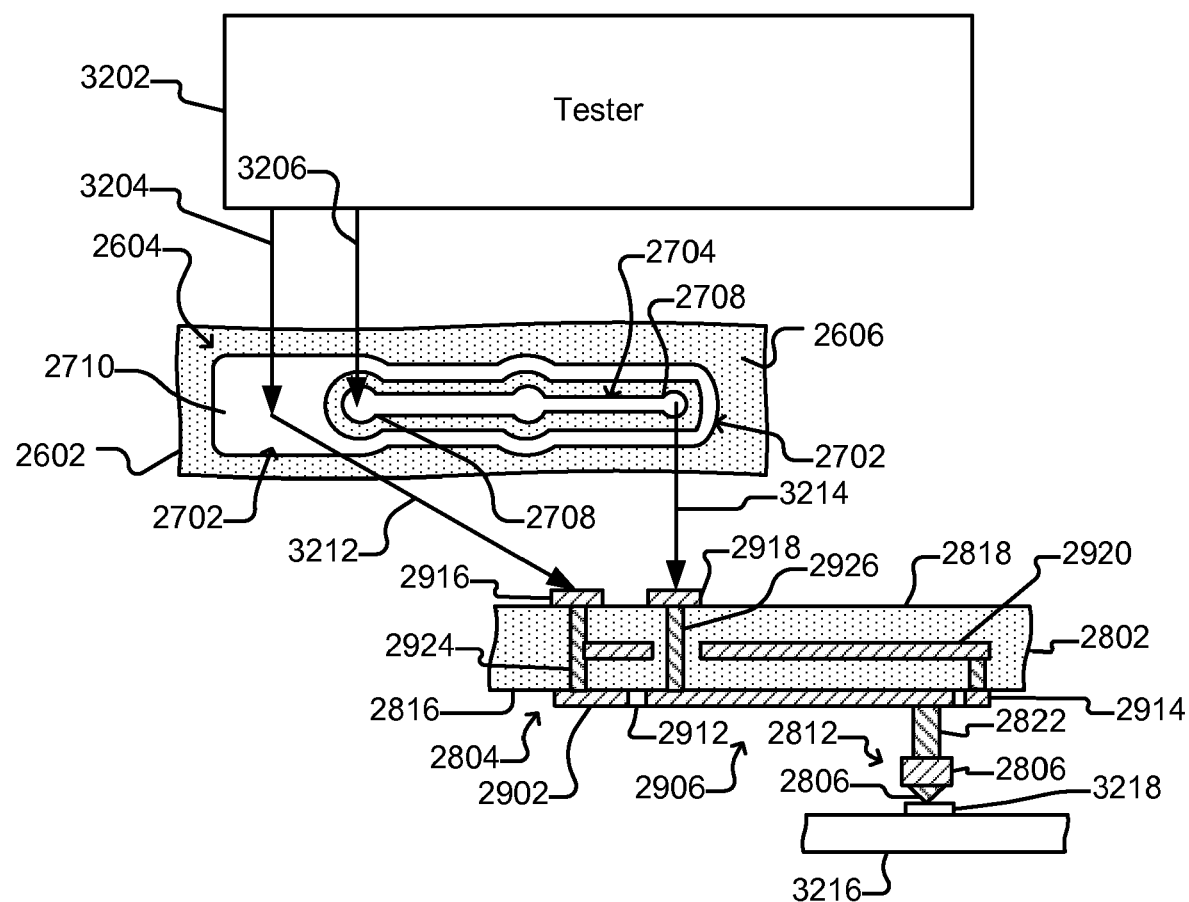
FIG. 33 illustrates a simplified schematic and block diagram of alternative connections of to a tester and between a wiring substrate guarded signal structure and a probe substrate guarded signal structure according to some embodiments of the invention.

FIG. 33 illustrates yet another exemplary modification of the configuration of FIG. 32 according to some embodiments of the invention. As shown, the configuration of FIG. 33 can be generally similar to the configuration of FIG. 32 except that the configuration of FIG. 33 lacks connections 3208, 3210 to inputs to tester 3202. The system of FIG. 33 can be configured to provide test signals through connection 3206, signal trace 2704, connection 3214, signal terminal 2918, via 2926, signal trace 2906, and probe 2812 to a terminal 3218 of DUT 3216. As discussed above with respect to FIG. 32, others of the wiring substrate guarded signal structures 2604 (see FIG. 26) can be connected as shown in FIG. 33, and others of the probe substrate guarded signal structures 2804 can also be connected as shown in FIG. 33 so that the tester 3202 is configured to drive multiple test signals through multiple wiring substrate guarded signal structures 2604 and probe substrate guarded signal structures 2804 to multiple terminals 3218 of one or more DUTs 3216. Others of the wiring substrate guarded signal structures 2604 (see FIG. 26) and probe substrate guarded signal structures 2804 can also be connected as shown in FIG. 33 except that their connections to the tester (e.g., like connections 3204, 3206) can be to inputs to the tester 3202. The probes 2812 attached to such probe substrate guarded signal structures 2804 can contact output terminals (e.g., like terminal 3218) of one or more DUTs 3216, and in this way, response signals generated by the DUT or DUTs 3216 in response to the test signals can be returned to the tester 3202.

The electromagnetic shielding provided by the wiring substrate guarded signal structures 2604, the probe substrate guarded signal structures 2804, and other electromagnetic shielding structures (e.g., connections 3204, 3206 and/or connections 3212, 3214 configured as coaxial cables as discussed above) can, for example, increase the frequency at which test signals can be provided to the DUT or DUTs 3216 and can thus increase the signal switching frequency at which the DUT or DUTs 3216 can be tested. As discussed above, a guard signal that has generally the same or similar voltage or current level as a test signal on the signal conductive elements (e.g., connection 3206, signal trace 2704, connection 3214, signal trace 2906, and probe 2812) can be provided on the guard conductive elements (e.g., connection 3204, guard trace 2702, connection 3212, guard trace 2902). As discussed above, such a guard signal can prevent or significantly reduce at least some forms of electromagnetic interference (including electromagnetic interference) between test signals and or response signals.

Figure 34:
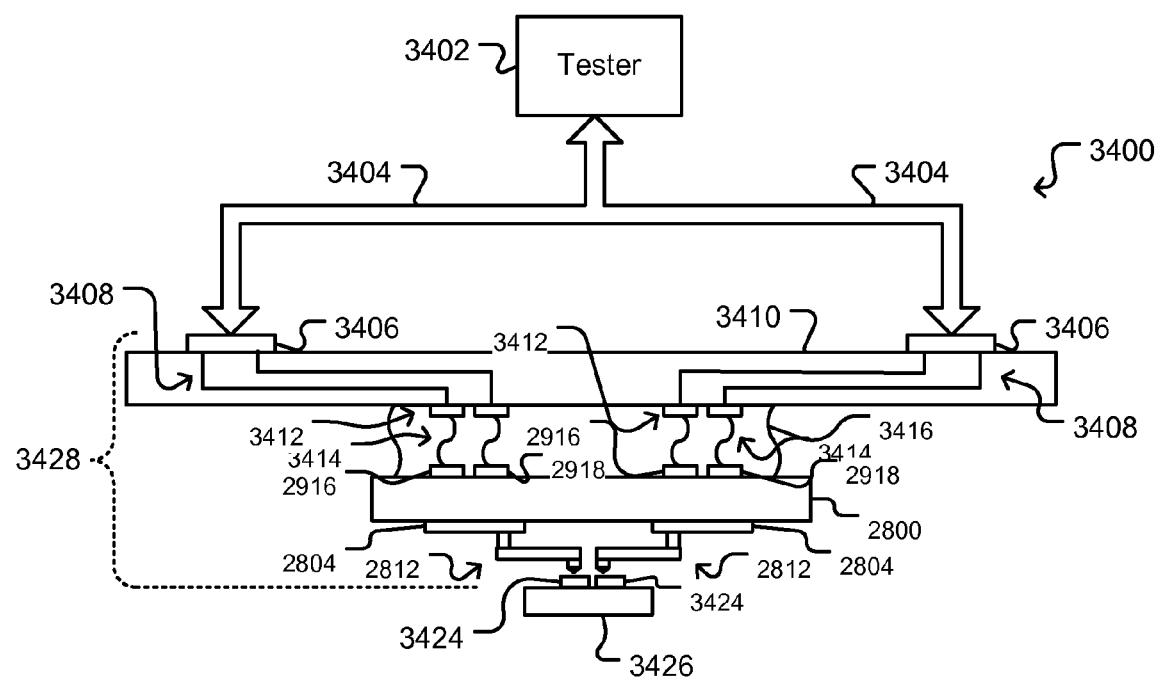
FIG. 34 illustrates an exemplary test system according to some embodiments of the invention.

The probe card assembly 2600 shown in FIGS. 26-31B is exemplary only and many modifications and alternatives are possible. For example, FIG. 34 illustrates an exemplary probe card assembly 3428 in which the probe head 2800 illustrated in FIGS. 28A-30A or the exemplary alternative configuration shown in FIGS. 31A and 31B can be used. In FIG. 34, the probe card assembly 3428 is shown with a test system 3400 that can be used to test a DUT 3426 (which can be like DUT 3216). Test system 3400, including probe card assembly 3428, is shown in simplified schematic and block diagram form in FIG. 34.

As shown in FIG. 34, the test system 3400 can comprise a tester 3402 (which can be like tester 3202 of FIG. 32), a probe card assembly 3428, and a plurality of communications channels 3404 between the tester 3402 and the probe card assembly 3428. As also shown in FIG. 34, the test system 3400 can be used to test one or more DUTs 3426, which can be like DUT 112 of FIG. 1A or DUT 3216 of FIGS. 32 and 33.

As shown in FIG. 34, the probe card assembly 3428 can comprise a wiring substrate 3410, an electrical connector 3416, and the probe head 2800, which can be held together by brackets (not shown), clamps, screws, bolts, and/or other suitable means. The wiring substrate 3410 can include electrical connectors 3406 (which can be a non-limiting example of an electrical interface or channel connections) configured to make electrical connections with communications channels 3404 to and from the tester 3402. Connectors 3404 can be pads for receiving pogo pins, zero-insertion-force connectors, or any other electrical connection device suitable for making electrical connections with communications channels 3404. Electrically conductive paths 3408 (e.g., electrically conductive traces and/or vias)) can be provided through the wiring substrate 3410 to provide electrical connections from individual electrical connections in connectors 3406 (each such individual electrical connection can correspond to one of the plurality of communication channels 3404) to electrically conductive pads 3412 (which can be a non-limiting examples of wiring substrate terminals) on an opposite surface (e.g., a second opposite surface) of the wiring substrate 3410. Electrical connections 3414 (which can be non-limiting examples of flexible electrical connections) that are part of the electrical connector 3416 can provide electrical connections between pads 3412 and the guard terminals 2916 (or guard terminals 3104), and others of the electrical connections 3414 can provide electrical connections between pads 3412 and the signal terminals 2918 (or signal terminals 3108) on the probe substrate 2802 of probe head 2800 as shown in FIG. 34.

The electrical connections 3414 of the electrical connector 3416 can be compliant and can comprise, for example, spring elements. In some embodiments, the electrical connector 3416 can comprise an interposer substrate with electrically conductive spring contact structures extending from opposing surfaces of the interposer (not shown). In such an embodiment, the spring contacts and electrical connections through the interposer substrate between spring contacts on one surface and spring contacts on another surface of the interposer substrate can compose electrical connections 3414.

Tester 3402 can provide test signals and associated guard signals through channels 3404 to the channel connectors 3406. The test signals and associated guard signals can be provided from the channel connectors 3406 through connections 3408, pads 3414, and connections 3414 to guard terminals 2916 and signal terminals 2918 on probe head 2800 as generally discussed above. The guard signals and test signals can be provided through the probe head 2800 to probe substrate guarded signal structures 2804 as discussed above.

Response signals generated by the DUT 3426 in response to the test signals can likewise be sensed by a probe 2812 in contact with an output terminals of the DUT 3426 and provided through the probe card assembly 3428 and channels 3404 to the tester 3202. A guard signal can be provided for each such signal. For example, a guard signal can be provided by tapping the response signal and thus utilizing the response signal as a guard signal.

Although not shown in FIG. 34, guarded signal structures, like wiring guarded signal structures 2604 shown in FIGS. 26-27C, can be included on the wiring substrate 3410 and can, for example, replace all or part of the connections 3408.

The configuration of probe card assembly 3428 shown in FIG. 34 is exemplary only and is simplified for ease of illustration and discussion. Many variations, modifications, and additions are possible. For example, although the probe card assembly 3428 is illustrated in FIG. 34 as having two substrates—the wiring substrate 3410 and the probe head 2800—the probe card assembly 3428 can have more or fewer than two substrates. Other modifications are also possible. For example, probe head 2800 can be attached and electrically connected directly to the wiring substrate 3410 (without the need for connector 3416.) As another exemplary modification of the probe card assembly 3428, the probe card assembly 3428 can have more than one probe head 2800, and each such probe head 2800 can be moveable independent of the other probe head 2800 or probe heads 2800. Non-limiting examples of probe card assemblies with multiple probe heads are disclosed in U.S. patent application Ser. No. 11/165,833, filed Jun. 24, 2005. Additional non-limiting examples of probe card assemblies are illustrated in U.S. Pat. No. 5,974,626 and U.S. Pat. No. 6,509,751 and the aforementioned U.S. patent application Ser. No. 11/165,833, filed Jun. 24, 2005, and various features of the probe card assemblies described in those patents and application can be implemented in the probe card assembly 3428 show in FIG. 34.

DUT 3426 can be tested as follows. The tester 3402 can generate test signals, which can be provided through the communications channels 3404 and probe card assembly 3428 and probes 2812 to input terminals (e.g., like terminals 3424) of one or more DUTs 3426. As discussed above, the ester 3202 can also produce guard signals that are the same as or similar to the test signals, and the guard signals can be provided to the probe card assembly 3428 through communications channels 3404. Response signals generated by the DUT(s) 3426 can be sensed by probes 2612 in contact with output terminals (e.g., like terminals 3424) of the DUT(s) 3426 and provided through the probe card assembly 3428 and communications channels 3404 to the tester 3402. As also discussed above, guard signals can be provided (e.g., by tapping the response signals). The tester 3402 can analyze the response signals to determine whether the DUT(s) 3426 responded properly to the test signals and, consequently, whether the DUT(s) 3426 pass or fail the testing. As discussed above, the probe substrate guarded signal structures 2804 can reduce electromagnetic interference (e.g., cross-talk, leakage current, etc.) between test signals and/or response signals. Consequently, the probe substrate guarded signal structures 2804 on the probe head 2800 can facilitate high frequency testing of the DUT(s) 3426.

Figure 35:
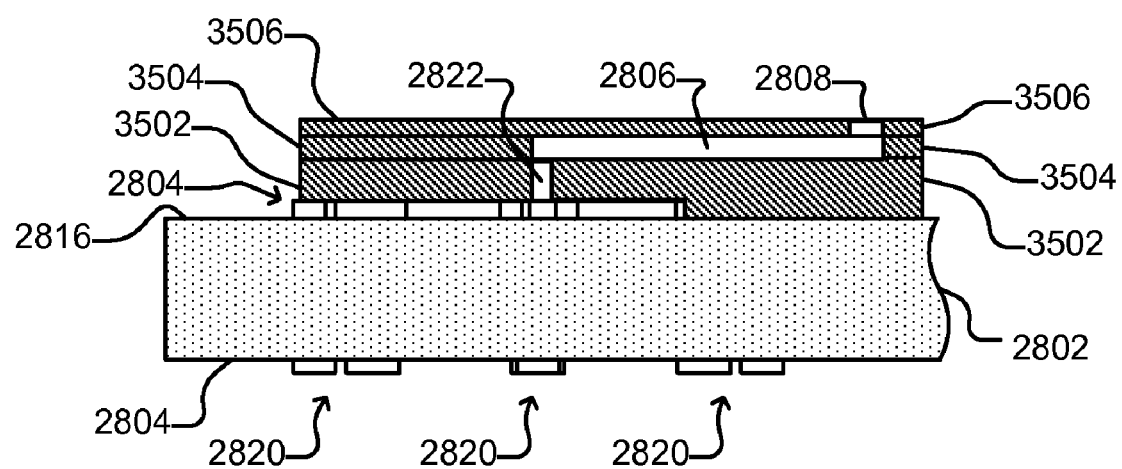
FIGS. 35-37 illustrate alternative exemplary methods of providing a probe attached to a probe substrate guarded signal structure.

FIG. 35 illustrates an exemplary method of making a probe 2812 on a probe substrate guarded signal structure 2804. The probe substrate 2802 is shown in partial, side view in FIG. 35. As shown, the post 2822, beam 2806, and contact tip 2808 of the probe 2812 can be formed in a plurality of layers 3502, 3504, 3506 of a patternable material deposited onto the probe substrate 2802. For example, the patternable material can comprise a photoresist material. Layer 3502 (e.g., of photoresist material) can be deposited onto the substrate 2802 and a signal trace 2906 of a probe substrate guarded signal structure 2804 and pattern to have an opening in a desired location, size, and shape corresponding to post 2822. Material forming the post 2822 can then be deposited into the opening (not shown) in layer 3502. For example, the opening in the first layer 3502 can expose a portion of the landing 2910 of the signal trace 2906 of the probe substrate guarded signal structure 2804 (see FIG. 29A), and the material forming the post 2822 can be deposited into the opening (not shown) onto the exposed portion of the landing 2910. For example, the material can be deposited onto the exposed portion of the landing 2910 by electroplating, chemical vapor deposition, physical vapor deposition, sputter deposition, electroless plating, electron beam deposition, evaporation (e.g., thermal evaporation), flame spring coating, plasma spray coating, etc.

The beam 2806 can similarly be formed in an opening in a second layer 3504 of patternable material, and the tip 2808 can likewise be formed in an opening in a third layer 3506 of patternable material. If the material that forms the beam 2806 is to be deposited by electroplating, a thin layer of conductive material can first be deposited into the opening in the second layer 3504, which can act as a seed layer onto which the material that forms the beam 2806 can be electroplating. A thin seed layer of a conductive material can similarly be used to facilitate electroplating the material that forms the contact tip 3506. Once the post 2822, beam 2806, and tip 2808 are formed, the layers 3502, 3504, 3506 can be removed. The material or materials that form the post 2822, beam 2806, and tip 2808 can be any of many possible materials, including without limitation palladium, gold, rhodium, nickel, cobalt, silver, platinum, conductive nitrides, conductive carbides, tungsten, titanium, molybdenum, rhenium, indium, osmium, rhodium, copper, refractory metals, and their alloys including combinations of the foregoing.

Figure 36:
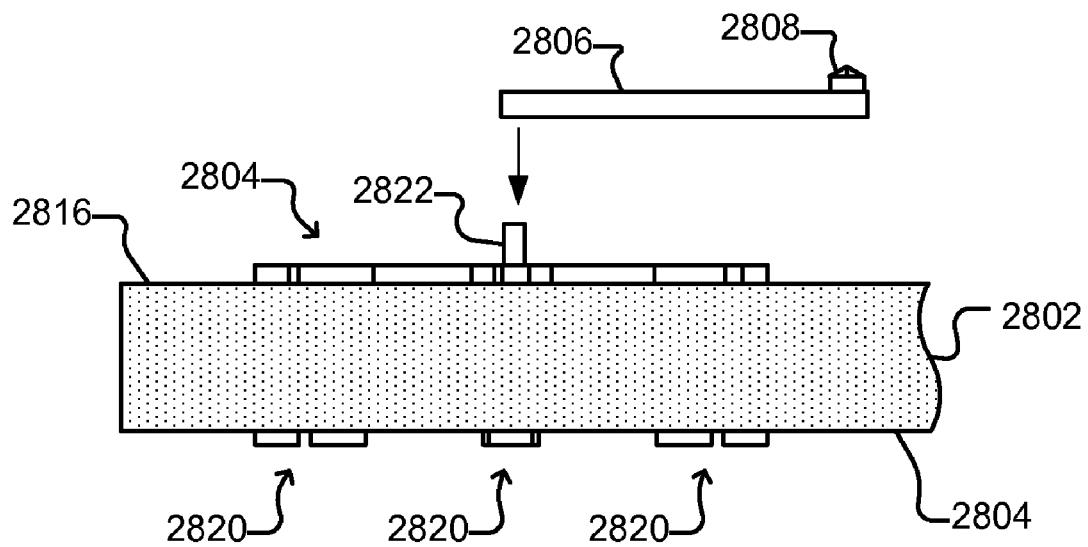

The method of making a probe 2812 shown in FIG. 35 is exemplary only and many alternatives are possible. For example, FIG. 36 illustrates attachment of a beam 2806 and tip 2808 to a post 2822, which was previously attached to the landing 2910 of a signal trace 2906 of the probe substrate guarded signal structure 2804 (see FIG. 29A). The post 2822 (which can be a non-limiting example of a first portion of a microstructure) can be formed like the post 2822 is formed in FIG. 35. That is, the post 2822 can be formed in an opening in a layer of patternable material (like layer 3502 shown in FIG. 35), after which the layer of patternable material can be removed. As an alternative, the post 2822 shown in FIG. 36 can be a wire stem attached to the landing 2910 of the signal trace 2906, which can be overcoated with one or more materials. The beam 2806 and tip 2808 (which can be a non-limiting example of a second portion of a microstructure) can be fabricated in a separate process. An end of the beam 2806 can then be attached to the post 2822 as generally shown in FIG. 35. The beam can be soldered, brazed, or otherwise attached to the post 2822.

Figure 37:
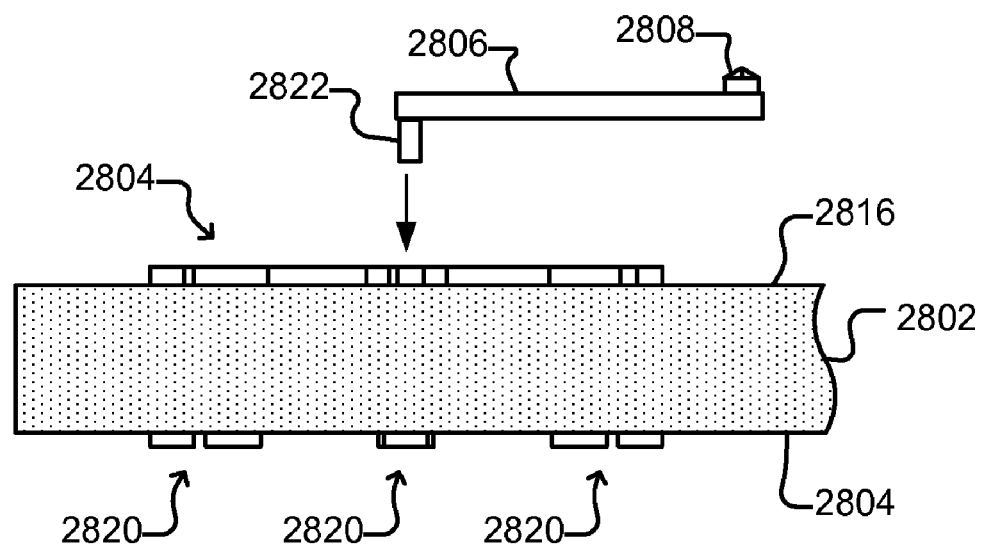

FIG. 37 illustrates yet another exemplary method of making a probe 2812 and attaching the probe 2812 to a landing 2910 of a signal trace 2906 (see FIG. 29A). As shown in FIG. 37, the post 2822, beam 2806, and tip 2808 of the probe 2812 can be made in a separate process, and the post 2822 can then be attached to the landing 2910 of the signal trace 2906 of the probe substrate guarded signal structure 2804 (see FIG. 29A). The post can be soldered, brazed, or otherwise attached to the landing 2910.

Although specific embodiments and applications of the invention have been described in this specification, there is no intention that the invention be limited to these exemplary embodiments and applications or to the manner in which the exemplary embodiments and applications operate or are described herein.

Figure 38:
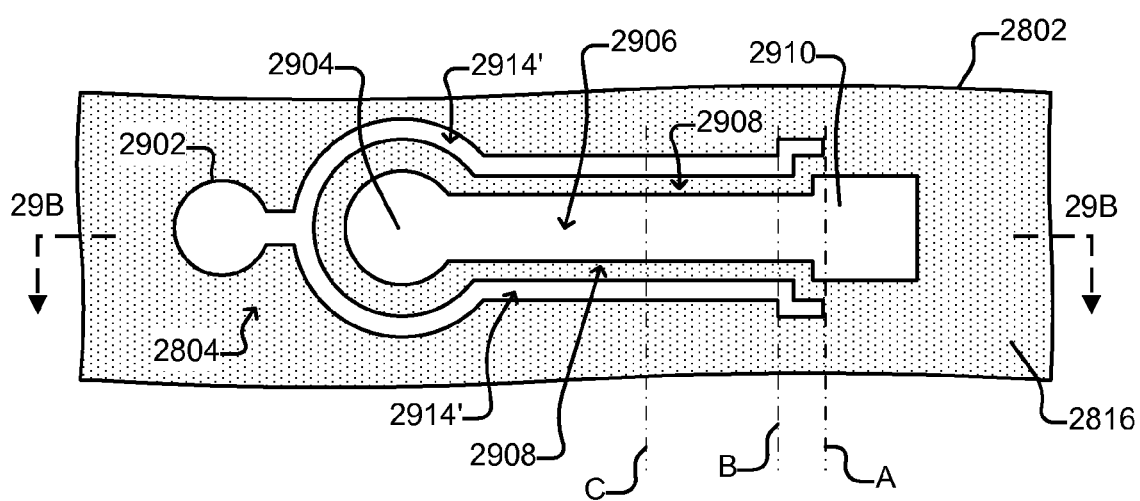
FIG. 38 illustrates an exemplary modification of a guard trace.

For example, as shown in FIG. 38, the guard trace 2914 of one or more of the probe substrate guarded signal structures 2804 (e.g., see any of FIGS. 28A-37) need not form a closed loop around the signal trace 2906 of the probe substrate guarded signal structure 2804. FIG. 38 is generally similar to FIG. 29A except that the guard trace 2914' in FIG. 38 is modified such that it does not extend completely around the signal trace 2906 and thus does not form a closed loop around the signal trace 2906. In the example shown in FIG. 38, the guard trace 2914' ends at locations depicted by line A. Alternatively, the guard trace 2914' can be configured to end at other locations along the signal trace 2906. For example, the guard trace 2914' can be configured to end at locations depicted by line B or line C. Alternatively, the guard trace 2914' can be configured to end at other locations along the length of the signal trace 2906, including landing 2910. Even if, as shown in FIG. 38, the guard trace 2914' does not formed a closed loop around the signal trace 2906, beneficial shielding (guarding) of the signal trace 2906 can be achieved. In any of the embodiments disclosed herein, a guard trace can be configured like guard trace 2914' such that it does not form a closed loop around a corresponding signal trace 2906. For example, in any embodiment disclosed herein, guard trace 2914 can be modified to be like guard trace 2914' and thus not form closed loop around a signal trace 2906.

Other possible variations of the disclosed exemplary embodiments include replacing the screws 470 of FIGS. 5 and 6A-6D with bolts (not shown) that extend through holes in the pin holder 218, spacer 252, and adjustment plate 206 to engage nuts (not shown). As another example, small additional wells (not shown) may be included around the periphery of the top of opening 234 in the insert holder 230 to facilitate removing probe insert 238 from the opening 234. As still another example, the positions of bolts and nuts shown herein (e.g., bolts 1264 and nuts 1252) may be reversed. As still further examples, the specific configurations of the embodiments shown herein may be modified by, for example, modifying elements of the embodiments, adding additional elements, or deleting elements. For example, the probe card assembly 200 of FIG. 2 may be configured without stiffener 204. Still further modifications include configuring probe card assembly 200 to allow multiple probe inserts (e.g., each like probe insert 238) to be attached to the probe card assembly and providing mechanisms that allow the position, orientation, and/or location of each such probe insert to be adjusted independently of the other probe inserts. A probe insert (e.g., like probe insert 238) can be configured to contact more than one DUT or less than an entire DUT.

We claim:

1. A probing apparatus comprising:
   a first substrate comprising a first surface and a second surface opposite the first surface;
   a plurality of electrically conductive first signal traces disposed on the first surface of the first substrate;
   a plurality of probes, ones of the probes attached directly to ones of the first signal traces;
   a plurality of first electromagnetic shielding structures disposed about the first signal traces, wherein each first electromagnetic shielding structure comprises a first guard trace disposed on the first surface of the first substrate and at least partially enclosing one of the first signal traces;
   a wiring substrate;
   an electrical interface to a source of test signals, the electrical interface disposed on the wiring substrate; and
   a plurality of electrical connections electrically connecting the electrical interface to the signal traces and the guard traces.

2. The probing apparatus of claim 1 further comprising:
   a plurality of signal terminals disposed on the second surface of the first substrate; and
   a plurality of signal electrical connections through the first substrate electrically connecting ones of the signal terminals and ones of the first signal traces.

3. The probing apparatus of claim 2, wherein the guard trace fully encloses the one of the first signal traces.

4. The probing apparatus of claim 3, wherein each first electromagnetic shielding structure further comprises an electrically conductive plane embedded within the first substrate and adjacent the one of the first signal traces, and the plane is electrically connected through the first substrate to the first guard trace.

5. The probing apparatus of claim 3 further comprising:
   a plurality of guard terminals disposed on the second surface of the first substrate; and
   a plurality of guard electrical connections through the first substrate electrically connecting ones of the guard terminals and ones of the first guard traces.

6. The probing apparatus of claim 2, wherein the first guard trace is disposed on the first surface of the first substrate partially around the one of the first signal traces without fully enclosing the one of the first signal traces.

7. The probing apparatus of claim 1, wherein
   the probing apparatus further comprising a plurality of pairs of terminals disposed on the second surface of the first substrate, each pair of terminals comprising a guard terminal electrically connected through the first substrate to one of the first guard traces and a signal terminal electrically connected through the first substrate to one of the first signal traces.

8. The probing apparatus of claim 7, wherein each of ones of the first guard traces comprises a closed loop shape and a corresponding one of the first signal traces is disposed within the closed loop shape.

9. The probing apparatus of claim 7, wherein the
   electrical connections electrically connecting the electrical interface to the signal terminals and the guard terminals comprise flexible connections.

10. The probing apparatus of claim 9, wherein:
    the electrical interface comprises a plurality of channel connections disposed on a first surface of the wiring substrate,
    the wiring substrate comprises a plurality of electrical connections from the channel connections through the wiring substrate to wiring substrate terminals disposed on a second opposite surface of the wiring substrate, and
    the flexible connections are disposed between the second surface of the wiring substrate and the second surface of the first substrate and electrically connect ones of the wiring substrate terminals with ones of the signal terminals and ones of the guard terminals.

11. The probing apparatus of claim 7, wherein each of the first electromagnetic shielding structures further comprises an electrically conductive plane disposed in the first substrate adjacent the first signal trace of the first electromagnetic shielding structure and electrically connected to the first guard trace of the first electromagnetic shielding structure.

12. The probing apparatus of claim 1 further comprising:
    a plurality of electrically conductive second signal traces disposed on the wiring substrate and electrically connected to the interface;

a plurality of second electromagnetic shielding structures disposed about the second signal traces, wherein each second electromagnetic shield structure comprises a second guard trace at least partially enclosing one of the second signal traces.

13. The probing apparatus of claim 12, wherein:
each of the electrical connections comprises one of the second signal traces or one of the second guard traces disposed on a first surface of the second substrate.

14. The probing apparatus of claim 13, wherein each second electromagnetic shielding structure further comprises an electrically conductive plane embedded within the second substrate and adjacent the one of the second signal traces, and the plane is electrically connected through the second substrate to the second guard trace.

15. The probing apparatus of claim 13, wherein a first plurality of the electrical connections further comprise signal electrical connections each electrically connecting one of the second signal traces with one of the first signal traces.

16. The probing apparatus of claim 15, wherein a second plurality of the electrical connections further comprise guard electrical connections each electrically connecting one of the second guard traces with one of the first guard traces.

17. The probing apparatus of claim 16, wherein each of the guard electrical connections is disposed to shield electrically a corresponding one of the signal electrical connections from electromagnetic interference.

18. The probing apparatus of claim 16, wherein each of the guard electrical connections is disposed to surround a corresponding one of the signal electrical connections along a substantial length of the signal electrical connection.

19. The probing apparatus of claim 16, wherein ones of the electrical connections comprise a coaxial cable electrically connected to a shielded pin electrical connector.

20. The probing apparatus of claim 15, wherein the first substrate is disposed in a holder that is removably attached to the wiring substrate.

21. The probing apparatus of claim 20 further comprising bolts configured to attach removably the holder to the wiring substrate.

22. The probing apparatus of claim 1, wherein the probes are electromagnetically unshielded.

23. The probing apparatus of claim 12, wherein:
the interface, the second signal trace, and the second guard trace are disposed on a first surface of the wiring substrate, and
a second surface of the wiring substrate opposite the first surface of the wiring substrate faces the second surface of the first substrate.

* * * * *